(12) United States Patent
Kuwabara et al.

(10) Patent No.: US 11,871,651 B2
(45) Date of Patent: Jan. 9, 2024

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Hirokazu Kuwabara, Yokohama (JP); Yoshiro Sugita, Yokohama (JP); Ryuhei Furue, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 675 days.

(21) Appl. No.: 16/998,920

(22) Filed: Aug. 20, 2020

(65) Prior Publication Data

US 2021/0175423 A1 Jun. 10, 2021

(30) Foreign Application Priority Data

Dec. 10, 2019 (KR) ........................ 10-2019-0164049

(51) Int. Cl.
*H10K 85/30* (2023.01)
*H10K 50/12* (2023.01)
(Continued)

(52) U.S. Cl.
CPC ........... *H10K 85/322* (2023.02); *H10K 50/12* (2023.02); *H10K 50/155* (2023.02); *H10K 50/16* (2023.02)

(58) Field of Classification Search
None
See application file for complete search history.

(56) References Cited

U.S. PATENT DOCUMENTS 10,374,166 B2 8/2019 Hatakeyama et al.
2018/0019415 A1 1/2018 Nakano et al.
(Continued)

FOREIGN PATENT DOCUMENTS

JP 2017-126606 A 7/2017
JP 2017-226838 A 12/2017
(Continued)

*Primary Examiner* — Gregory D Clark
(74) *Attorney, Agent, or Firm* — Lewis Roca Rothgerber Christie LLP

(57) ABSTRACT

An organic electroluminescence device of an embodiment of the present disclosure includes a first electrode, a hole transport region disposed on the first electrode, an emission layer disposed on the hole transport region, an electron transport region disposed on the emission layer, and a second electrode disposed on the electron transport region. The emission layer may include a polycyclic compound represented by Formula 1 to thereby exhibit high luminous efficiency:

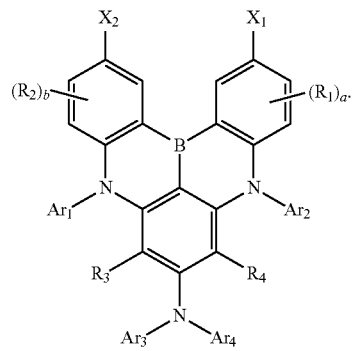

19 Claims, 2 Drawing Sheets

(51) Int. Cl.
  *H10K 50/16*   (2023.01)
  *H10K 50/155*  (2023.01)

(56) References Cited

U.S. PATENT DOCUMENTS

| | | |
|---|---|---|
| 2018/0094000 A1 | 4/2018 | Hatakeyama et al. |
| 2019/0207112 A1 | 7/2019 | Hatakeyama et al. |
| 2019/0372023 A1 | 12/2019 | Hatakeyama et al. |
| 2020/0058885 A1 | 2/2020 | Hong et al. |
| 2020/0091431 A1 | 3/2020 | Hatakeyama et al. |

FOREIGN PATENT DOCUMENTS

| | | | |
|---|---|---|---|
| KR | 10-2018-0007727 A | 1/2018 | |
| KR | 10-1876763 B1 | 7/2018 | |
| WO | WO 2015/102118 A1 | 7/2015 | |
| WO | WO 2016/152418 A1 | 9/2016 | |
| WO | WO 2016/152544 A1 | 9/2016 | |
| WO | WO 2017/188111 A1 | 11/2017 | |
| WO | WO 2018/146962 A1 | 8/2018 | |
| WO | WO 2018/203666 A1 | 11/2018 | |
| WO | WO 2019/102936 A1 | 5/2019 | |
| WO | WO 2020017931 * | 1/2020 | ............. C09K 11/06 |

\* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0164049, filed on Dec. 10, 2019, the entire content of which is hereby incorporated by reference.

BACKGROUND

One or more aspects of embodiments of the present disclosure relate to an organic electroluminescence device and a polycyclic compound for the organic electroluminescence device.

Organic electroluminescence displays are recently being developed as image display devices. Unlike liquid crystal display devices and the like, an organic electroluminescence display is a so-called self-luminescent display device, in which holes and electrons respectively injected from a first electrode and a second electrode recombine in an emission layer, and thus a luminescent material including an organic compound in the emission layer emits light to implement display.

In the application of an organic electroluminescence device to a display device, there is a demand for an organic electroluminescence device having a low driving voltage, high luminous efficiency, and/or a long service life (life span), and there is a demand for new materials capable of stably attaining such characteristics for an organic electroluminescence device.

In recent years, in order to implement a highly efficient organic electroluminescence device, materials utilizing triplet state energy phosphorescence emission, delayed fluorescence triplet-triplet annihilation (TTA) (in which singlet excitons are generated by collision of triplet excitons), and/or thermally activated delayed fluorescence (TADF) are being developed.

SUMMARY

One or more aspects of embodiments of the present disclosure are directed toward an organic electroluminescence device having a long service life and high efficiency, and a polycyclic compound used therein.

One or more aspects of embodiments of the present disclosure are directed toward an organic electroluminescence device including a thermally activated delayed fluorescence emitting material and a polycyclic compound used as a thermally activated delayed fluorescence emitting material.

One or more example embodiments of the present disclosure provide an organic electroluminescence device including: a first electrode; a hole transport region disposed on the first electrode; an emission layer disposed on the hole transport region; an electron transport region disposed on the emission layer; and a second electrode disposed on the electron transport region, wherein the emission layer includes a polycyclic compound represented by Formula 1:

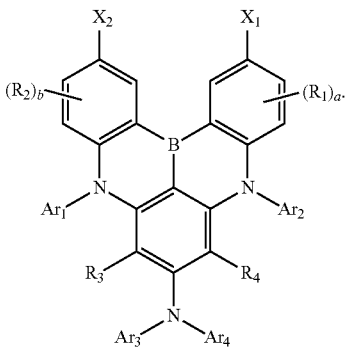

[Formula 1]

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, $R_1$ to $R_4$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a and b may each independently be an integer of 0 to 3, $X_1$ and $X_2$ may each independently be a hydrogen atom, a deuterium atom, a cyano group, a carbonyl group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one among $X_1$ and $X_2$ may be a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent.

In an embodiment, the emission layer may be to emit delayed fluorescence.

In an embodiment, the emission layer may be a delayed fluorescence emission layer including a first compound and a second compound, and the first compound may include the polycyclic compound.

In an embodiment, the emission layer may be a delayed fluorescence emission layer to emit blue light.

In an embodiment, $X_1$ may be a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent, and $X_2$ may be a hydrogen atom, a deuterium atom, or a substituted or unsubstituted alkyl group having 1 to 20 carbon atoms.

In an embodiment, $X_1$ and $X_2$ may each independently be a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent.

In an embodiment, at least one among $X_1$ and $X_2$ may be represented by 1-1 to 1-4:

1-1

1-2

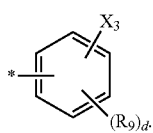

1-3

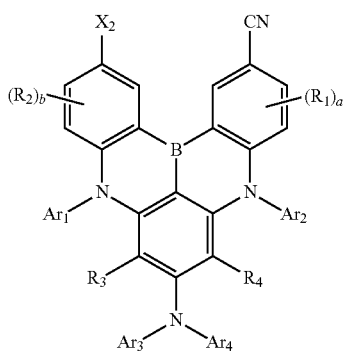

1-4

In 1-2 to 1-4, $R_6$ and $R_9$ may each independently be a substituted or unsubstituted aryl group having 6 to 30 ring-forming carbon atoms, or a substituted or unsubstituted heteroaryl group having 2 to 30 ring-forming carbon atoms, $R_7$ and $R_8$ may each independently be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring, d may be an integer of 0 to 4, and $X_3$ may be represented by any one among 1-1 to 1-3.

In an embodiment, Formula 1 may be represented by Formula 2-1 or Formula 2-2:

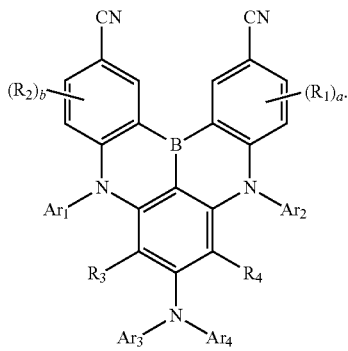

[Formula 2-1]

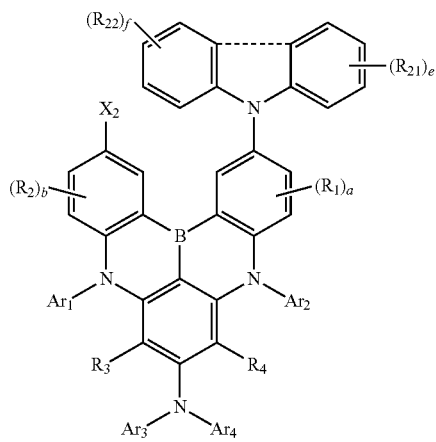

[Formula 2-2]

In Formula 2-1 and Formula 2-2, $X_2$, $R_1$ to $R_4$, $Ar_1$ to $Ar_4$, and a and b may each independently be the same as defined in Formula 1.

In an embodiment, Formula 1 may be represented by Formula 3-1 or Formula 3-2:

[Formula 3-1]

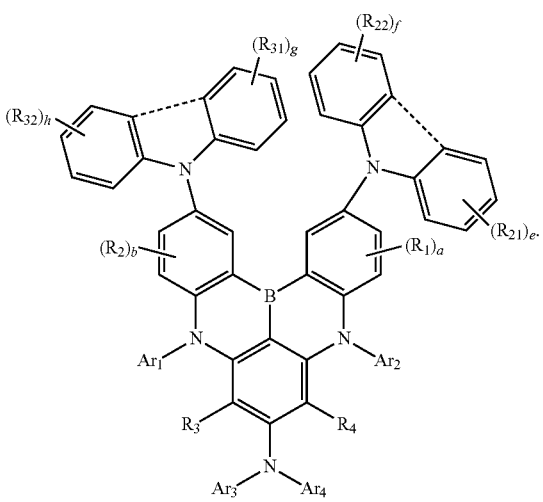

[Formula 3-2]

In Formula 3-1 and Formula 3-2, $R_{21}$, $R_{22}$, $R_{31}$ and $R_{32}$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, e to h may each independently be an integer of 0 to 4, the dotted line may refer to an optional bond, and $X_2$, $R_1$ to $R_4$, $Ar_1$ to $Ar_4$, and a and b may each independently be the same as defined in Formula 1.

In an embodiment, Formula 1 may be represented by Formula 4-1 or Formula 4-2:

[Formula 4-1]

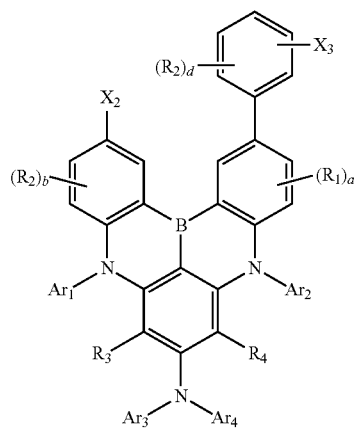

[Formula 4-2]

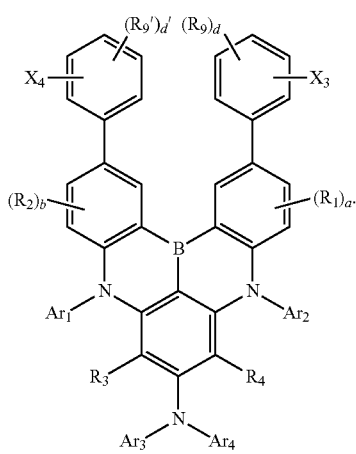

In Formula 4-1 and Formula 4-2, $X_3$ and $X_4$ may each independently be a cyano group, a carbonyl group, a substituted amine group, a substituted or unsubstituted heteroaryl group including N having 2 to 30 ring-forming carbon atoms, $R_9$ and $R_9'$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a substituted or unsubstituted aryl group having 6 to 30 ring-forming carbon atoms, or a substituted or unsubstituted heteroaryl group having 2 to 30 ring-forming carbon atoms, d and d' may each independently be an integer of 0 to 4, and $X_2$, $R_1$ to $R_4$, $Ar_1$ to $Ar_4$, and a and b may each independently be the same as defined in Formula 1.

In an embodiment, $Ar_1$ and $Ar_2$ may each independently be represented by Formula 5:

[Formula 5]

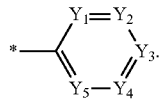

In Formula 5, $Y_1$ to $Y_5$ may each independently be CA (e.g., a carbon atom substituted with A) or N, and A may be a hydrogen atom, a deuterium atom, or an alkyl group having 1 to 20 carbon atoms.

In an embodiment, Formula 1 may be represented by Formula 6:

[Formula 6]

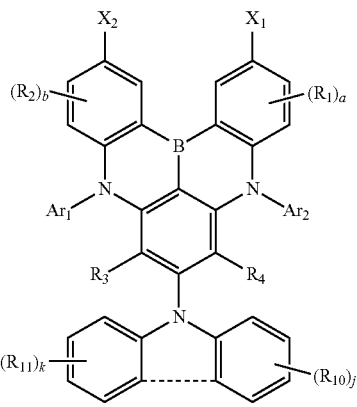

In Formula 6, $R_{10}$ and $R_{11}$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, j and k may each independently be an integer of 0 to 4, the dotted line may refer to an optional bond, and $R_1$ to $R_4$, $X_1$ and $X_2$, $Ar_1$, $Ar_2$, and a and b may each independently be the same as defined in Formula 1.

In an embodiment, the compound represented by Formula 1 may be any one among the compounds represented by Compound Group 1.

One or more example embodiments of the present disclosure provide a polycyclic compound represented by Formula 1.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure.

In the drawings.

DETAILED DESCRIPTION

Figure 1:
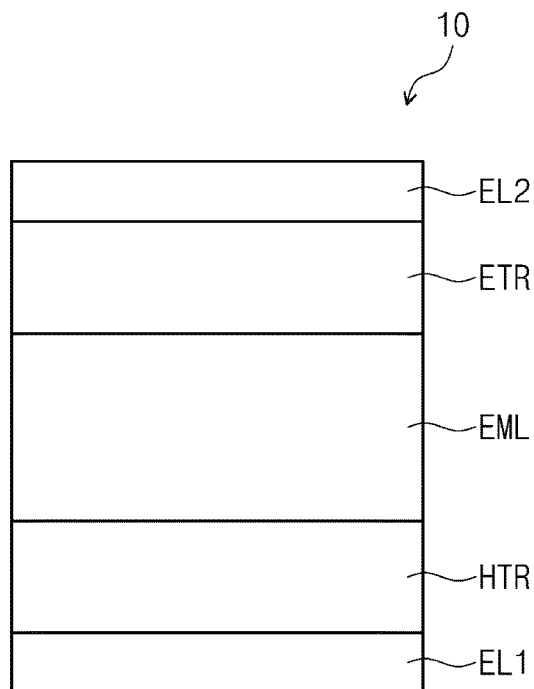
FIG. 1 is a cross-sectional view schematically illustrating an organic electroluminescence device according to an embodiment of the present disclosure.

The present disclosure may have various modifications and may be embodied in different forms, and example embodiments will be explained in detail with reference to the accompanying drawings. The present disclosure may, however, be embodied in different forms and should not be construed as being limited to the embodiments set forth herein. Rather, all modifications, equivalents, and substitutions that are included in the spirit and technical scope of the present disclosure should be included in the present disclosure.

In the description, it will be understood that when an element or layer is referred to as being "on," "connected to," or "coupled to" another element or layer, it can be directly on, connected or coupled to the other element or layer, or intervening elements or layers may be present. When an element is referred to as being "directly on," "directly connected to," or "directly coupled to" another element, there are no intervening elements present.

Like numbers refer to like elements throughout, and duplicative descriptions thereof may not be provided. In the drawings, the thickness, the ratio, and the dimensions of elements may be exaggerated for an effective description of technical contents.

The term "and/or," includes any and all combinations of one or more of the associated listed items. As used herein, the singular forms "a," "an," and "the" are intended to include the plural forms as well, unless the context clearly indicates otherwise.

As used herein, expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure".

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by those of ordinary skill in the art to which the present disclosure pertains. It is also to be understood that terms defined in commonly used dictionaries should be interpreted as having meanings consistent with meanings in the context of the related art, unless expressly defined herein, and should not be interpreted in an ideal or overly formal sense.

It should be understood that the terms "includes," "including," "comprises," "comprising," and/or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the present disclosure and a compound of an embodiment included therein will be described with reference to the accompanying drawings.

FIGS. 1 to 4 are cross-sectional views schematically illustrating organic electroluminescence devices according to embodiments of the present disclosure.

Referring to FIGS. 1 to 4, in each of the organic electroluminescence devices 10, a first electrode EL1 and a second electrode EL2 are disposed to face each other, and an emission layer EML may be disposed between the first electrode EL1 and the second electrode EL2.

Each of the organic electroluminescence devices 10 may further include a plurality of functional layers between the first electrode EL1 and the second electrode EL2 in addition to the emission layer EML. The plurality of functional layers may include a hole transport region HTR and an electron transport region ETR. For example, each of the organic electroluminescence devices 10 may include the first electrode EL1, the hole transport region HTR, the emission layer EML, the electron transport region ETR, and the second electrode EL2 sequentially stacked. In some embodiments, the organic electroluminescence device 10 of an embodiment may include a capping layer CPL disposed on the second electrode EL2.

The organic electroluminescence device 10 of an embodiment may include a polycyclic compound of an embodiment, which will be described later, in the emission layer EML disposed between the first electrode EL1 and the second electrode EL2.

However, embodiments are not limited thereto, and the organic electroluminescence device 10 of an embodiment may include the compound according to an embodiment not only in the emission layer EML but also in the hole transport region HTR and/or electron transport region ETR, which are among the plurality of functional layers disposed between the first electrode EL1 and the second electrode EL2, and/or in the capping layer CPL disposed on the second electrode EL2.

Figure 2:
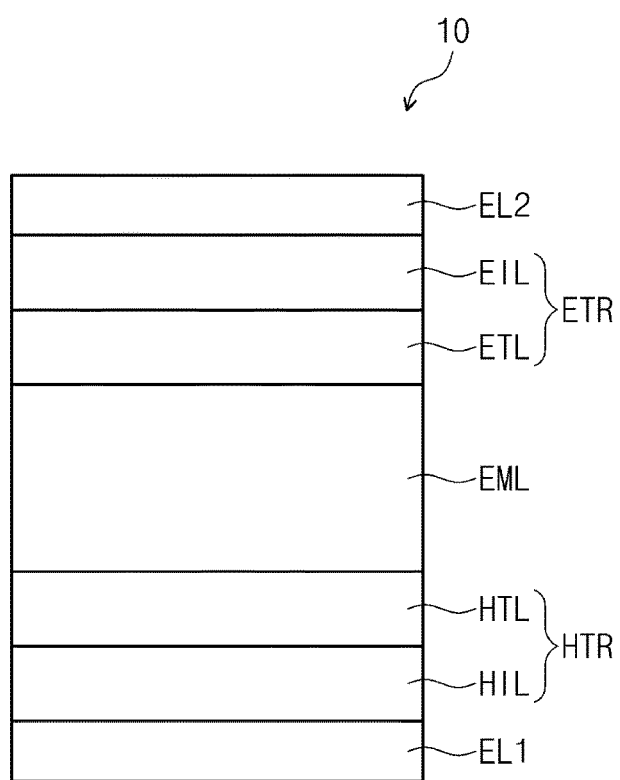
FIG. 2 is a cross-sectional view schematically illustrating an organic electroluminescence device according to an embodiment of the present disclosure.
Figure 3:
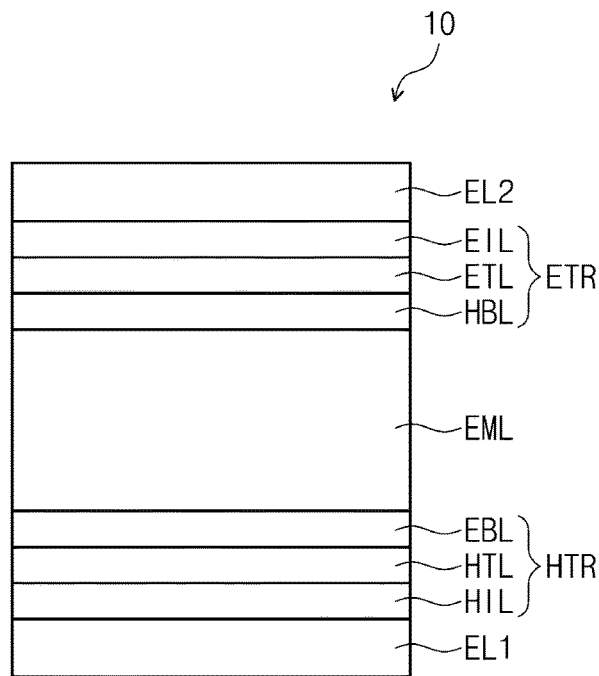
FIG. 3 is a cross-sectional view schematically illustrating an organic electroluminescence device according to an embodiment of the present disclosure.
Figure 4:
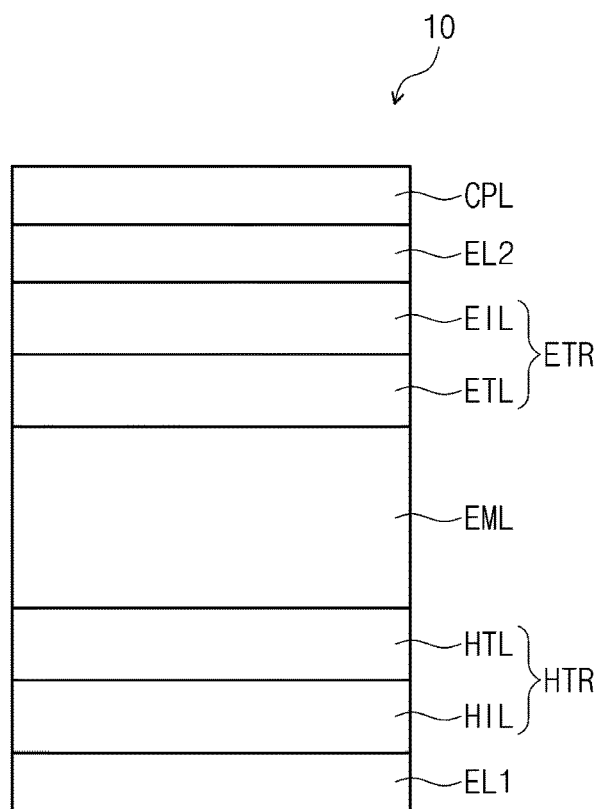
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment including a capping layer CPL disposed on the second electrode EL2.

The first electrode EL1 may be conductive. The first electrode EL1 may be formed of a metal alloy and/or a conductive compound. The first electrode EL1 may be a pixel electrode and/or a positive electrode (e.g., anode). The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), tin (Sn), zinc (Zn), a compound thereof, a mixture thereof (e.g., a mixture of Ag and Mg), or an oxide thereof.

In some embodiments, the first electrode EL1 may have a multilayer structure including a reflective layer or a transflective layer formed of the above-described materials, and a transparent conductive layer formed of ITO, IZO, ZnO, ITZO, etc. For example, the first electrode EL1 may have a three-layer structure of ITO/Ag/ITO, but is not limited thereto. The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, or may have a single layer structure formed of a hole injection material and a hole transport material.

In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments are not limited thereto.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4', 4"-tris(N,N-diphenylamino)triphenylamine (TDATA), 4,4', 4"-tris{N,-(2-naphthyl)-N-phenylamino)-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalen-1-yl)-N,N'-diphenyl-benzidine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include any suitable material. For example, the hole transport layer HTL may further include carbazole derivatives (such as N-phenyl carbazole and/or polyvinyl carbazole), fluorene derivatives, N,N'-bis(3-methylphenyl)-N,N'-diphenyl-[1,1-biphenyl]-4, 4'-diamine (TPD), triphenylamine derivatives (such as 4,4', 4"-tris(N-carbazolyl)triphenylamine (TCTA)), N,N'-di(1-naphthalen-1-yl)-N,N'-diphenyl-benzidine (NPD), 4,4'-cyclohexylidene bis[N,N-bis(4-methylphenyl] benzenamine] (TAPC), 4,4'-bis[N,N'(3-tolyl)amino]-3,3'-dimethylbiphenyl(HMTPD), 1,3-bis(N-carbazolyl)benzene (mCP), etc.

The electron blocking layer EBL may include, for example, carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di(1-naphthalen-1-yl)-N,N'-diphenyl-benzidine (NPD), 4,4'-cyclohexylidene bis[N,N-bis(4-methylphenyl] benzenamine] (TAPC), 4,4'-bis[N,N'-(3-tolyl)amino]-3,3'-dimethylbiphenyl (HMTPD), mCP, etc.

The hole transport region HTR may have a thickness of about 50 Å to about 15,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be a quinone derivative, metal oxide, or cyano group-containing compound, but is not limited thereto. Non-limiting examples of the p-dopant include quinone derivatives (such as tetracyanoquinodimethane (TCNQ) and/or 2,3,5,6-tetrafluoro-7,7',8,8'-tetracyanoquinodimethane (F4-TCNQ)), metal oxides (such as tungsten oxide and/or molybdenum oxide), etc., but are not limited thereto.

As described above, the hole transport region HTR may further include at least one of a hole buffer layer or an electron blocking layer EBL in addition to the hole injection layer HIL and the hole transport layer HTL. The hole buffer layer may compensate for a resonance distance according to the wavelength of light emitted from an emission layer EML and may increase light emission efficiency. Materials that may be included in the hole transport region HTR may also be included in the hole buffer. The electron blocking layer EBL may prevent or reduce electrons from being injected from the electron transport region ETR to the hole transport region HTR.

The emission layer EML is provided on the hole transport region HTR. The thickness of the emission layer EML may be, for example, about 100 Å to about 1000 Å or about 100 Å to about 300 Å. The emission layer EML may have a single layer formed of a single material, a single layer formed of a plurality of different materials, or a multilayer structure having a plurality of layers formed of a plurality of different materials.

The emission layer may be to emit one of red, green, blue, white, yellow or cyan light. The emission layer EML may include a fluorescence-emitting material and/or a phosphorescence-emitting material.

In an embodiment, the emission layer EML may be a fluorescence emission layer. For example, some of the light emitted from the emission layer EML may result from thermally activated delayed fluorescence (TADF). For example, the emission layer EML may include a luminescent component to emit thermally activated delayed fluorescence, and in an embodiment, the emission layer EML may be an emission layer to emit thermally activated delayed fluorescence emitting blue light.

The emission layer EML of the organic electroluminescence device 10 of an embodiment includes a polycyclic compound according to an embodiment of the present disclosure.

In the description, the term "substituted or unsubstituted" refers to a state of being unsubstituted, or substituted with at least one substituent selected from the group consisting of a deuterium atom, a halogen atom, a cyano group, a nitro group, an amino group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. In some embodiments, each of these substituents may be further substituted or unsubstituted. For example, a biphenyl group may be interpreted as a named aryl group, or as a phenyl group substituted with a phenyl group.

In the description, the term "bonded to an adjacent group to form a ring" may refer to a state of being bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The rings formed by being bonded to an adjacent group may be monocyclic or polycyclic. In some embodiments, the rings formed by being bonded to each other may be further connected to another ring to form a spiro structure.

In the description, the term "an adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as "adjacent groups" to each other, and two ethyl groups in 1,1-diethylcyclopentane may be interpreted as "adjacent groups" to each other.

In the description, examples of the halogen atom include a fluorine atom, a chlorine atom, a bromine atom, and an iodine atom.

In the description, the alkyl group may be a linear, branched or cyclic alkyl group. The number of carbons in the alkyl group may be 1 to 50, 1 to 30, 1 to 20, 1 to 10, or 1 to 6. Non-limiting examples of the alkyl group include a methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, the term "aryl group" may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the heteroaryl group may include at least one of boron (B), oxygen (O), nitrogen (N), phosphorus (P), silicon (Si), or sulfur (S), as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Non-limiting examples of the heteroaryl group include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidyl, pyrido pyrazinyl, pyrazino pyrazinyl, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophenyl, thienothiophene, benzofuranyl, phenanthroline, thiazolyl, isoxazolyl, oxadiazolyl, thiadiazolyl, phenothiazolyl, phenothiazinyl, dibenzosilole, dibenzofuranyl, etc.

In the description, the number of carbon atoms in an amine group is not specifically limited, but may be 1 to 30. The amine group may be an alkyl amine group, an aryl amine group, or a heteroaryl amine group. Non-limiting examples of the amine group include a methylamine group, a dimethylamine group, a phenylamine group, a diphenylamine group, a naphthylamine group, a 9-methyl-anthracenylamine group, a triphenylamine group, etc.

In the description, " ⎯⎯* " refers to a point of connection.

The polycyclic compound according to an embodiment of the present disclosure may be represented by Formula 1:

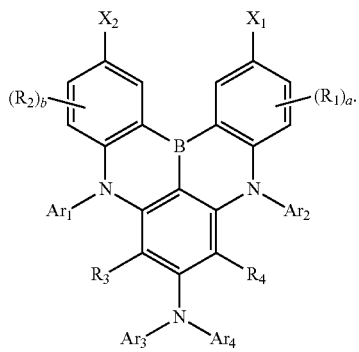

[Formula 1]

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms.

In Formula 1, $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula 1, $R_1$ to $R_4$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 1, a and b may each independently be an integer of 0 to 3. When a is 2 or more, a plurality of $R_1$'s may be the same as or different from each other, and when b is 2 or more, a plurality of $R_2$'s may be the same as or different from each other.

In Formula 1, $X_1$ and $X_2$ may each independently be a hydrogen atom, a deuterium atom, a cyano group, a carbonyl group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In some embodiments, however, at least one among $X_1$ and $X_2$ is a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent.

In some embodiments, in Formula 1, any hydrogen atom may be substituted with a deuterium atom.

In an embodiment, $X_1$ in Formula 1 may be a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent, and $X_2$ may be a hydrogen atom, a deuterium atom, or a substituted or unsubstituted alkyl group having 1 to 20 carbon atoms.

In an embodiment, $X_1$ and $X_2$ may each independently be a cyano group, a carbonyl group, a substituted amine group, a heteroaryl group including a substituted or unsubstituted N having 2 to 30 ring-forming carbon atoms, or an aryl group having 6 to 30 ring-forming carbon atoms having a cyano group, a carbonyl group, or an amine group as a substituent.

In an embodiment, at least one among $X_1$ and $X_2$ in Formula 1 may be represented by one of 1-1 to 1-4:

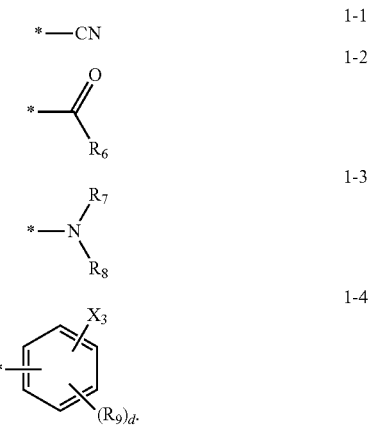

In 1-2, $R_6$ may be a substituted or unsubstituted aryl group having 6 to 30 ring-forming carbon atoms, or a substituted or unsubstituted heteroaryl group having 2 to 30 ring-forming carbon atoms.

In 1-3, $R_7$ and $R_8$ may each independently be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In 1-4, $R_9$ may be a substituted or unsubstituted aryl group having 6 to 30 ring-forming carbon atoms, or a substituted or unsubstituted heteroaryl group having 2 to 30 ring-forming carbon atoms.

In 1-4, d may be an integer of 0 to 4, and when d is 2 or more, a plurality of $R_9$'s may be the same as or different from each other.

In 1-4, $X_3$ may be represented by any one among 1-1 to 1-3.

In an embodiment, Formula 1 may be represented by Formula 2-1 or Formula 2-2:

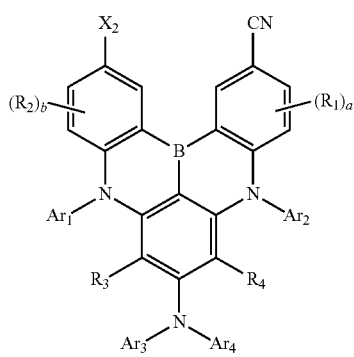

[Formula 2-1]

-continued

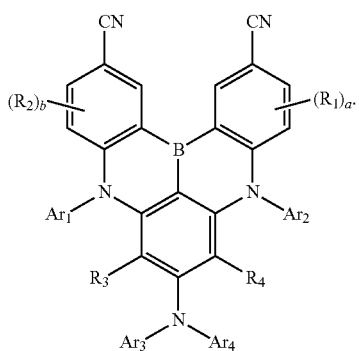

[Formula 2-2]

In Formula 2-1 and Formula 2-2, $X_2$, $R_1$ to $R_4$, $Ar_1$ to $Ar_4$, and a and b may each independently be the same as defined in Formula 1.

In an embodiment, Formula 1 may be represented by Formula 3-1 or Formula 3-2:

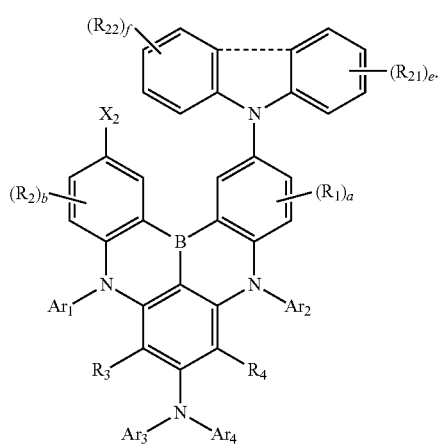

[Formula 3-1]

In Formula 3-1, $R_{21}$ and $R_{22}$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 3-1, e may be an integer of 0 to 4, and when e is 2 or more, a plurality of $R_{21}$'s may be the same as or different from each other.

In Formula 3-1, f may be an integer of 0 to 4, and when f is 2 or more, a plurality of $R_{22}$'s may be the same as or different from each other.

In Formula 3-1, $X_2$, $R_1$ to $R_4$, $Ar_1$ to $Ar_4$, and a and b may each independently be the same as defined in Formula 1.

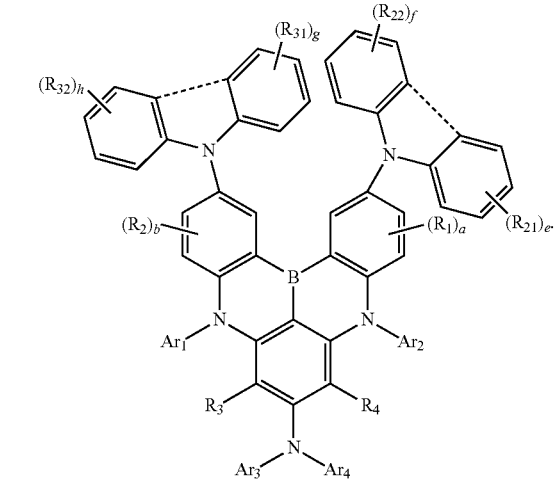

[Formula 3-2]

In Formula 3-2, $R_{21}$, $R_{22}$, $R_{31}$, and $R_{32}$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 3-2, e may be an integer of 0 to 4, and when e is 2 or more, a plurality of $R_{21}$'s may be the same as or different from each other.

In Formula 3-2, f may be an integer of 0 to 4, and when f is 2 or more, a plurality of $R_{22}$'s may be the same as or different from each other.

In Formula 3-2, g may be an integer of 0 to 4, and when g is 2 or more, a plurality of $R_{31}$'s may be the same as or different from each other.

In Formula 3-2, h may bean integer of 0 to 4, and when h is 2 or more, a plurality of $R_{32}$'s may be the same as or different from each other.

In Formula 3-2, $R_1$ to $R_4$, $Ar_1$ to $Ar_4$, and a and b may each independently be the same as defined in Formula 1.

In Formula 3-1 and Formula 3-2, the dotted line refers to an optional bond (e.g., the relationship between the two groups at the ends of the dotted line may be bonding or non-bonding). "Bonding" means that the carbon atoms are bonded to each other to form a single bond, and "non-bonding" means that the carbon atoms are not bonded to each other, and that each carbon is singly bonded to hydrogen.

In an embodiment, Formula 1 may be represented by Formula 4-1 or Formula 4-2:

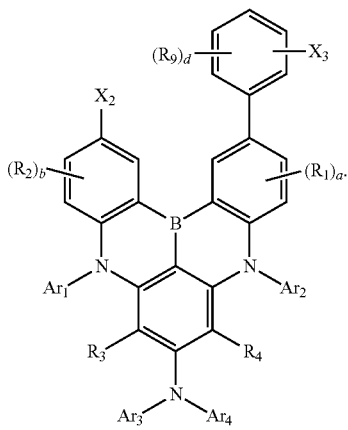

[Formula 4-1]

In Formula 4-1, $X_3$ may be a cyano group, a carbonyl group, a substituted amine group, or a substituted or unsubstituted heteroaryl group including N having 2 to 30 ring-forming carbon atoms.

In Formula 4-1, $R_9$ may be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 4-1, d may be an integer of 0 to 4, and when d is 2 or more, a plurality of $R_9$'s may be the same as or different from each other.

In Formula 4-1, $X_2$, $R_1$ to $R_4$, $Ar_1$ to $Ar_4$, and a and b may each independently be the same as defined in Formula 1.

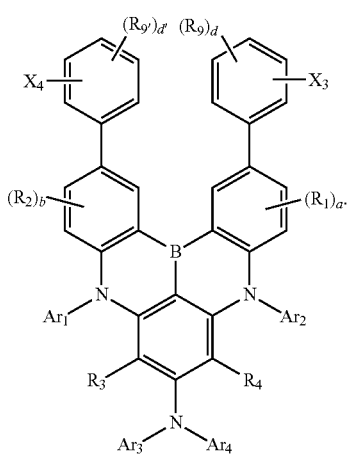

[Formula 4-2]

In Formula 4-2, $X_3$ and $X_4$ may each independently be a cyano group, a carbonyl group, a substituted amine group, or a substituted or unsubstituted heteroaryl group including N having 2 to 30 ring forming carbon atoms.

In Formula 4-2, $R_9$ and $R_9'$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring forming carbon atoms.

In Formula 4-2, d and d' may each independently bean integer of 0 to 4, and when d is 2 or more, a plurality of $R_9$'s may be the same as or different from each other, and when d' is 2 or more, a plurality of $R_9''$s may be the same as or different from each other.

In Formula 4-2, $X_2$, $R_1$ to $R_4$, $Ar_1$ to $Ar_4$, and a and b may each independently be the same as defined in Formula 1.

In an embodiment, $Ar_1$ and $Ar_2$ may each independently be represented by Formula 5:

[Formula 5]

In Formula 5, $Y_1$ to $Y_5$ may each independently be CA (e.g., a carbon atom substituted with A) or N.

In Formula 5, A may be a hydrogen atom, a deuterium atom, or an alkyl group having 1 to 20 carbon atoms.

In an embodiment, Formula 1 may be represented by Formula 6:

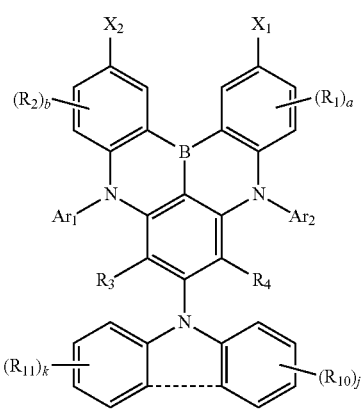

[Formula 6]

In Formula 6, $R_{10}$ and $R_{11}$ may each independently be a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 6, j may be an integer of 0 to 4, and when j is 2 or more, a plurality of $R_{10}$'s are the same as or different from each other.

In Formula 6, k is an integer of 0 to 4, and when k is 2 or more, a plurality of $R_{11}$'s may be the same as or different from each other.

In Formula 6, the dotted line refers to an optional bond, as described above.

In Formula 6, $R_1$ to $R_4$, $X_1$, $X_2$, $Ar_1$, $Ar_2$, and a and b may each independently be the same as defined in Formula 1.

In embodiment, the polycyclic compound represented by Formula 1 may be any one selected from among the compounds represented by Compound Group 1: However, the present disclosure is not limited thereto.

[Compound Group 1]
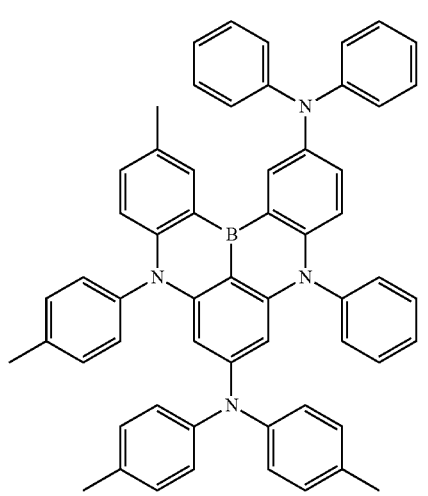
(1)
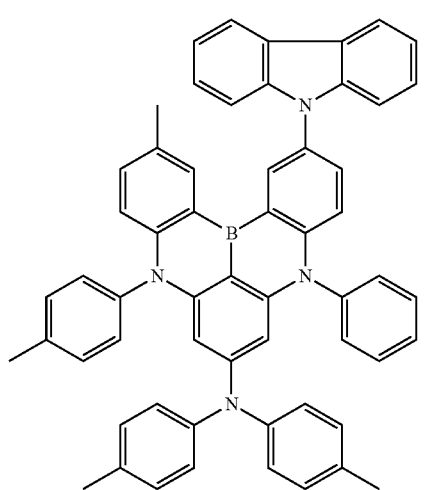
(2)
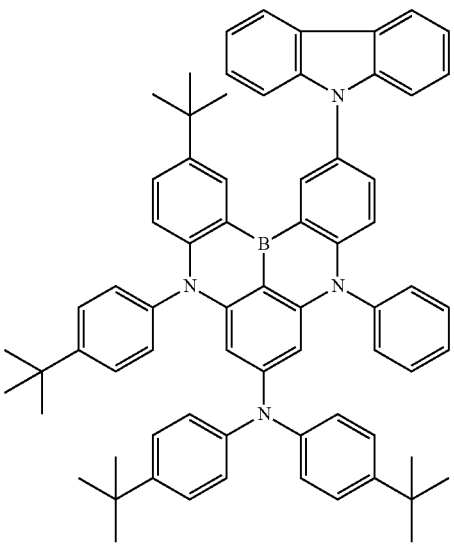
(3)
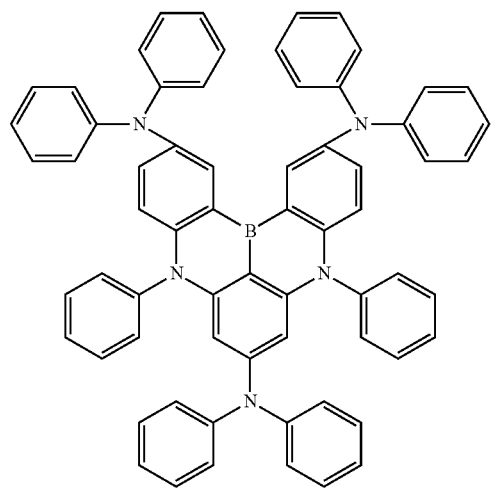
(4)
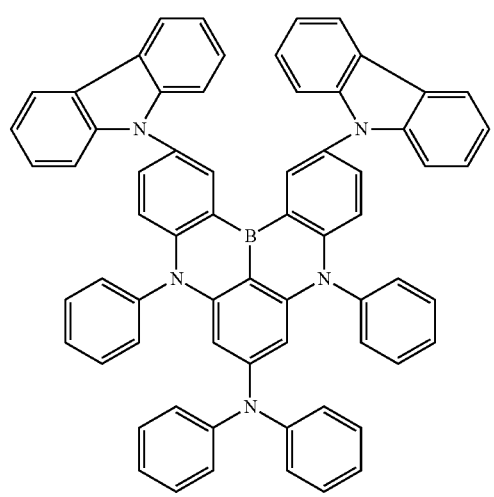
(5)
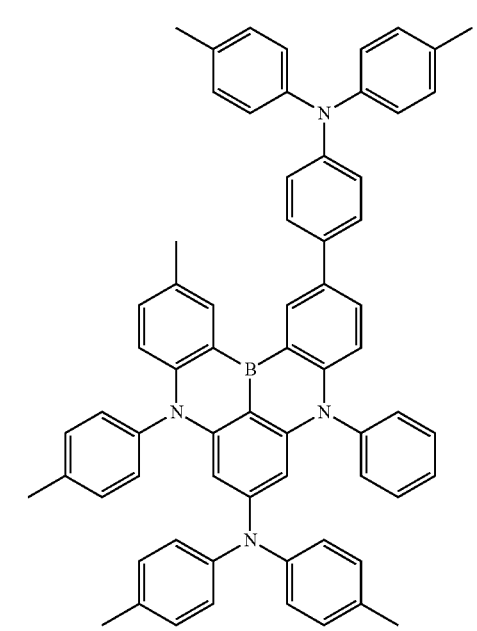
(6)

-continued
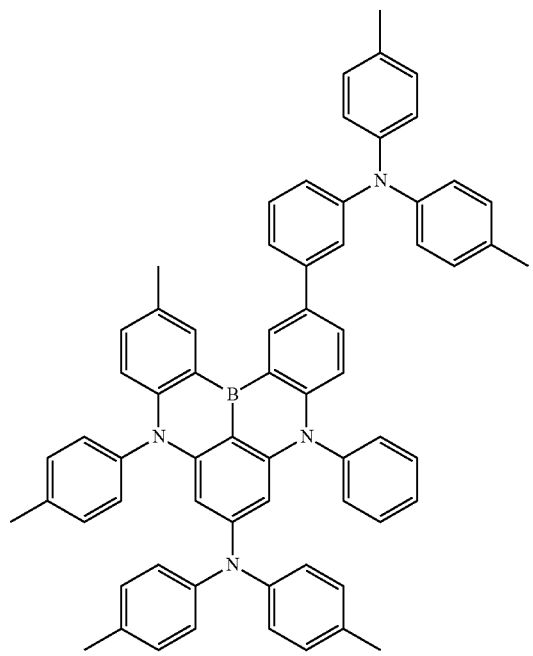
(7)
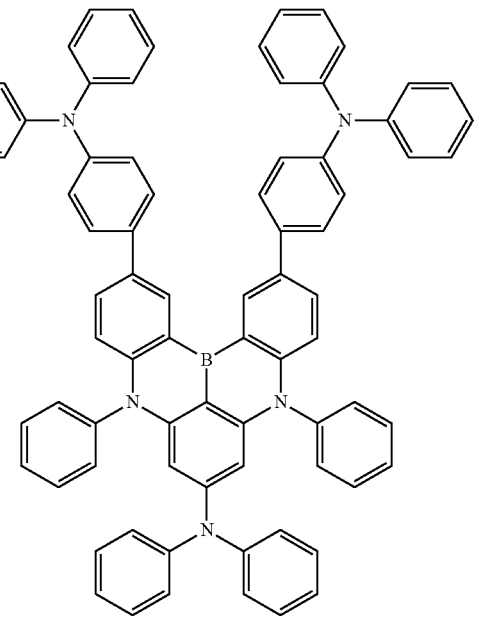
(9)
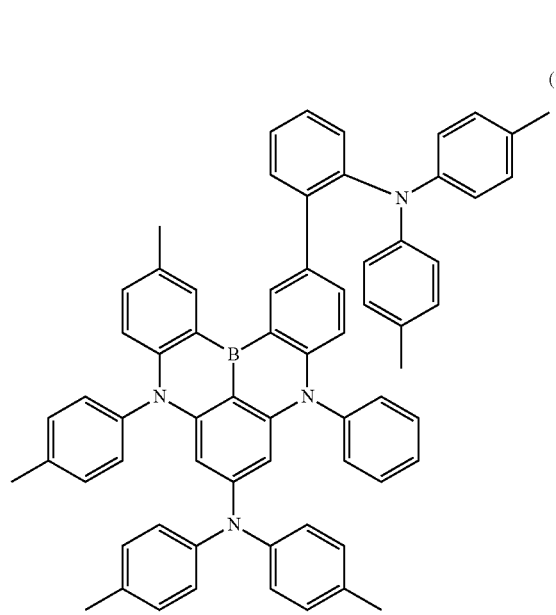
(8)
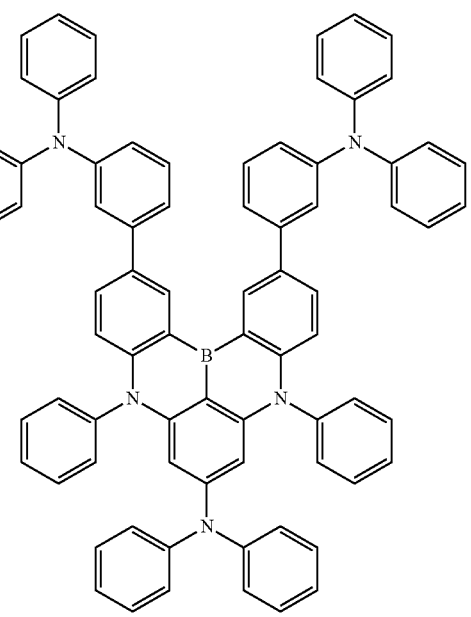
(10)

(11)
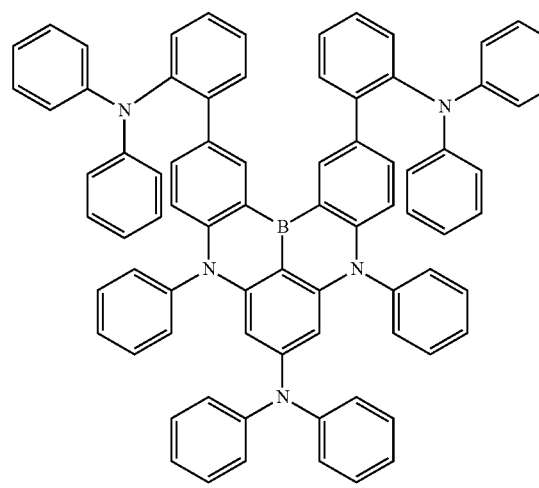
(12)
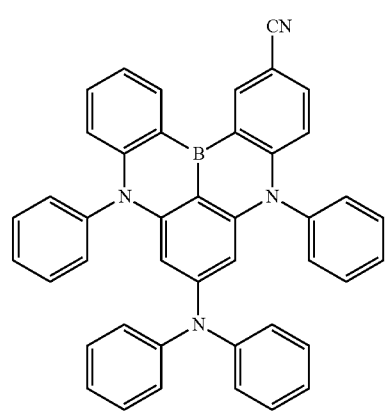
(13)
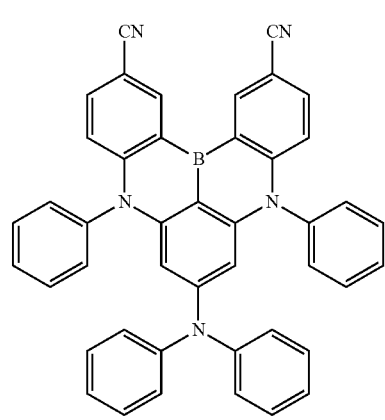
(14)
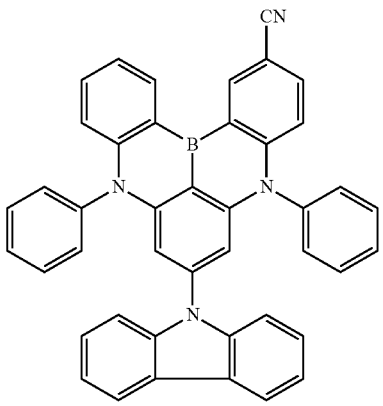
(15)
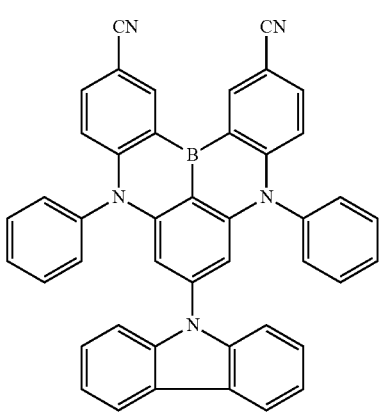
(16)
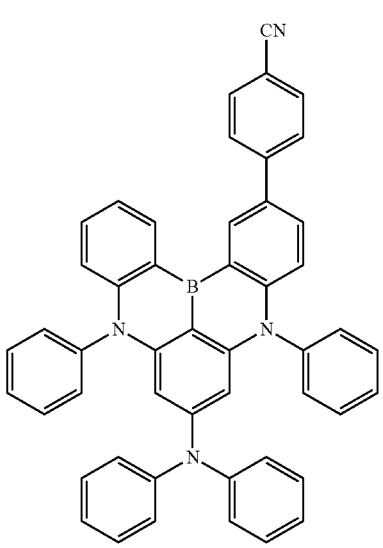

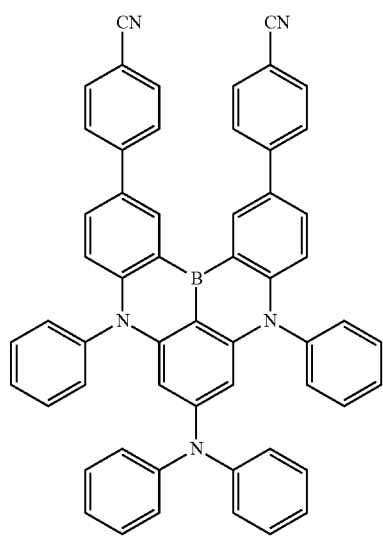
(17)
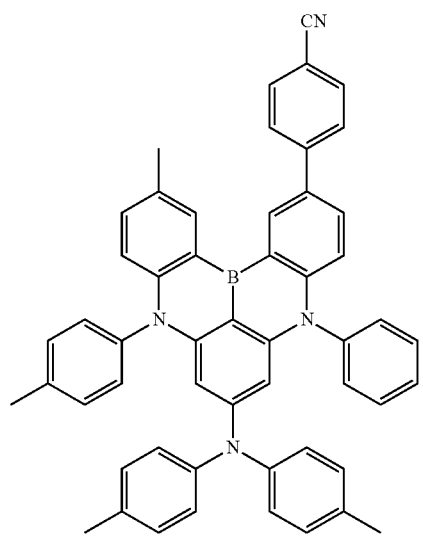
(20)
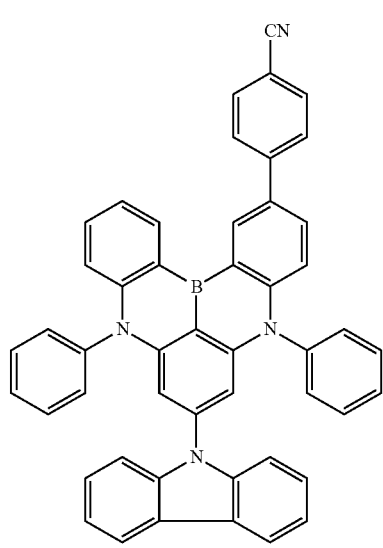
(18)
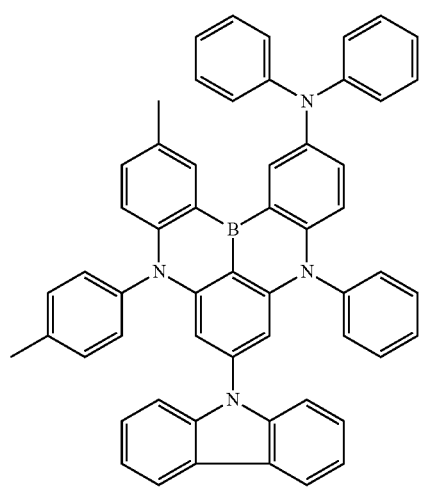
(21)
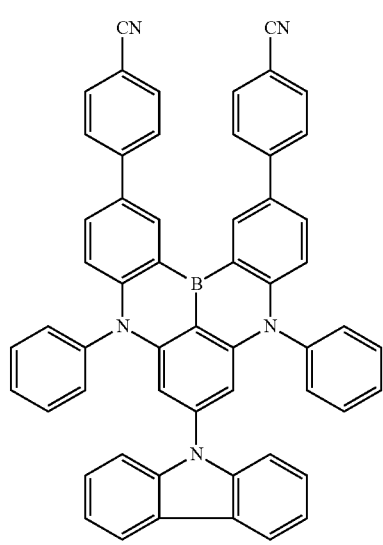
(19)
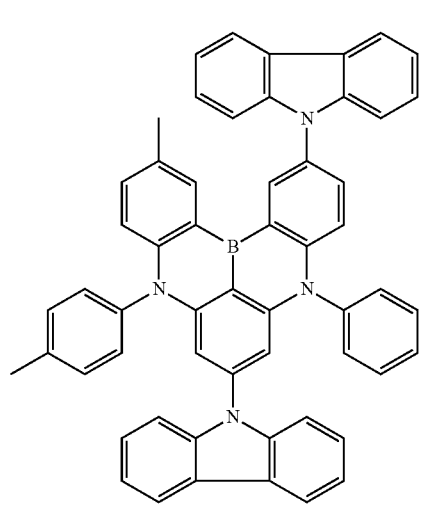
(22)

(23)
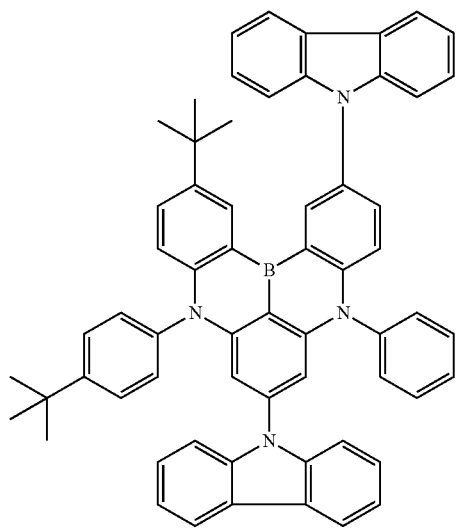
(24)
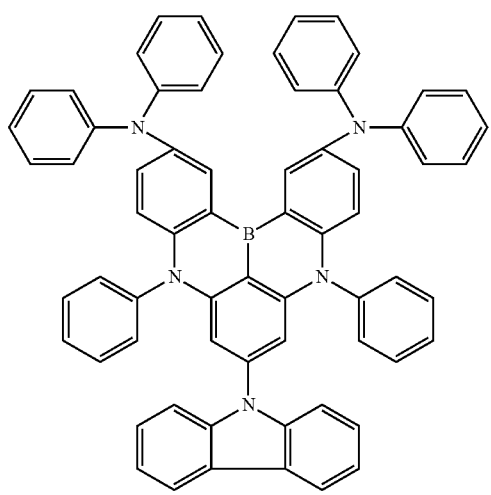
(25)
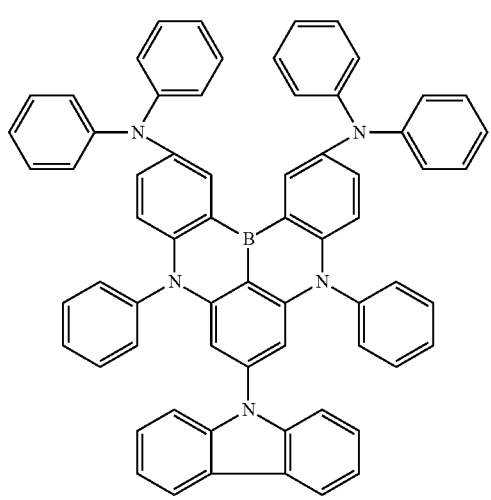
(26)
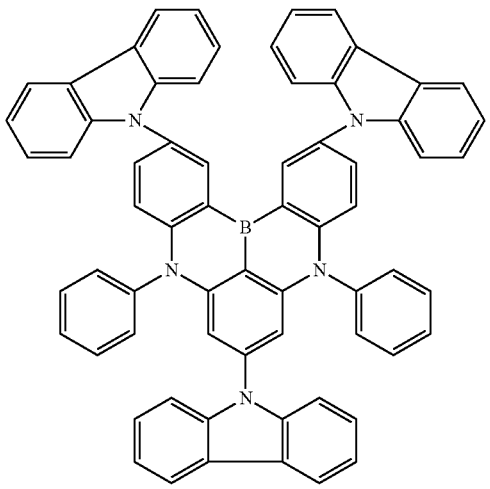
(27)
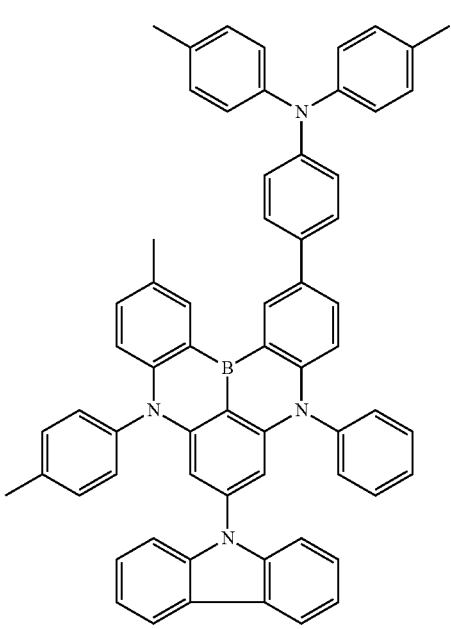

(28)
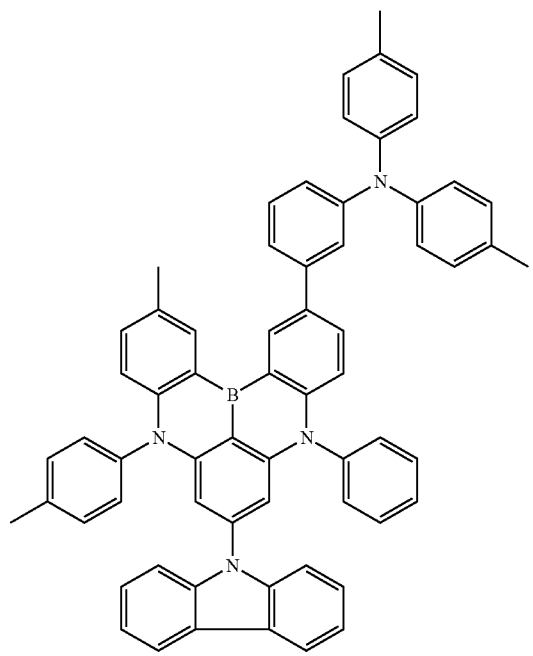
(30)
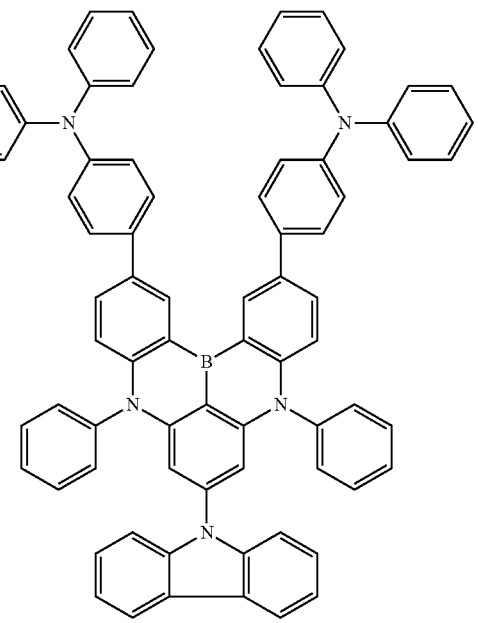
(29)
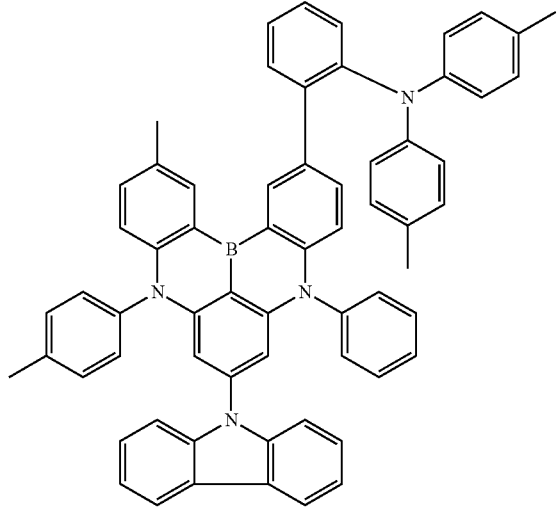
(31)
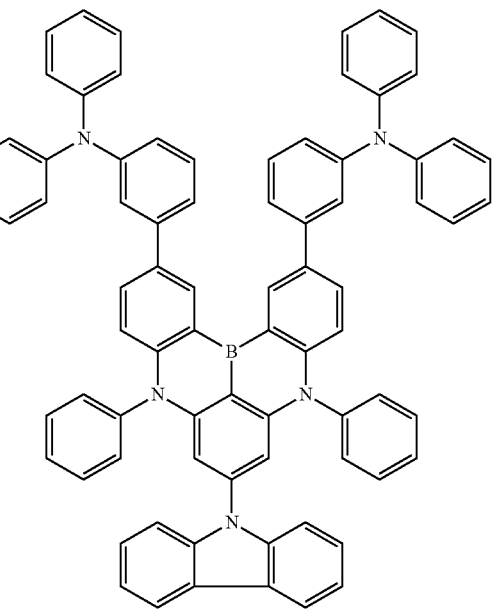

(32)
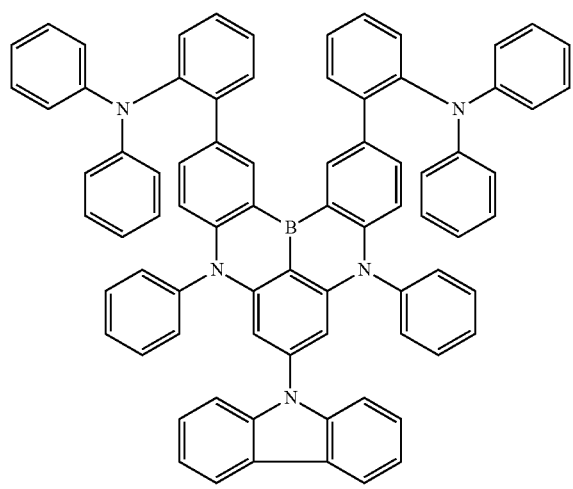
(34)
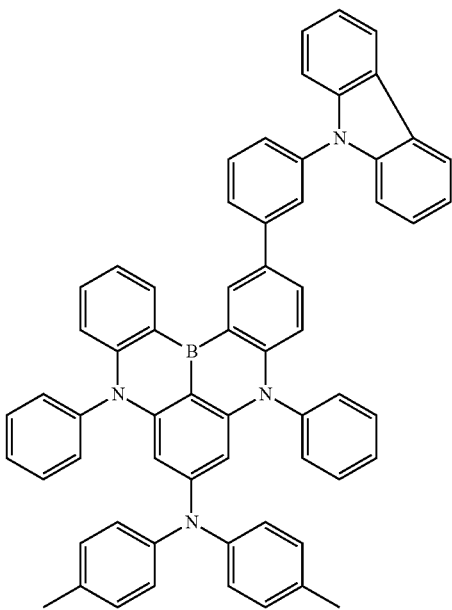
(33)
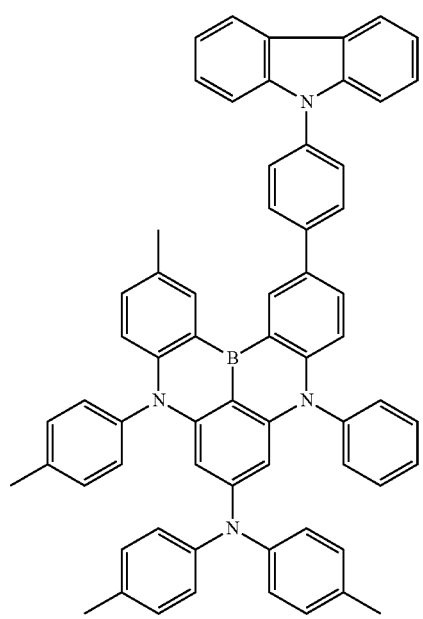
(35)
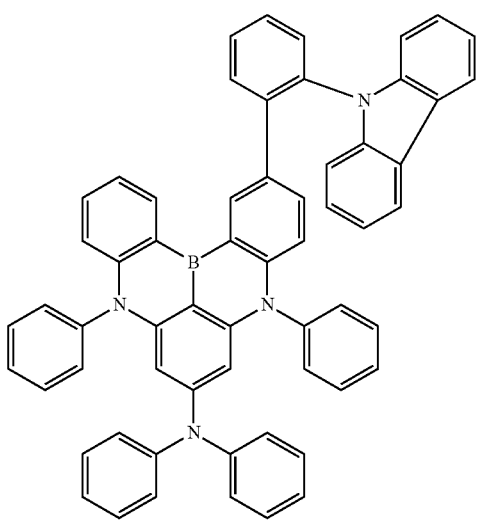

(36)
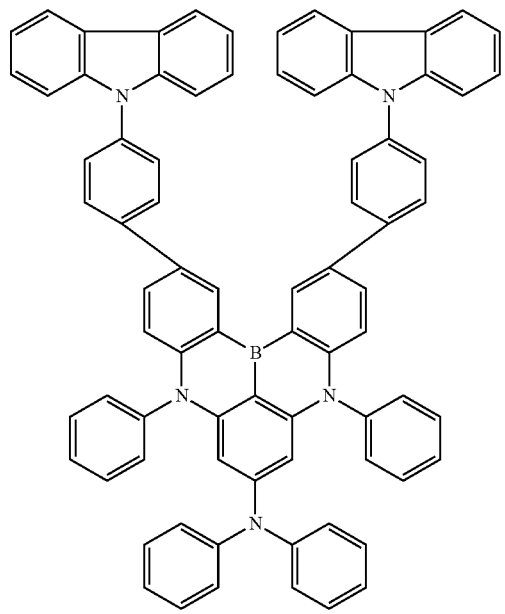
(38)
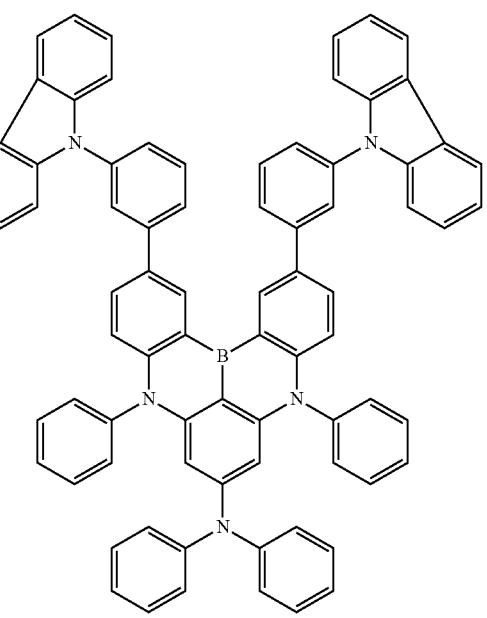
(37)
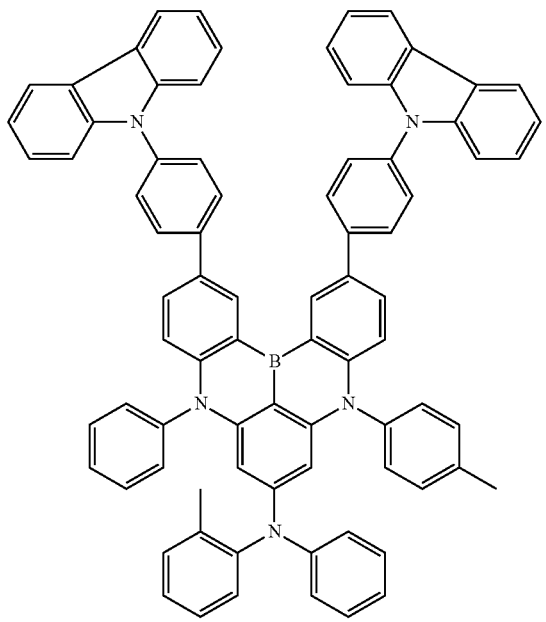
(39)
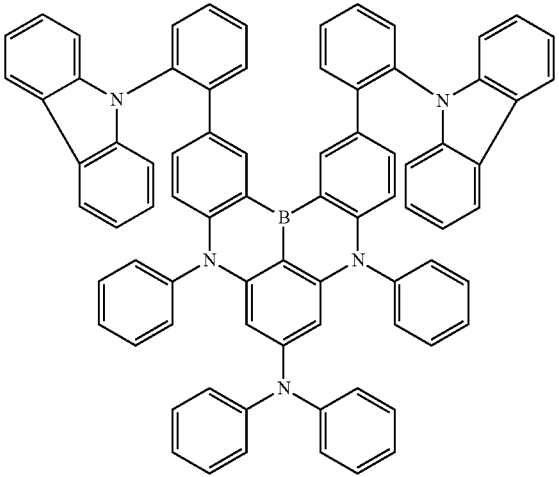

(40)
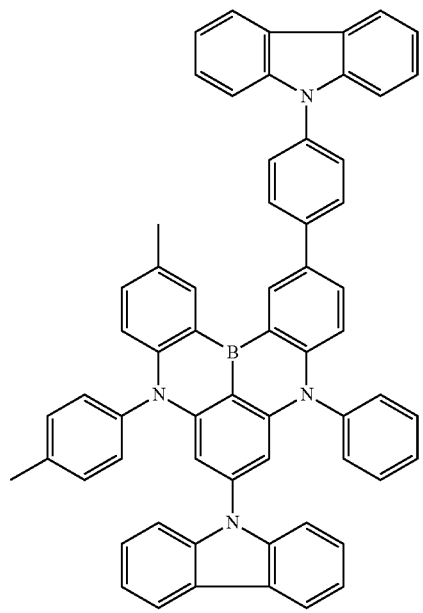
(41)
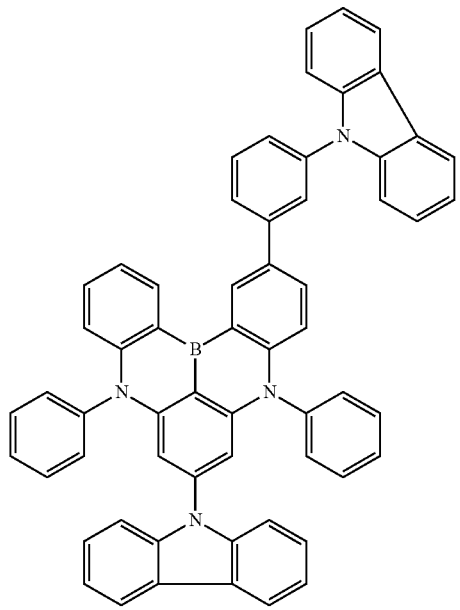
(42)
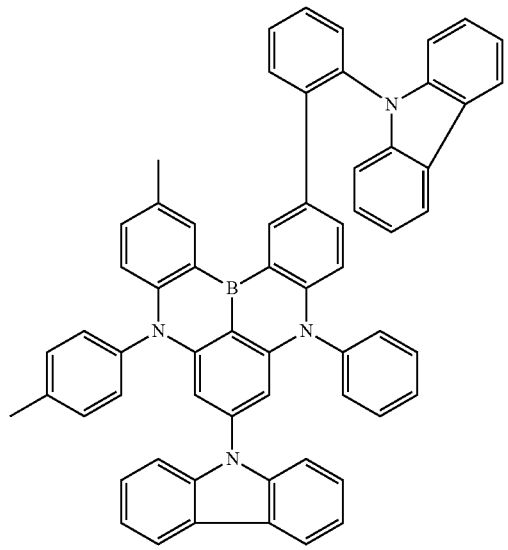
(43)
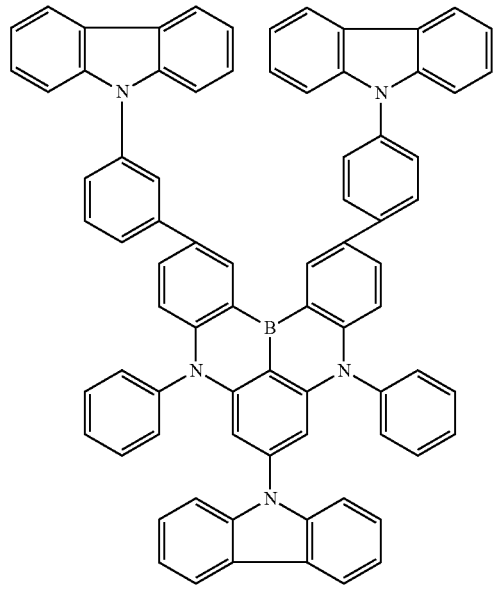

(44)

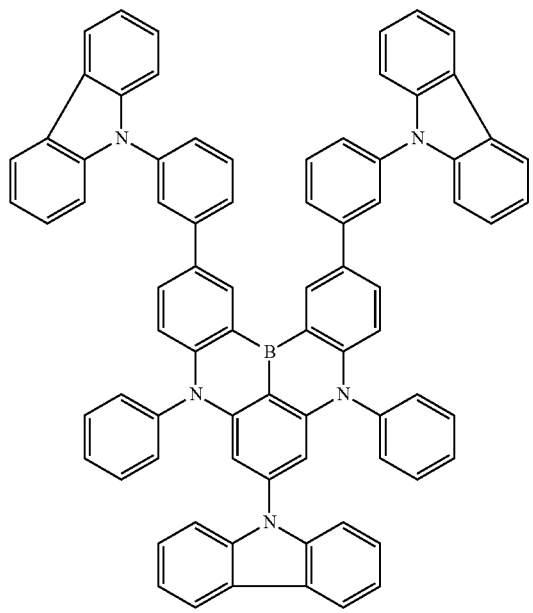

(46)

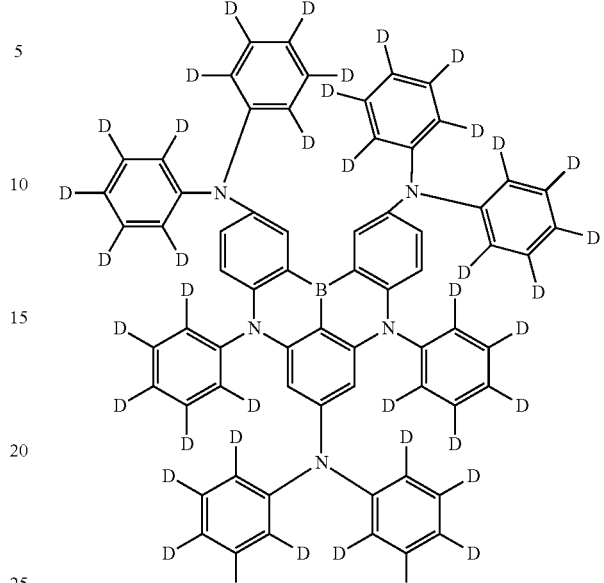

(47)

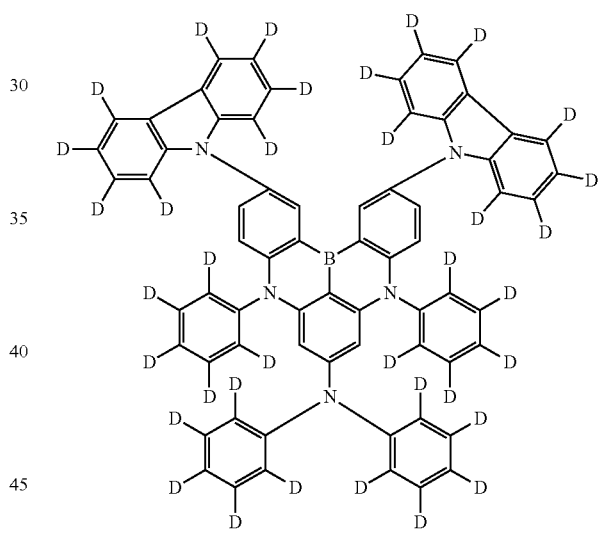

(45)

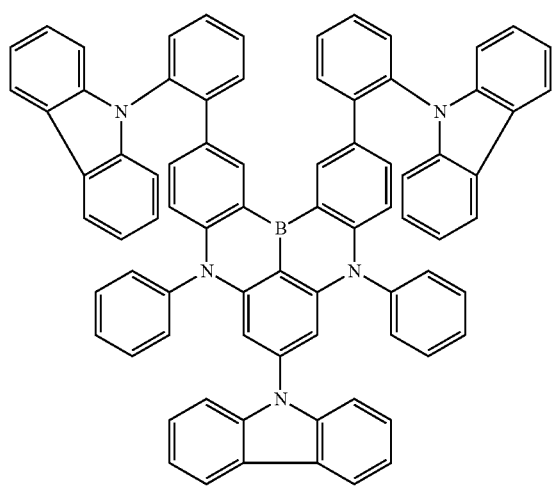

In an embodiment, the compounds represented by Compound Group 1 may each independently have one or more hydrogen atoms substituted with a deuterium atom.

The above-described polycyclic compound may be used in the organic electroluminescence device 10 of an embodiment to improve efficiency and/or a service life (life span) of the organic electroluminescence device. For example, the above-described polycyclic compound may be used in the emission layer EML of the organic electroluminescence device 10 of an embodiment to improve luminous efficiency and/or service life (life span) of the organic electroluminescence device.

In an embodiment, the emission layer EML may be a delayed fluorescence emission layer including a first compound and a second compound, and the polycyclic compound of an embodiment represented by Formula 1 may be included in the first compound of the emission layer EML. For example, the first compound may be a dopant, and the second compound may be a host.

In an embodiment, the host may be a host to emit delayed fluorescence, and the dopant may be a dopant to emit delayed fluorescence. In some embodiments, the polycyclic compound represented by Formula 1 may be included as a dopant material in the emission layer EML. For example, the polycyclic compound of an embodiment, represented by Formula 1 may be used as a TADF dopant.

In some embodiments, the organic electroluminescence device 10 of an embodiment may include a plurality of emission layers. The plurality of emission layers may be sequentially stacked and provided, and for example, the organic electroluminescence device 10 including the plurality of emission layers may be to emit white light. The organic electroluminescence device including a plurality of emission layers may be an organic electroluminescence device having a tandem structure. When the organic electroluminescence device 10 includes a plurality of emission layers, at least one emission layer EML may include the polycyclic compound according to embodiments of the present disclosure.

The emission layer EML may further include a dopant, and any suitable material may be used as the dopant. For example, at least one among styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or derivatives thereof (e.g., 2,5,8,11-tetra-t-butylperylene (TBPe)), pyrene and/or derivatives thereof (e.g., 1,1-dipyrene, 1,4-dipyrenylbenzene, 1,4-bis(N,N-diphenylamino)pyrene, 1,6-bis(N,N-diphenylamino)pyrene), 2,5,8,11-tetra-t-butylperylene (TBP), and 1,3,5-tris(1-phenyl-1H-benz[d]imidazol-2-yl)benzene (TPBi) may be used as a dopant, but embodiments are not limited thereto.

The emission layer EML may further include any suitable material as a host material. For example, the emission layer EML may include at least one of tris(8-hydroxyquinolino) aluminum (Alq$_3$), bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TCTA), poly(n-vinylcarbazole (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis (trphenylsilyl)benzene (UGH-2), hexaphenylcyclotrisiloxane (DPSiO$_3$), octaphenylcyclotetra siloxane (DPSiO$_4$), 2,8-bis(diphenylphosphoryl)dibenzofuran (PPF), or 1,3,5-tris(1-phenyl-1H-benzo[d]imidazole-2-yl)benzene (TPBi) as a host material, without limitation.

When the emission layer EML is to emit red light, the emission layer EML may further include, for example, a fluorescent material including tris(dibenzoylmethanato) phenanthroline europium (PBD:Eu(DBM)$_3$(Phen)) or perylene. When the emission layer EML is to emit red light, a dopant included in the emission layer EML may be, for example, a metal complex or an organometallic complex (such as bis(1-phenylisoquinoline) acetylacetonate iridium (PQIr(acac)), bis(1-phenylquinoline) acetylacetonate iridium (PQIr(acac)), tris(1-phenylquinoline) iridium (PQIr) and octaethylporphyrin platinum (PtOEP)), rubrene and/or derivatives thereof, and/or 4-dicyanomethylene-2-(p-dimethylaminostyryl)-6-methyl-4H-pyran (DCM) and/or derivatives thereof.

When the emission layer EML is to emit green light, the emission layer EML may further include, for example, a fluorescent material including tris(8-hydroxyquinolino)aluminum (Alqa). When the emission layer EML is to emit green light, a dopant included in the emission layer EML may be, for example, selected from among a metal complex or an organometallic complex (such as fac-tris(2-phenylpyridine) iridium (Ir(ppy)$_3$)), and coumarin and/or derivatives thereof.

When the emission layer EML is to emit blue light, the emission layer EML may further include, for example, a fluorescent material including any one selected from the group consisting of spiro-DPVBi, spiro-6P, distyryl-benzene (DSB), distyryl-arylene (DSA), polyfluorene (PFO)-based polymer, and poly(p-phenylene vinylene (PPV)-based polymer. When the light emitting layer EML is to emit blue light, the dopant contained in the light emitting layer EML may be selected from, for example, a metal complex or organometallic complex (such as (4,6-F2ppy)$_2$Irpic), and perylene and/or derivatives thereof.

In the organic electroluminescence device 10 of an embodiment illustrated in FIGS. 1 to 4, the electron transport region ETR is provided on the emission layer EML. The electron transport region ETR may include at least one of a hole blocking layer HBL, an electron transport layer ETL, or an electron injection layer EIL, but embodiments are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In some embodiments, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, about 1000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.).

When the electron transport region ETR includes the electron transport layer ETL, the electron transport region ETR may include an anthracene-based compound. However, embodiments are not limited thereto, and the electron transport region may include, for example, tris(8-hydroxyquinolinato) aluminum (Alq$_3$), 1,3,5-tri[(3-pyridyl)-phen-3-yl] benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzimidazolyl-1-ylphenyl)-9,10-dinaphthylanthracene, 1,3,5-tri(1-phenyl-1H-benz[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato- N1,O8)-(1,1'-biphenyl-4-olato) aluminum (BAlq), beryllium bis(benzoquinolin-10-olate (Bebq$_2$), 9,10-di (naphthalene-2-yl)anthracene (ADN), or a mixture thereof. The thickness of the electron transport layers ETL may be about 100 Å to about 1,000 Å, for example, about 150 Å to about 500 Å. When the thickness of the electron transport layers ETL satisfies the above-described range, satisfactory electron transport characteristics may be obtained without a substantial increase in driving voltage.

When the electron transport region ETR includes the electron injection layer EIL, the electron transport region ETR may be formed using a metal halide (such as LiF, NaCl, CsF, RbCl, and/or RbI), a lanthanide metal (such as Yb), a metal oxide (such as Li$_2$O and/or BaO), or lithium quinolate (LiQ), etc., but the present disclosure is not limited thereto. The electron injection layer EIL may also be formed of a mixture of an electron transport material and an insulating organo-metal salt. The organo-metal salt may be a material having an energy band gap of about 4 eV or more. The organo-metal salt may include, for example, metal acetates, metal benzoates, metal acetoacetates, metal acetylacetonates, and/or metal stearates. The thickness of the electron injection layers EIL may be about 1 Å to about 100 Å, or about 3 Å to about 90 Å. When the thickness of the electron injection layer EIL satisfies the above-described range, satisfactory electron injection properties may be obtained without a substantial increase in driving voltage.

The electron transport region ETR may include a hole blocking layer HBL as described above. The hole blocking layer HBL may include, but is not limited to, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen).

The second electrode EL2 is provided on the electron transport region ETR. The second electrode EL2 may be a common electrode or a negative electrode (e.g., cathode). The second electrode EL2 may be a transmissive electrode, a transflective electrode, or a reflective electrode. When the second electrode EL2 is a transmissive electrode, the second electrode EL2 may be formed of transparent metal oxides, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, In, Sn, Zn, a compound thereof, a mixture thereof (e.g., a mixture of Ag and Mg) or an oxide thereof.

In some embodiments, the second electrode EL2 may have a multilayer structure including a reflective layer or a transflective layer formed of the above-described materials, and a transparent conductive layer formed of ITO, IZO, ZnO, ITZO, etc.

In some embodiments, the second electrode EL2 may be connected with an auxiliary electrode. When the second electrode EL2 is connected to the auxiliary electrode, the resistance of the second electrode EL2 may decrease.

Referring to FIG. 4, the organic electroluminescence device 10 according to an embodiment may further include a capping layer CPL on the second electrode EL2. The capping layer CPL may include, for example, α-NPD, NPB, TPD, m-MTDATA, Alqa, CuPc, N4,N4,N4',N4'-tetra (biphenyl-4-yl) biphenyl-4,4'-diamine (TPD15), 4,4',4"-tris (carbazol-9-yl) triphenylamine (TCTA), N, N'-bis (naphthalen-1-yl), etc.

The organic electroluminescence device 10 according to an embodiment of the present disclosure may include a polycyclic compound represented by Formula 1 as described above to thereby obtain superior luminous efficiency and/or long service life (life span) characteristics. In addition, the organic electroluminescence device 10 of an embodiment may achieve high efficiency and long service life characteristics in a blue wavelength region.

Hereinafter, with reference to Examples and Comparative Examples, a compound according to an embodiment of the present disclosure and an organic electroluminescence device of an embodiment will be described in more detail. The Examples are illustrated only for the understanding of this present disclosure, and the scope of the present disclosure is not limited thereto.

EXAMPLES (Synthesis of Polycyclic Compound)

In the following descriptions, a synthetic method of the polycyclic compound is provided as an example, but the synthetic method according to an embodiment of the present disclosure is not limited to the following examples.

1. Synthesis of Compound 2

(Synthesis of Intermediate A)

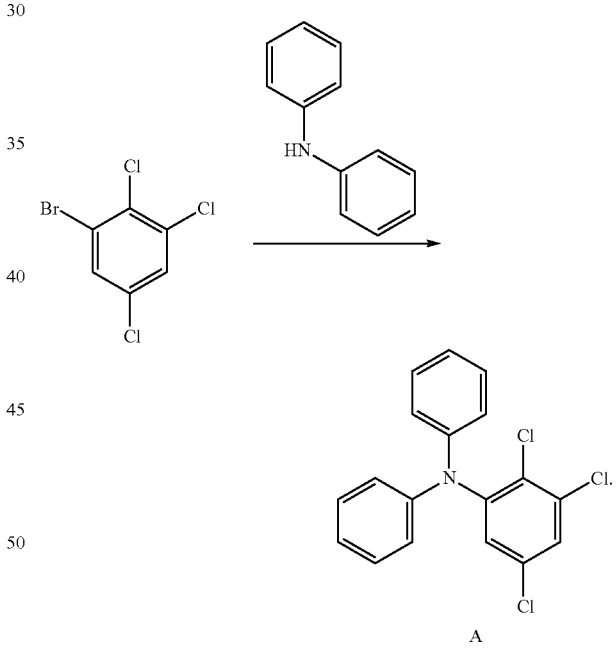

In an Ar atmosphere, 1-bromo-2,3,5-trichlorobenzene (440.0 g, 154 mmol), diphenylamine (26.0 g, 154 mmol), Pd(dba)$_2$ (2.65 g, 4.61 mmol), tri-tert-butyl phosphonium tetra fluoro borate (1.78 g, 6.15 mmol), t-BuONa (34.7 g, 34.7 mmol), and toluene (500 mL) were added to a three-necked round bottom flask and stirred at 90° C. for 5 hours. After cooling to room temperature, 500 mL of water was added thereto, the resultant mixture was subjected to liquid separation to concentrate an organic layer. This was purified by column to obtain Intermediate A (40.5 g, yield 75.6%).

(Synthesis of Intermediate B)

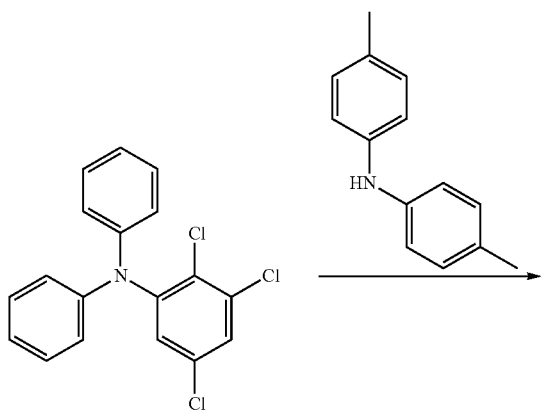

A

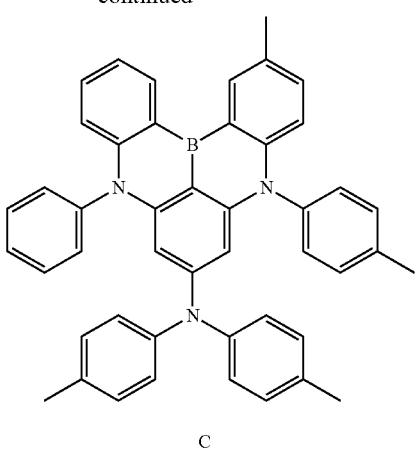

C

In an Ar atmosphere, Intermediate B (26.8 g, 40 mmol) was added in a three-necked round bottom flask and dissolved in 333 mL of t-butyl benzene. While cooling to −30° C., 50 mL of 1.6 M t-butyl lithium pentane solution was added thereto. After dropping was completed, the mixture was heated up to 60° C. and stirred for 2 hours, and then the components having lower boiling point than t-butyl benzene were removed by distillation. The mixture was cooled to −30° C. again, 20 g of boron tribromide was added thereto, and the mixture was heated up to room temperature and stirred for 1 hour. Thereafter, the mixture was cooled again in an ice bath and 11 mL of N, N-diisopropylethylamine was added thereto. Then, the mixture was heated up to 120° C. and stirred for 3 hours. The reaction solution was cooled to room temperature, and subjected to liquid separation by adding 200 mL of water and 500 mL of dichloromethane to obtain an organic layer. The organic layer was passed through a column filled with silica gel, and then the effluent was concentrated and recrystallized with toluene to obtain Intermediate C (Comparative Compound 3, 3.40 g, yield 13.2%).

(Synthesis of Intermediate D)

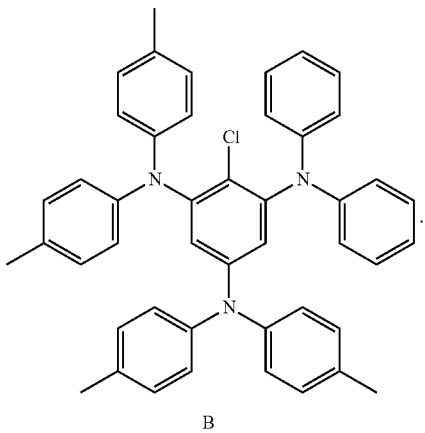

B

In an Ar atmosphere, Intermediate A (39.0 g, 112 mmol), 4,4'-dimethyl diphenylamine (44.1 g, 224 mmol), Pd(dba)$_2$ (1.93 g, 3.36 mmol), tri-tert-butyl phosphonium tetra fluoro borate (1.30 g, 4.47 mmol), t-BuONa (25.0 g, 2.33 mmol), and toluene (500 mL) were added to a three-necked round bottom flask and stirred at 120° C. for 5 hours. After cooling to room temperature, 500 mL of water was added thereto, and the resultant mixture was subjected to liquid separation to concentrate an organic layer. The concentrated organic layer was purified by column chromatography to obtain Intermediate B (51.4 g, yield 68.6%).

(Synthesis of Intermediate C)

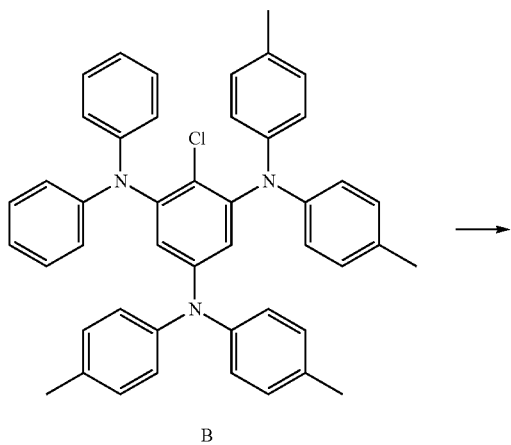

B

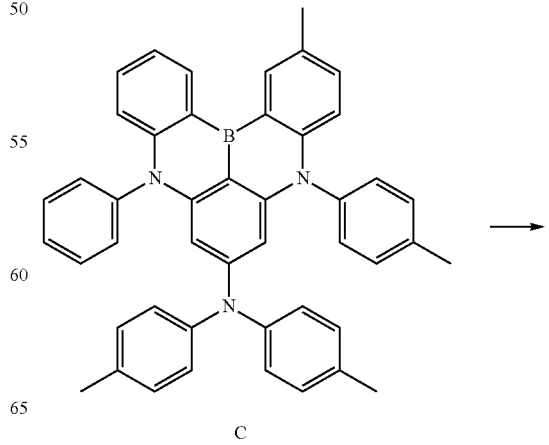

C

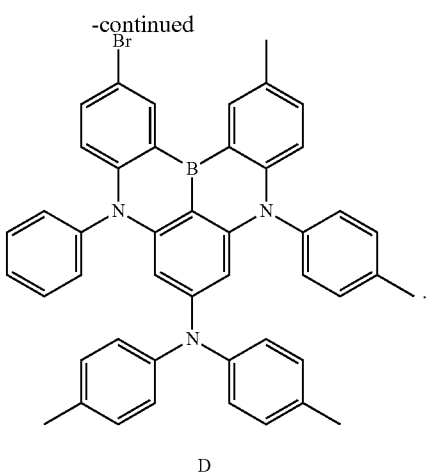

D

In an Ar atmosphere, Intermediate C (3.00 g, 4.7 mmol), benzyltrimethylammonium tribromide (1.91 g, 4.9 mmol), and 200 mL of ethyl acetate were added to three-necked round bottom flask. The mixture was stirred at room temperature for 7 hours, and then heated up to 50° C. and stirred for 7 hours. After cooling to room temperature, the reaction solution was concentrated. The concentrated reaction solution was subjected to liquid separation by adding 100 mL of water and 300 mL of dichloromethane to concentrate an organic layer and thereby obtain Intermediate D (2.79 g, yield 82.8%).

(Synthesis of Compound 2)

In an Ar atmosphere, Intermediate D (2.50 g, 3.5 mmol), carbazole (0.87 g, 5.2 mmol), Pd(dba)$_2$ (0.10 g, 0.17 mmol), tri-tert-butyl phosphonium tetra fluoro borate (0.07 g, 0.24 mmol), t-BuONa (0.78 g, 8.1 mmol), and toluene (50 mL) were added in a three-necked round bottom flask and stirred at 90° C. for 5 hours. After cooling to room temperature, the resultant mixture was subjected to liquid separation by adding 100 mL of water and 300 mL of dichloromethane to obtain an organic layer. The obtained organic layer was passed through a column filled with silica gel. The effluent was concentrated and recrystallized with toluene to obtain Compound 2 (2.12 g, yield 75.8%). The molecular weight of Compound 2 was 809 as measured by FAB MS. Sublimation purification (350° C., 9×10$^{-5}$ Pa) was carried out and device evaluation was performed.

2. Synthesis of Compound 5

(Synthesis of Intermediate E)

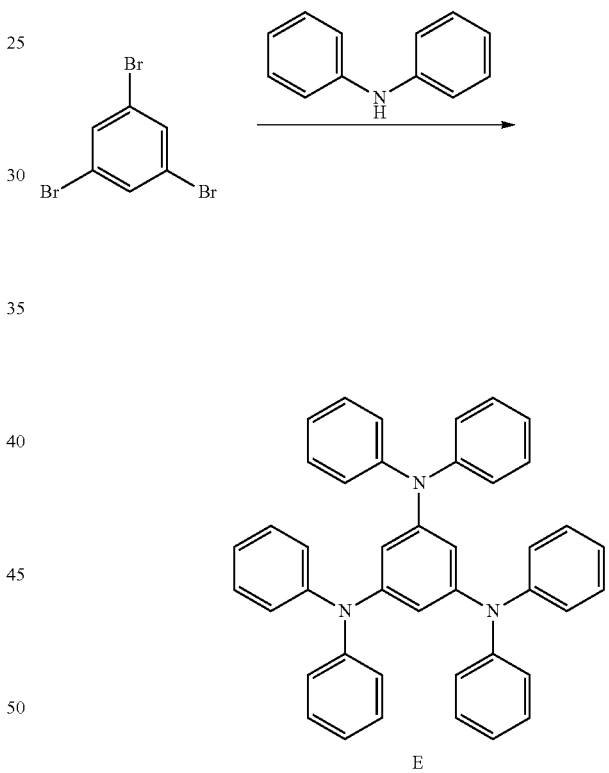

E

In an Ar atmosphere, 1,3,5-tribromobenzene (25.0 g, 79.4 mmol), diphenylamine (53.8 g, 318 mmol), Pd(dba)$_2$ (1.37 g, 2.38 mmol), tri-tert-butyl phosphonium tetra fluoro borate (0.92 g, 3.17 mmol), t-BuONa (26.7 g, 278 mmol), and toluene (200 mL) were added to a three-necked round bottom flask and stirred at 90° C. for 5 hours. After cooling to room temperature, the resultant mixture was subjected to liquid separation by adding 200 mL of water to concentrate an organic layer. The concentrated organic layer was recrystallized with toluene to obtain Intermediate E (41.1 g, yield 89.3%).

(Synthesis of Intermediate F)

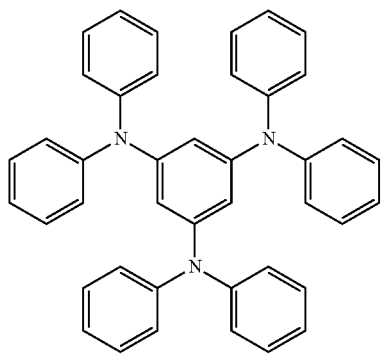

E

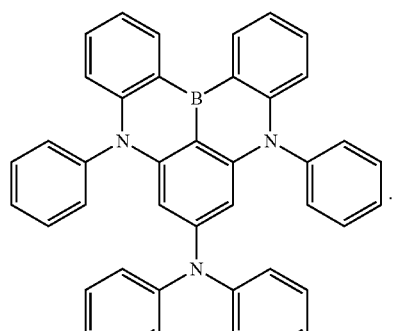

F

In an Ar atmosphere, Intermediate E (20.0 g, 34.5 mmol), boron tribromide (25.0 g, 100 mmol), and o-dichlorobenzene (200 mL) were added to a three-necked round bottom flask and stirred at 180° C. for 9 hours. After cooling to room temperature, 50 mL of N,N-diisopropylethylamine was added thereto. The resultant mixture was subjected to liquid separation by adding 100 mL of water and 300 mL of dichloromethane to concentrate an organic layer and recrystallized with toluene to obtain Intermediate F (6.41 g, yield 31.6%).

(Synthesis of Intermediate G)

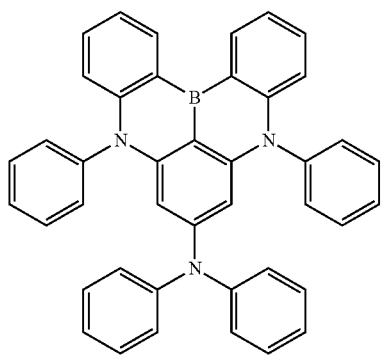

F

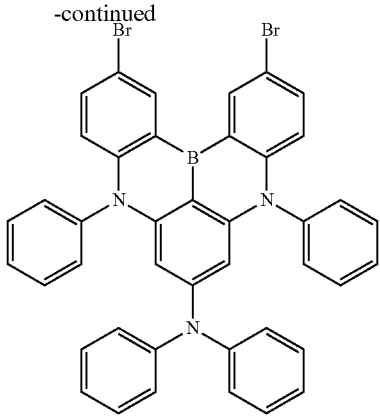

G

In an Ar atmosphere, Intermediate F (5.0 g, 8.51 mmol), benzyltrimethylammonium tribromide (9.96 g, 25.5 mmol), and ethyl acetate (300 mL) were added to three-necked round bottom flask. After stirring for 7 hours at room temperature, the mixture was refluxed for 7 hours. After cooling to roam temperature, the reaction solution was concentrated. The concentrated reaction solution was subjected to liquid separation by adding 100 mL of water and 300 mL of dichloromethane to concentrate an organic layer and recrystallized with toluene to obtain Intermediate G (2.10 g, yield 33.1%).

(Synthesis of Compound 5)

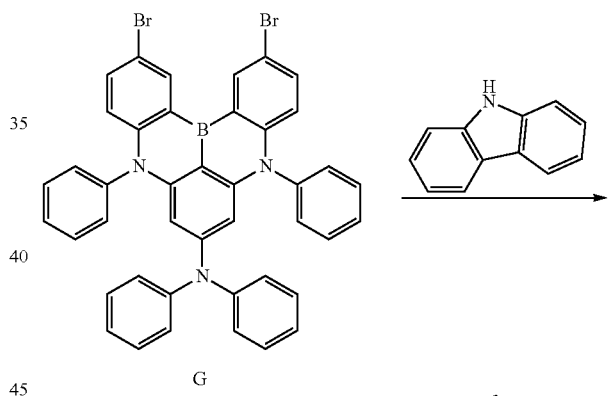

G

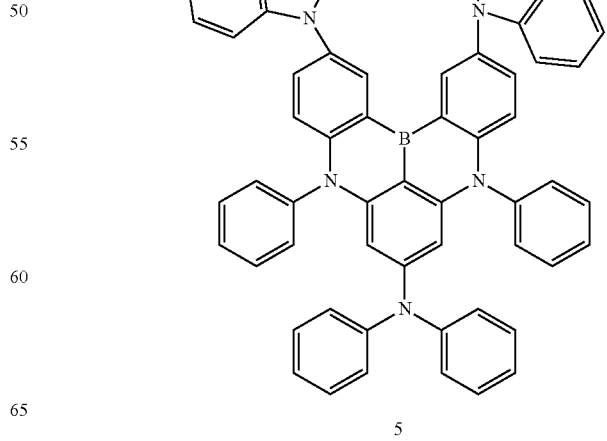

5

In an Ar atmosphere, Intermediate G (2.00 g, 2.68 mmol), carbazole (1.35 g, 8.07 mmol), Pd(dba)₂ (0.11 g, 0.19 mmol), tri-tert-butyl phosphonium tetra fluoro borate (0.06 g, 0.21 mmol), t-BuONa (0.77 g, 8.01 mmol), and toluene (100 mL) were added to a three-necked round bottom flask and stirred at 90° C. for 15 hours. After cooling to room temperature, the resultant mixture was subjected to liquid separation by adding 100 mL of water and 200 mL of dichloromethane to obtain an organic layer. The obtained organic layer was passed through a column filled with silica gel. The effluent was concentrated and recrystallized with toluene to obtain Compound 5 (1.50 g, yield 60.9%). The molecular weight of Compound 5 was 918 as measured by FAB-MS measurement. Sublimation purification (380° C., 9×10⁻⁵ Pa) was carried out and device evaluation was performed.

3. Synthesis of Compound 26

(Synthesis of Intermediate H)

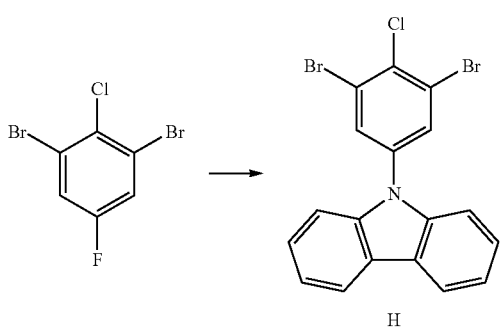

In an Ar atmosphere, 1,3-dibromo-2-chloro-5-fluorobenzene (20.0 g, 69.4 mmol), carbazole (23.2 g, 139 mmol), cesium carbonate (45.2 g, 139 mmol), and NMP (150 mL) were added to a three-necked round bottom flask and stirred at 180° C. for 15 hours. After cooling to room temperature, the resultant mixture was subjected to liquid separation by adding 300 mL of water and 200 mL of toluene to concentrate an organic layer. The concentrated organic layer was purified by column chromatography to obtain Intermediate H (12.1 g, yield 40.0%).

(Synthesis of Intermediate I)

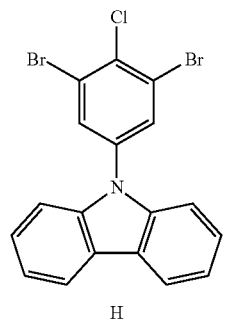

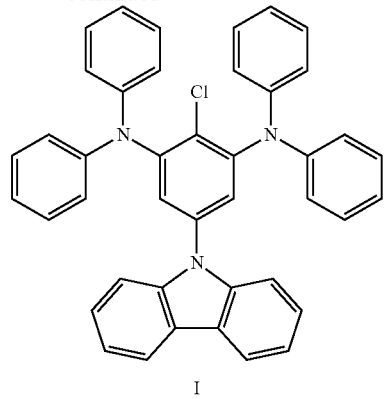

In an Ar atmosphere, Intermediate H (10.0 g, 23.0 mmol), diphenylamine (7.77 g, 45.9 mmol), Pd(dba)₂ (0.53 g, 0.92 mmol), tri-tert-butyl phosphonium tetra fluoro borate (0.33 g, 1.14 mmol), t-BuONa (5.52 g, 57.4 mmol), and toluene (50 mL) were added to a three-necked round bottom flask and stirred at 70° C. for 7 hours. After cooling to room temperature, the resultant mixture was subjected to liquid separation by adding 100 mL of water to concentrate an organic layer. The concentrated organic layer was recrystallized with toluene to obtain Intermediate I (12.8 g, yield 91.1%).

(Synthesis of Intermediate J)

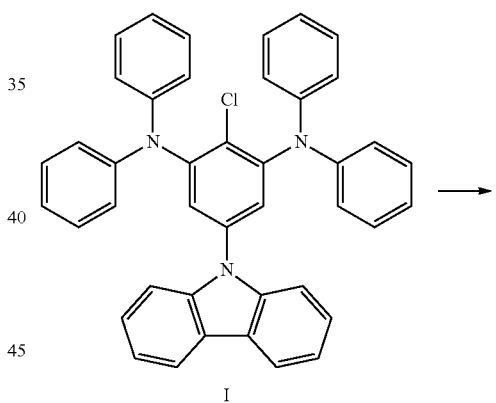

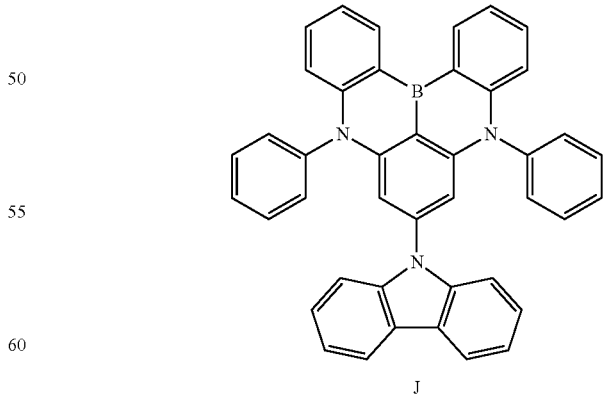

In an Ar atmosphere, Intermediate I (10.0 g, 40 mmol) was added to a three-necked round bottom flask and dissolved in 80 mL of t-butyl benzene. While cooling to −30° C., 20 mL of 1.6 M t-butyl lithium pentane solution was added thereto. After dropping was completed, the mixture was heated up to 60° C. and stirred for 2 hours, and then the components having lower boiling point than t-butyl benzene were removed by distillation. The mixture was cooled to −30° C. again, 8 g of boron tribromide was added thereto, and the mixture was heated up to room temperature and stirred for 1 hour. Thereafter, the mixture was cooled again in an ice bath and 5.7 mL of N, N-diisopropylethylamine was added thereto. Then, the mixture was heated up to 120° C. and stirred for 3 hours. The reaction solution was cooled to room temperature, and subjected to liquid separation by adding 100 mL of water and 300 mL of dichloromethane to obtain an organic layer. The organic layer was passed through a column filled with silica gel, and then the effluent was concentrated and recrystallized with toluene to obtain Intermediate J (1.34 g, yield 14.0%).

(Synthesis of Intermediate K)

(Synthesis of Compound 26)

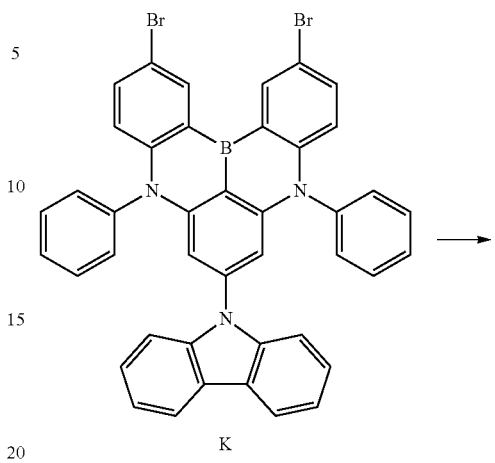

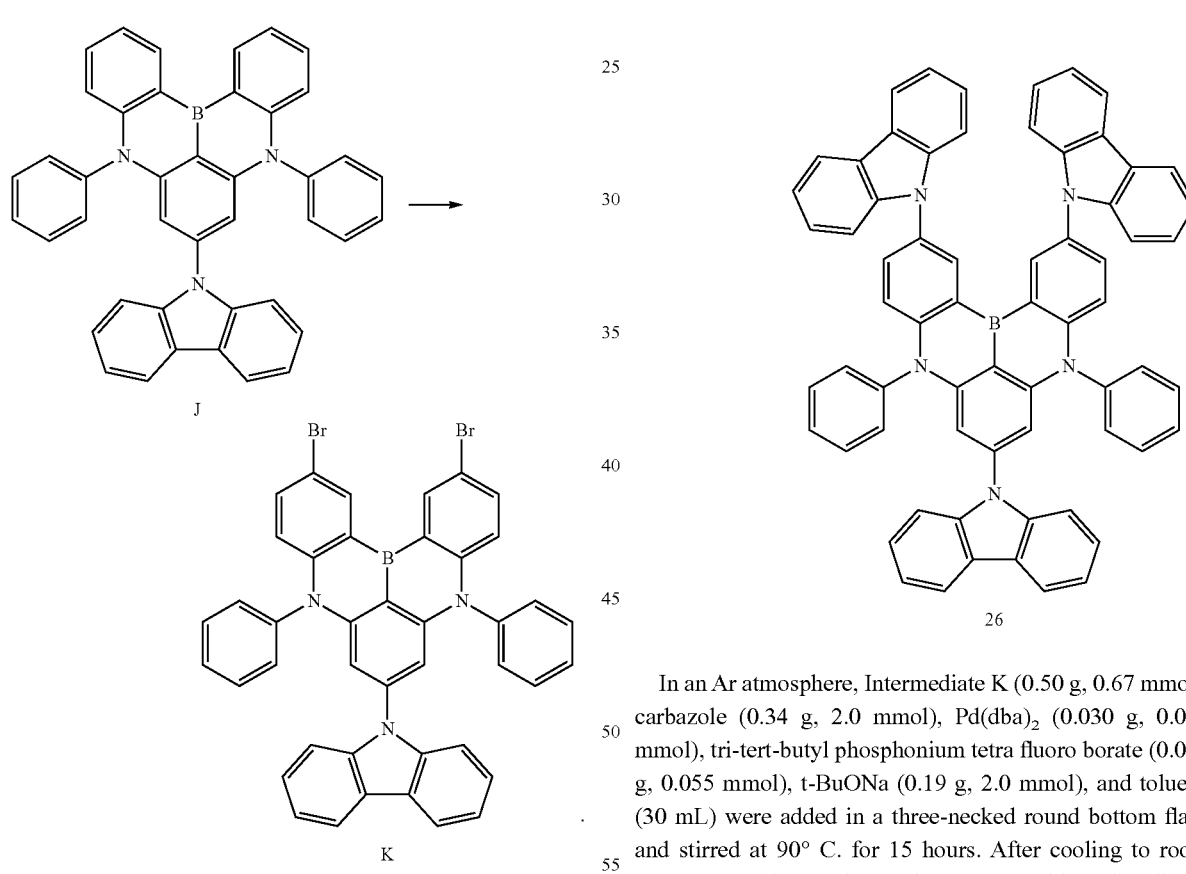

In an Ar atmosphere, Intermediate J (1.20 g, 2.05 mmol), benzyltrimethylammonium tribromide (2.40 g, 6.15 mmol) and ethyl acetate (100 mL) were added to a three-necked round bottom flask. After stirring for 7 hours at room temperature, the mixture was refluxed for 7 hours. After cooling to room temperature, the reaction solution was concentrated. The concentrated reaction solution was subjected to liquid separation by adding 100 mL of water and 300 mL of dichloromethane to concentrate an organic layer and recrystallized with toluene to obtain Intermediate K (0.54 g, yield 35.5%).

In an Ar atmosphere, Intermediate K (0.50 g, 0.67 mmol), carbazole (0.34 g, 2.0 mmol), Pd(dba)$_2$ (0.030 g, 0.052 mmol), tri-tert-butyl phosphonium tetra fluoro borate (0.016 g, 0.055 mmol), t-BuONa (0.19 g, 2.0 mmol), and toluene (30 mL) were added in a three-necked round bottom flask and stirred at 90° C. for 15 hours. After cooling to room temperature, the resultant mixture was subjected to liquid separation by adding 50 mL of water and 100 mL of dichloromethane to obtain an organic layer. The obtained organic layer was passed through a column filled with silica gel. The effluent was concentrated and recrystallized with toluene to obtain Compound 26 (0.51 g, yield 82.8%). The molecular weight of Compound 26 was 916 as measured by FAB MS measurement. Sublimation purification (380° C., 9×10$^{-5}$ Pa) was carried out and device evaluation was performed.

4. Synthesis of Compound 36
(Synthesis of Compound 36)

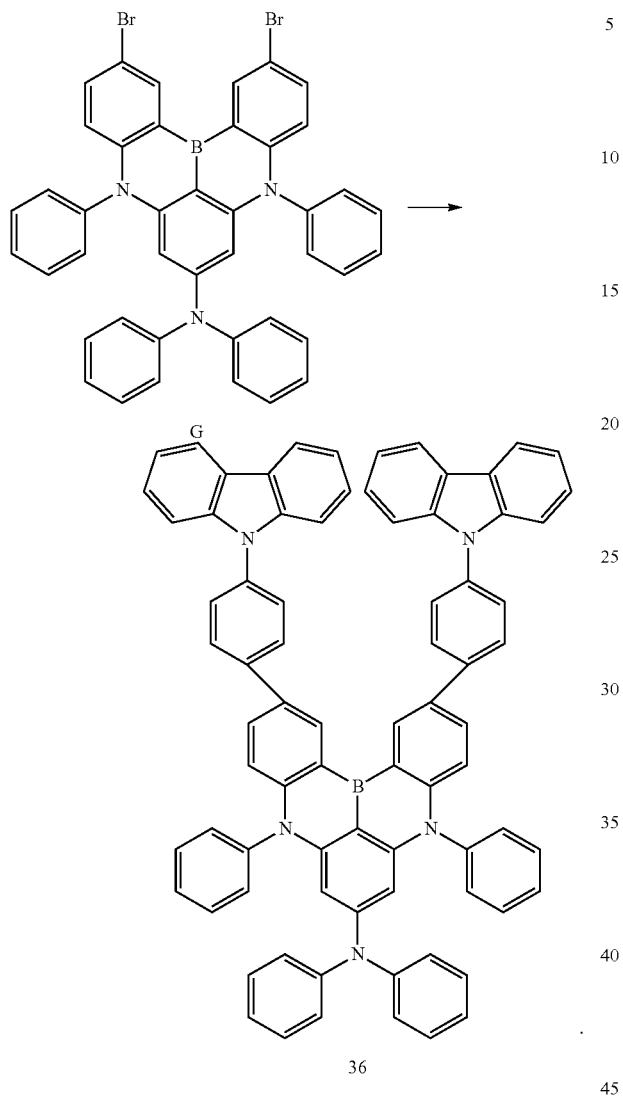

In an Ar atmosphere, Intermediate G (1.00 g, 1.34 mmol), 9-[4-(4,4,5,5-tetramethyl-1,3,2-dioxaborolan-2-yl)phenyl]-9H-carbazole (1.49 g, 4.04 mmol), Pd(dba)$_2$ (0.054 g, 0.094 mmol), tri-tert-butyl phosphonium tetra fluoro borate (0.031 g, 0.11 mmol), t-BuONa (0.39 g, 4.1 mmol), and toluene (80 mL) were added in a three-necked round bottom flask and stirred at 90° C. for 15 hours. After cooling to room temperature, the resultant mixture was subjected to liquid separation by adding 100 mL of water and 200 mL of dichloromethane to obtain an organic layer. The obtained organic layer was passed through a column filled with silica gel. The effluent was concentrated and recrystallized with toluene to obtain Compound 36 (0.73 g, yield 50.8%). The molecular weight of Compound 36 was 1070 as measured by FAB MS measurement. Sublimation purification (420° C., 9×10$^{-5}$ Pa) was carried out and device evaluation was performed.

(Manufacture of Organic Electroluminescence Device)

The organic electroluminescence devices of Examples 1 to 4 were manufactured using the above-described Example Compounds as respective emission layer materials.

Example Compounds

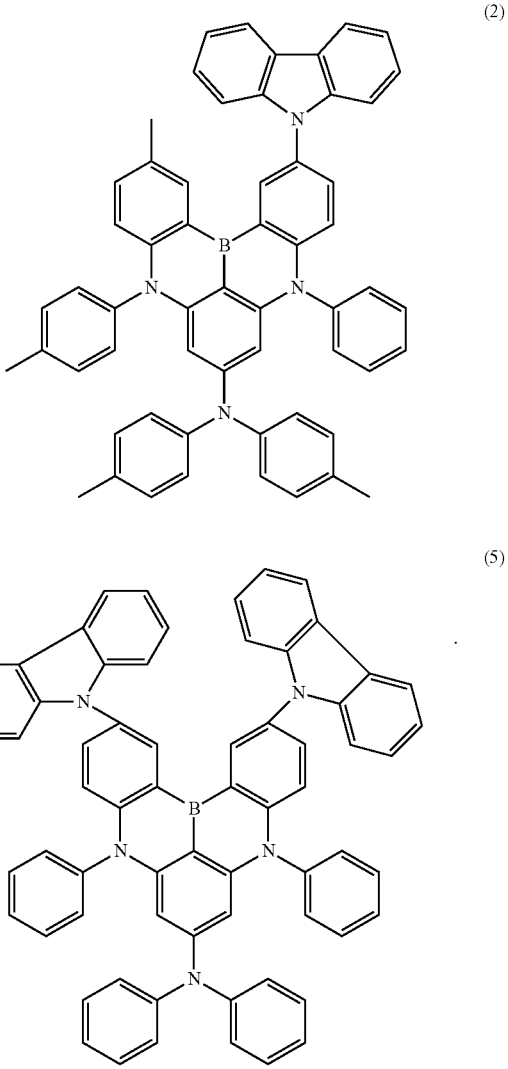

(36)
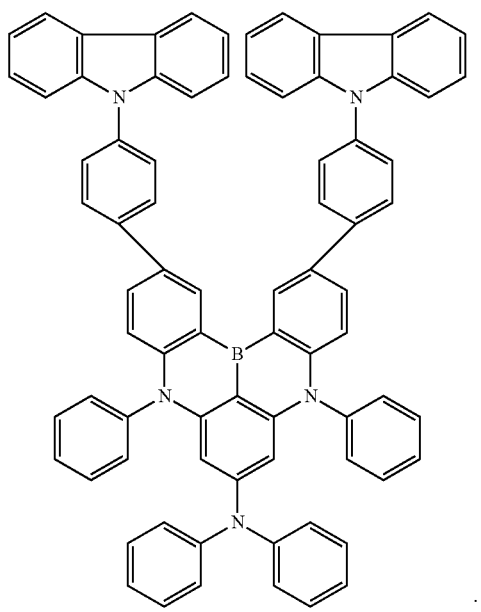
The organic electroluminescence devices of Comparative Examples 1 to 8 were manufactured using Comparative Example Compounds X-1 to X-8 as respective emission layer materials.
Comparative Example Compounds
X-1
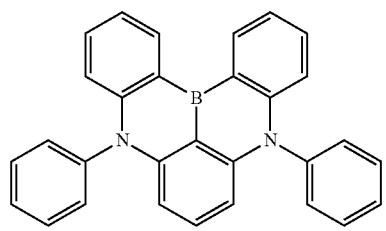
X-2
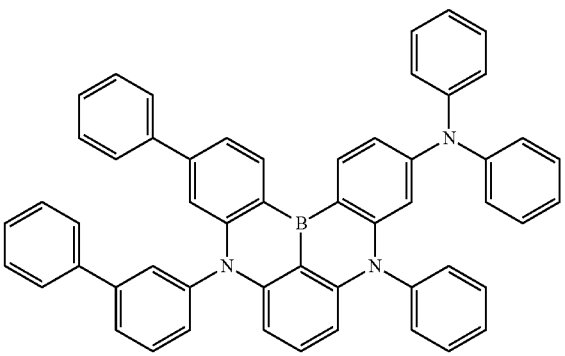
X-3
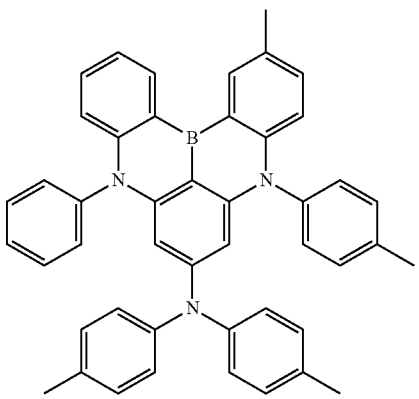
X-4
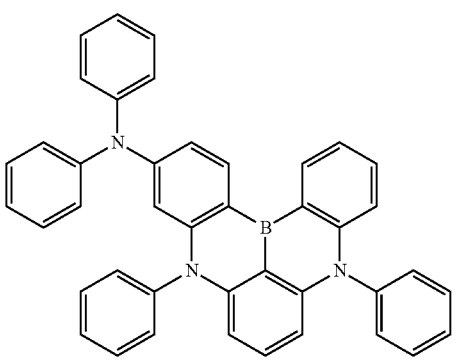
X-5
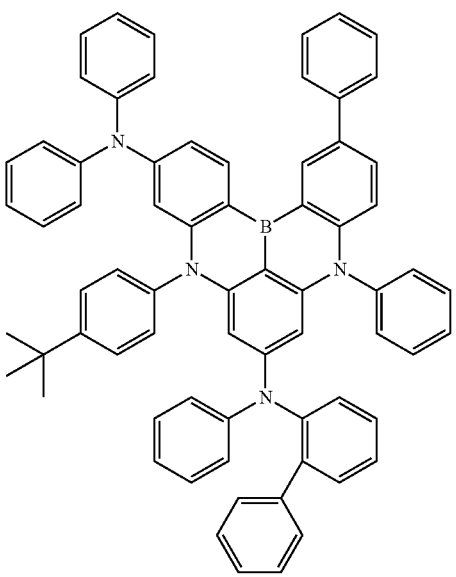

-continued

X-6

X-7

X-8

The organic electroluminescence devices of Examples and Comparative Examples were manufactured by the following method.

ITO having a thickness of about 1,500 Å was patterned on a glass substrate, washed with ultrapure water, and UV ozone-treated for about 10 minutes. Thereafter, HAT-CN was deposited to a thickness of 100 Å, α-NPD was deposited to a thickness of 800 Å, and mCP was deposited to a thickness of 50 Å to form a hole transport region.

Next, a polycyclic compound of an Example or a Comparative Example compound, and mCBP were co-deposited in a ratio of 10:90 to form an emission layer having a thickness of about 200 Å.

A 300 Å-thick layer was formed on the emission layer with TPBi and a 5 Å-thick layer was formed with LiF to form an electron transport region. Next, a second electrode having a thickness of about 1000 Å was formed with aluminum (Al).

In the Examples, the hole transport region, the emission layer, the electron transport region, and the second electrode were each formed using a vacuum deposition apparatus.

(Evaluation of Organic Electroluminescence Device Characteristics)

For the evaluation of the characteristics of an organic electroluminescence device according to the Examples and Comparative Examples, the maximum emission wavelength (nm), the maximum external quantum yield (%), and the external quantum efficiency (%) at a luminance of 1000 cd/m$^2$ were measured using a brightness light distribution characteristics measurement device, C9920-11 from Hamamatsu Photonics, Inc.

TABLE 1

| | Emission layer dopant | Maximum external quantum yield (%) | External quantum efficiency (%) |
|---|---|---|---|
| Example 1 | Example Compound 2 | 17.6 | 8.5 |
| Example 2 | Example Compound 5 | 18.9 | 7.7 |
| Example 3 | Example Compound 26 | 19.0 | 7.4 |
| Example 4 | Example Compound 36 | 18.4 | 7.5 |
| Comparative Example 1 | Comparative Example Compound X-1 | 13.2 | 5.4 |
| Comparative Example 2 | Comparative Example Compound X-2 | 14.2 | 6.4 |
| Comparative Example 3 | Comparative Example Compound X-3 | 13.2 | 6.3 |
| Comparative Example 4 | Comparative Example Compound X-4 | 14.0 | 6.2 |
| Comparative Example 5 | Comparative Example Compound X-5 | 13.1 | 6.5 |
| Comparative Example 6 | Comparative Example Compound X-6 | 11.0 | 5.8 |
| Comparative Example 7 | Comparative Example Compound X-7 | 13.0 | 5.2 |
| Comparative Example 8 | Comparative Example Compound X-8 | 15.6 | 6.4 |

Referring to the results of Table 1, it is confirmed that when the polycyclic compound according to an example was included in the emission layer, the external quantum efficiency of the device was improved compared to the Comparative Examples.

The Example Compounds include an amine group in a set or predetermined position, and without being bound by the correctness of any theory or explanation, it is believed that the thermal stability of the polycyclic compound was improved by introducing a substituent capable of improving molecular durability at the position of $X_1$ and/or $X_2$. Accordingly, the external quantum efficiency of a device including the compound was improved.

The organic electroluminescence device of an example may achieve high luminous efficiency by using the polycyclic compound represented by Formula 1 as an emission layer material.

The organic electroluminescence device according to an embodiment of the present disclosure may achieve high efficiency and long service life.

The polycyclic compound according to an embodiment of the present disclosure may improve efficiency and/or service life (life span) of the organic electroluminescence device.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to example embodiments of the present disclosure, it will be understood that the present disclosure should not be limited to these example embodiments, but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and equivalents thereof.

What is claimed is:

1. An organic electroluminescence device comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof, and
wherein the emission layer comprises a polycyclic compound represented by Formula 1:

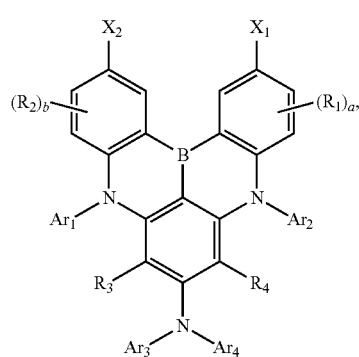

[Formula 1]

wherein, in Formula 1,
$Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, and
$Ar_3$ and $Ar_4$ are each independently substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring,
$R_1$ to $R_4$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
a and b are each independently an integer of 0 to 3,
$X_1$ and $X_2$ are each independently a hydrogen atom, a deuterium atom, a cyano group, a carbonyl group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and
at least one among $X_1$ and $X_2$ is a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent, and
wherein the emission layer is to emit delayed fluorescence.

2. The organic electroluminescence device of claim 1, wherein the emission layer is a delayed fluorescence emission layer comprising a first compound and a second compound, and the first compound comprises the polycyclic compound.

3. The organic electroluminescence device of claim 1, wherein the emission layer is a thermally activated delayed fluorescence emission layer to emit blue light.

4. The organic electroluminescence device of claim 1, wherein $X_1$ is a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent, and wherein $X_2$ is a hydrogen atom, a deuterium atom, or a substituted or unsubstituted alkyl group having 1 to 20 carbon atoms.

5. The organic electroluminescence device of claim 1, wherein $X_1$ and $X_2$ are each independently a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent.

6. The organic electroluminescence device of claim 1, wherein at least one among $X_1$ and $X_2$ is represented by any one among 1-1 to 1-4:

1-1

*—CN 1-2

1-3

1-4

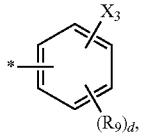

wherein, in 1-2 to 1-4, $R_6$ and $R_9$ are each independently a substituted or unsubstituted aryl group having 6 to 30 ring-forming carbon atoms, or a substituted or unsubstituted heteroaryl group having 2 to 30 ring-forming carbon atoms, $R_7$ and $R_8$ are each independently a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, d is an integer of 0 to 4, and $X_3$ is represented by any one among 1-1 to 1-3.

7. The organic electroluminescence device of claim 1, wherein Formula 1 is represented by Formula 2-1 or Formula 2-2:

[Formula 2-1]

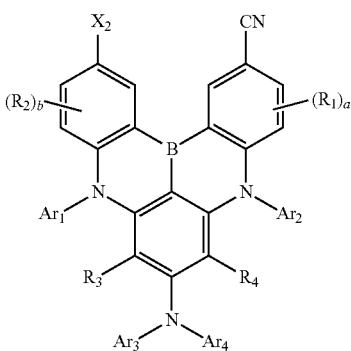

[Formula 2-2]

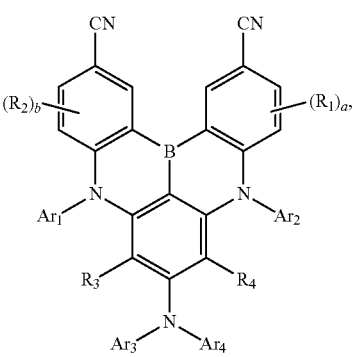

wherein, in Formula 2-1 and Formula 2-2, $X_2$, $R_1$ to $R_4$, $Ar_1$ to $Ar_4$, a and b are each independently the same as defined in Formula 1.

8. The organic electroluminescence device of claim 1, wherein Formula 1 is represented by Formula 3-1 or Formula 3-2:

[Formula 3-1]

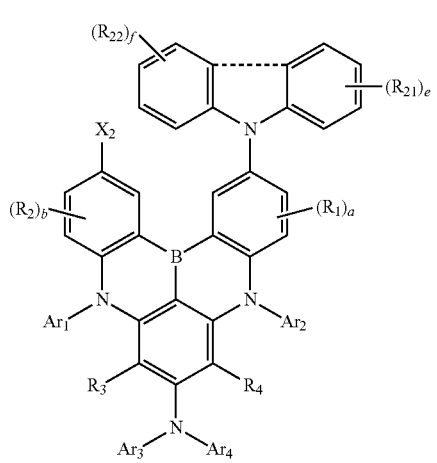

-continued

[Formula 3-2]

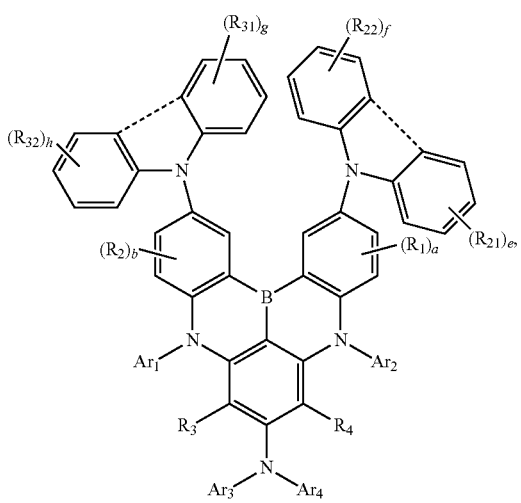

wherein, in Formula 3-1 and Formula 3-2, $R_{21}$, $R_{22}$, $R_{31}$, and $R_{32}$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, e to h are each independently an integer of 0 to 4, the dotted line is an optional bond, and $X_2$, $R_1$ to $R_4$, $Ar_1$ to $Ar_4$, a and b are each independently the same as defined in Formula 1.

9. The organic electroluminescence device of claim 1, wherein Formula 1 is represented by Formula 4-1 or Formula 4-2:

[Formula 4-1]

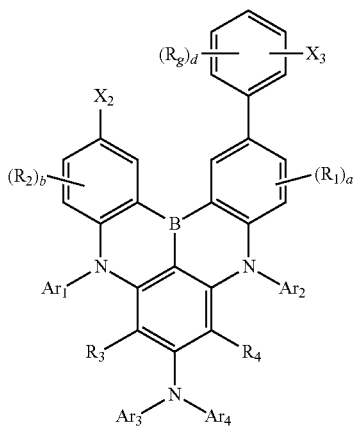

-continued

[Formula 4-2]

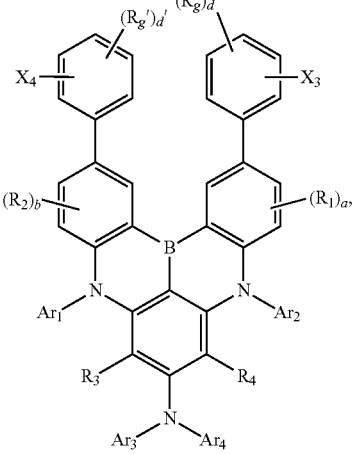

wherein, in Formula 4-1 and Formula 4-2, $X_3$ and $X_4$ are each independently a cyano group, a carbonyl group, a substituted amine group, or a substituted or unsubstituted heteroaryl group including N having 2 to 30 ring-forming carbon atoms, $R_9$ to $R_9'$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, d and d' are each independently an integer of 0 to 4, and $X_2$, $R_1$ to $R_4$, $Ar_1$ to $Ar_4$, a and b are each independently the same as defined in Formula 1.

10. The organic electroluminescence device of claim 1, wherein $Ar_1$ and $Ar_2$ are each independently represented by Formula 5:

[Formula 5]

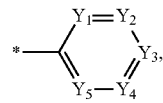

wherein, in Formula 5, $Y_1$ to $Y_5$ are each independently CA or N, and

A is a hydrogen atom, a deuterium atom, or an alkyl group having 1 to 20 carbon atoms.

11. The organic electroluminescence device of claim 1, wherein Formula 1 is represented by Formula 6:

[Formula 6]

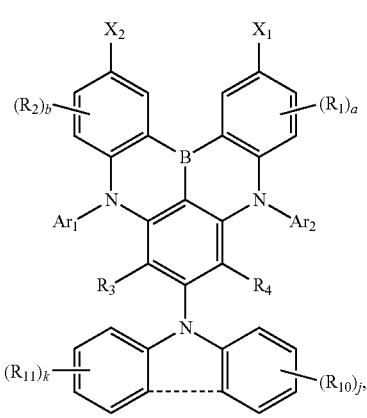

wherein, in Formula 6, $R_{10}$ to $R_{11}$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, j and k are each independently an integer of 0 to 4, the dotted line is an optional bond, and $R_1$ to $R_4$, $X_1$, $X_2$, $Ar_1$, $Ar_2$, a and b are each independently the same as defined in Formula 1.

12. The organic electroluminescence device of claim 1, wherein the compound represented by Formula 1 is any one among the compounds represented by Compound Group 1:

[Compound Group 1]

(1)

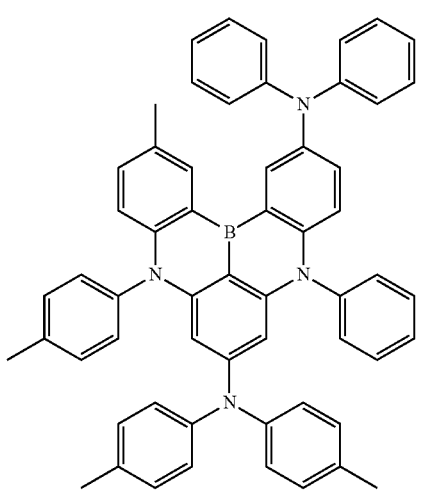

-continued (2)

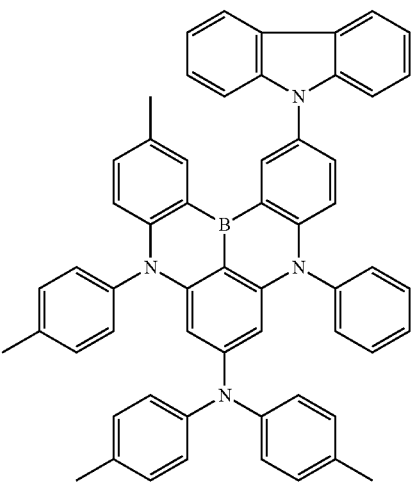

(3)

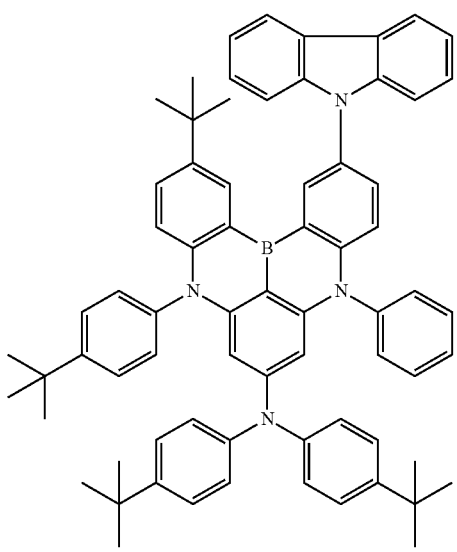

(4)

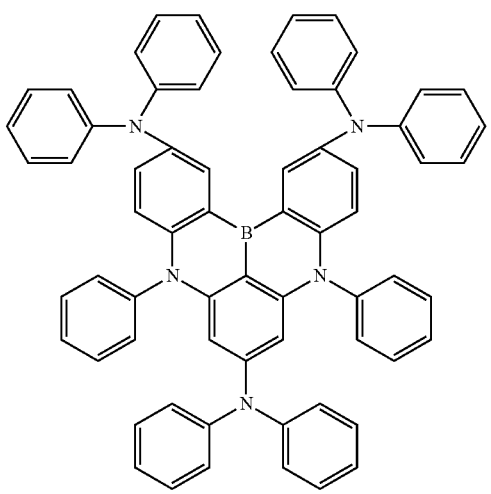

(5)
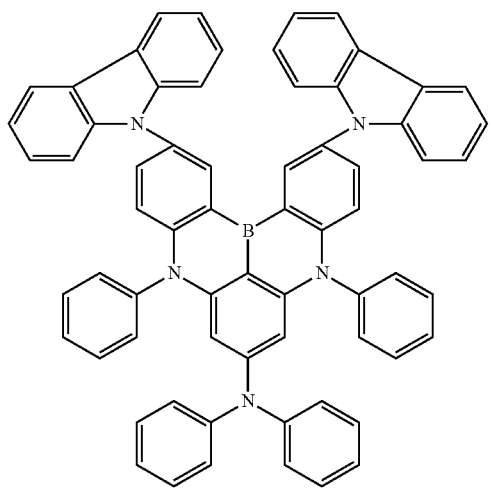
(6)
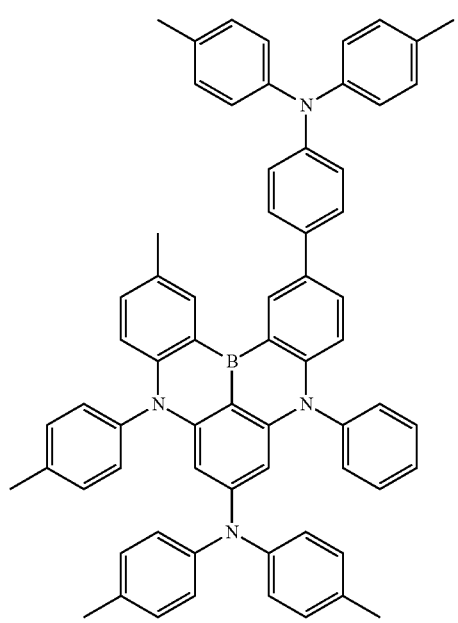
(7)
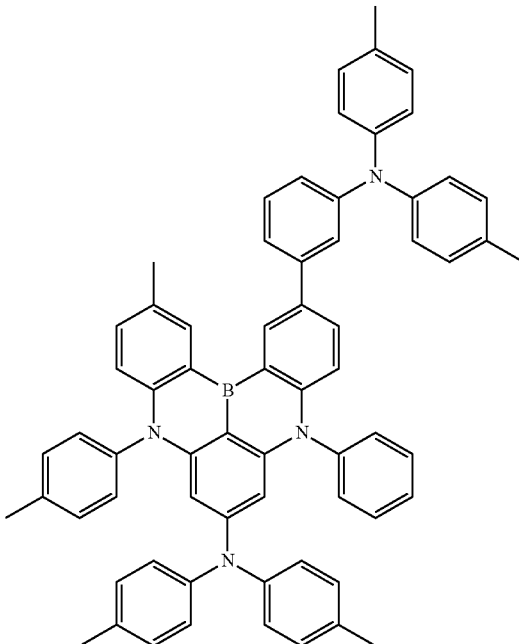
(8)
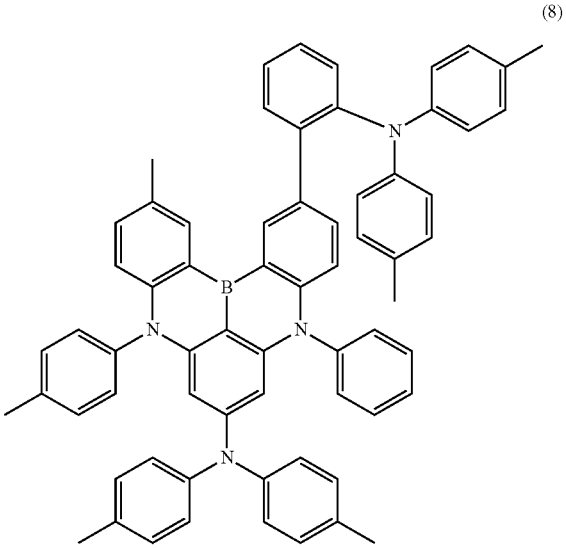

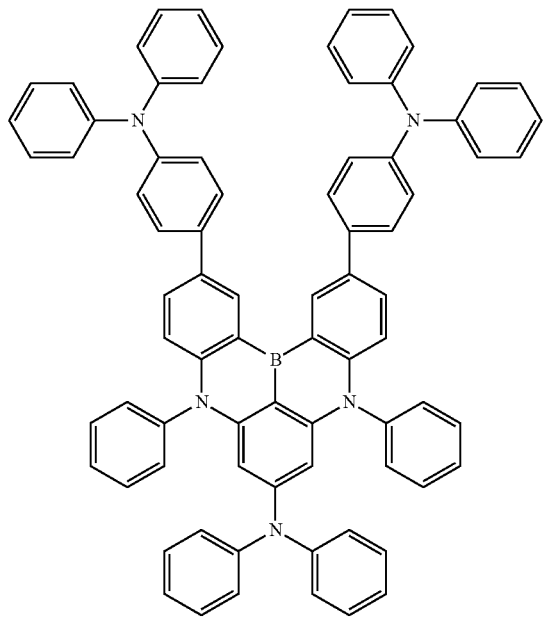
(9)
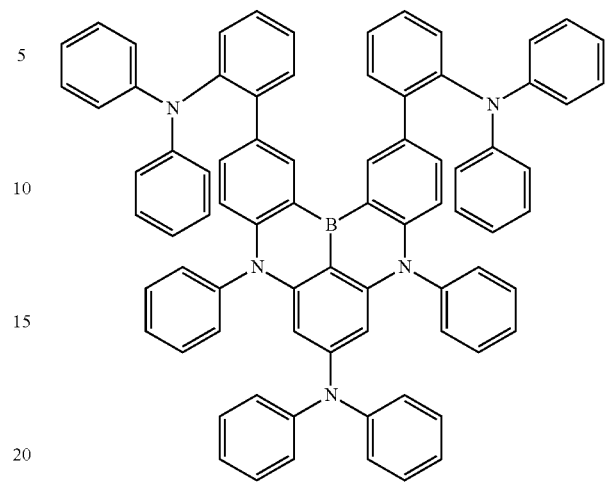
(11)
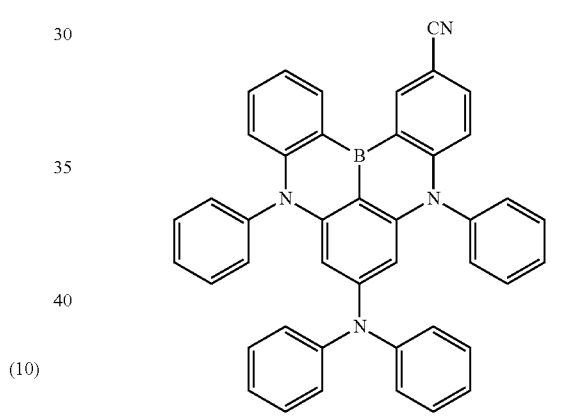
(12)
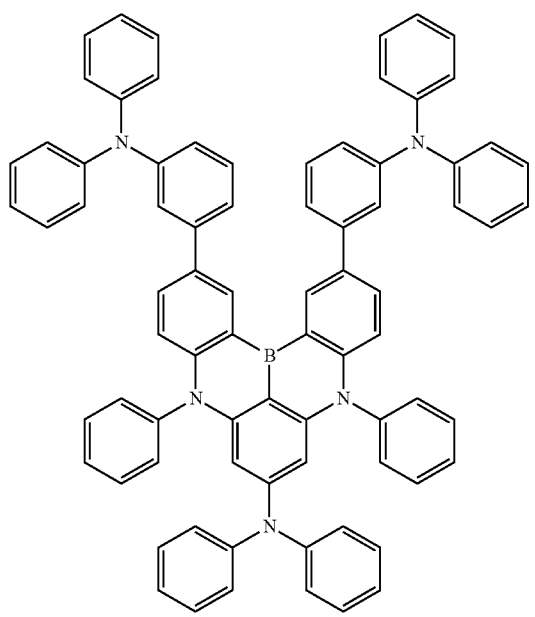
(10)
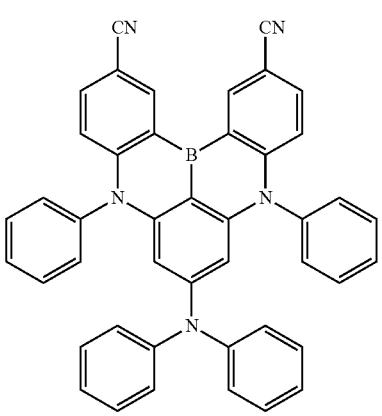
(13)

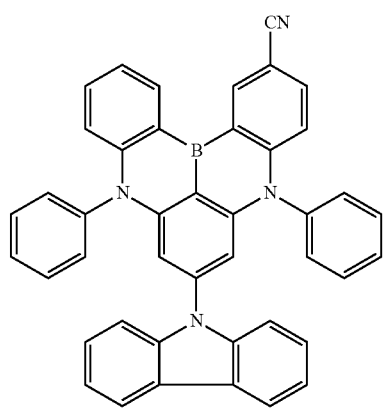
(14)
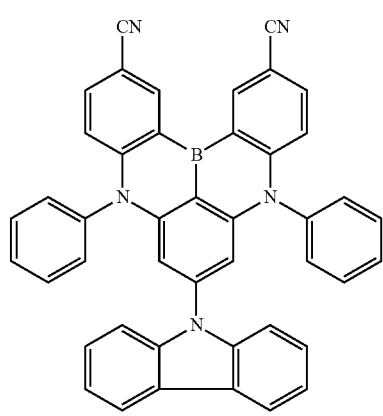
(15)
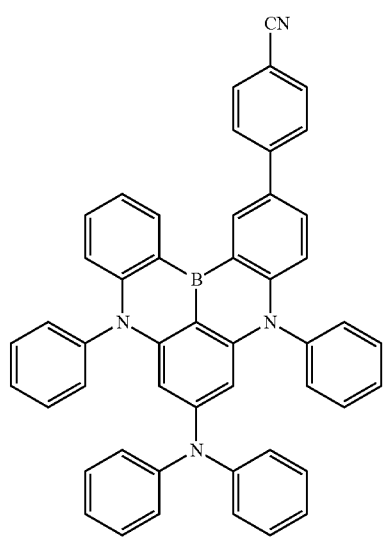
(16)
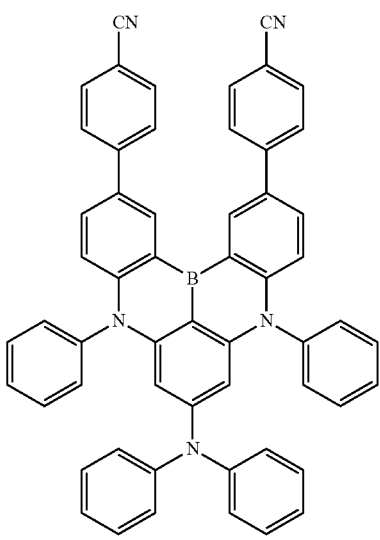
(17)
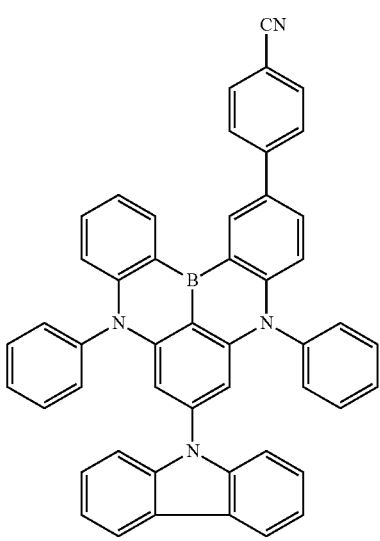
(18)
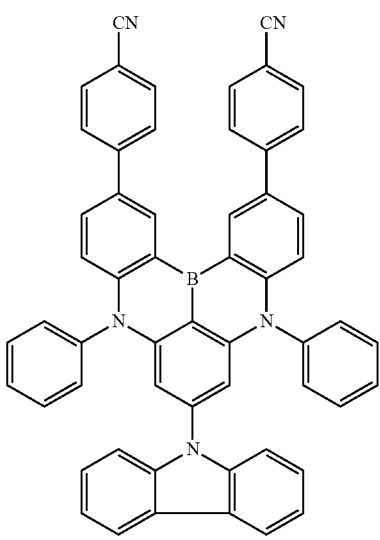
(19)

(20)
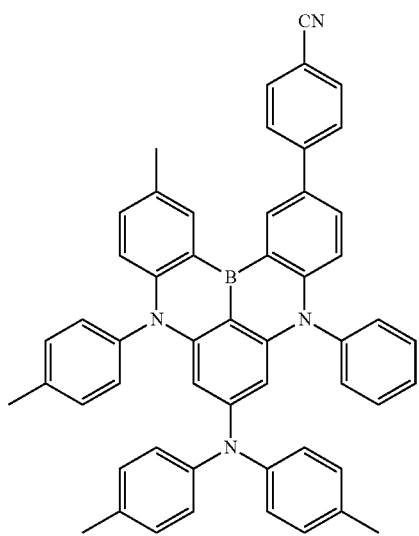
(21)
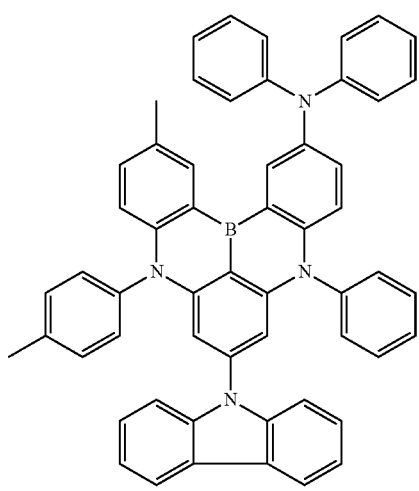
(22)
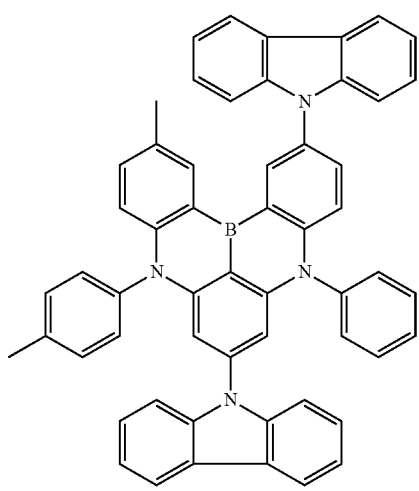
(23)
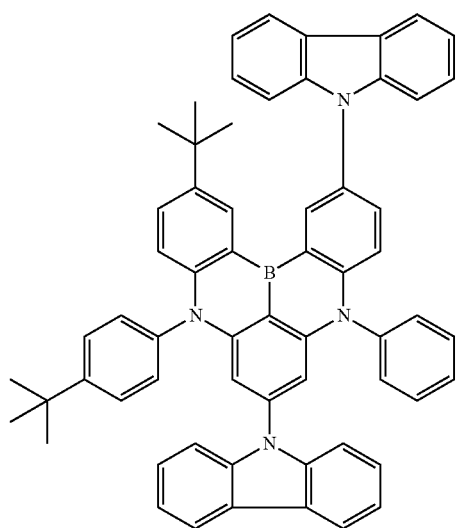
(24)
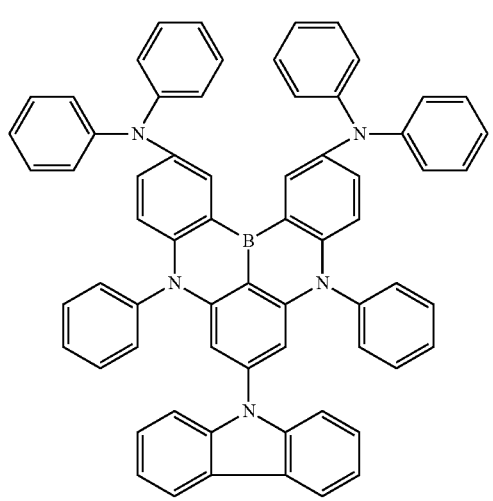
(25)
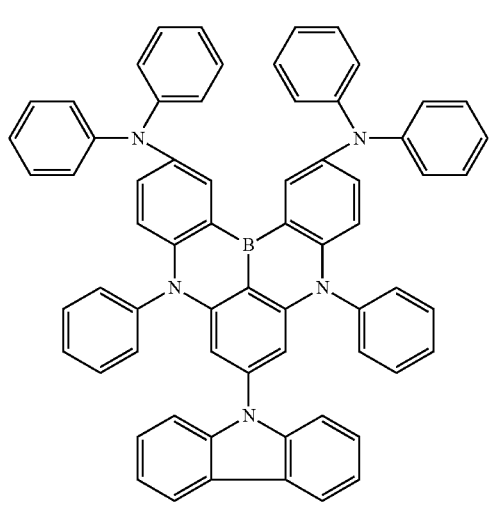

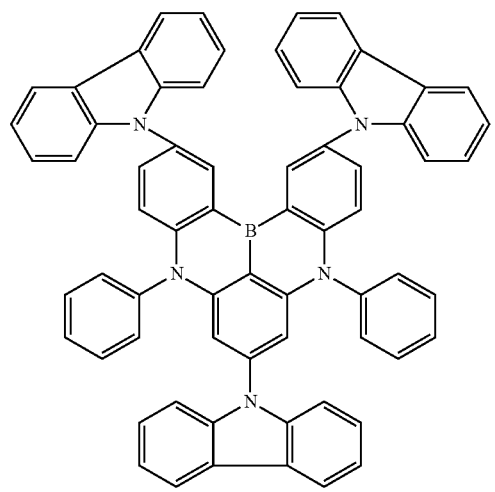
(26)
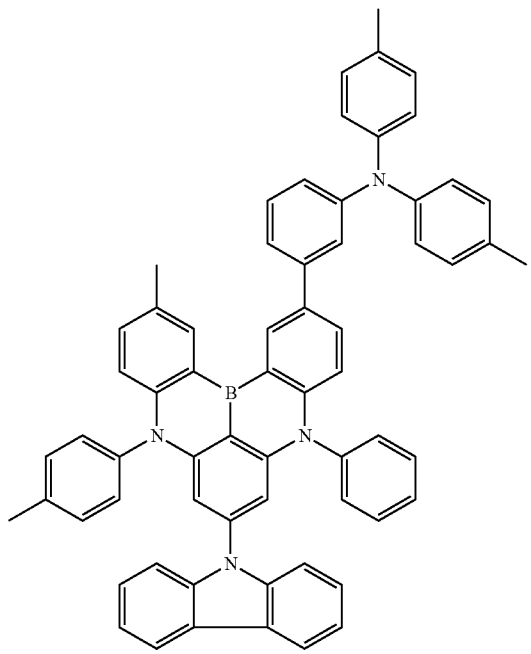
(28)
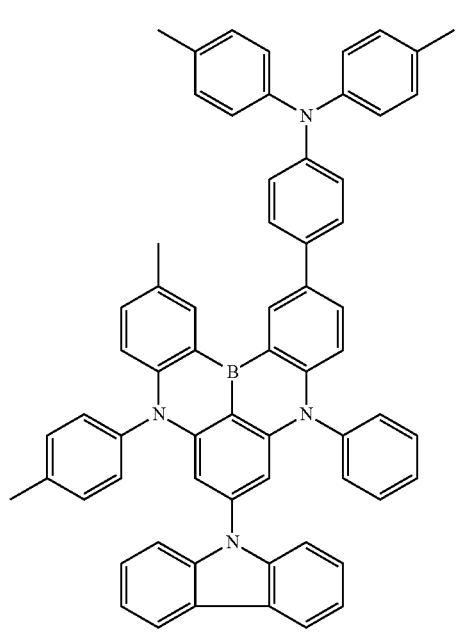
(27)
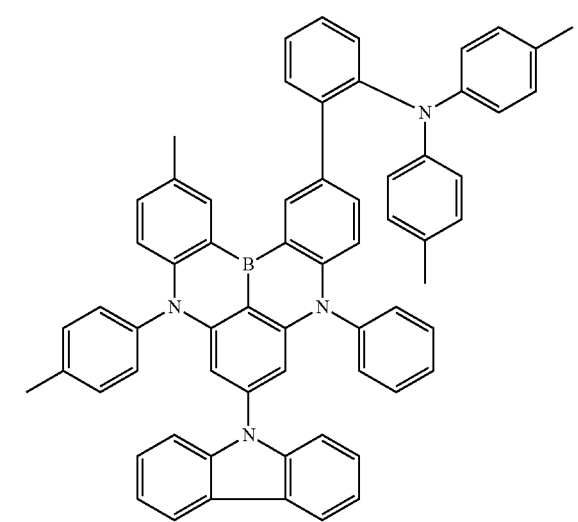
(29)

-continued
(30)
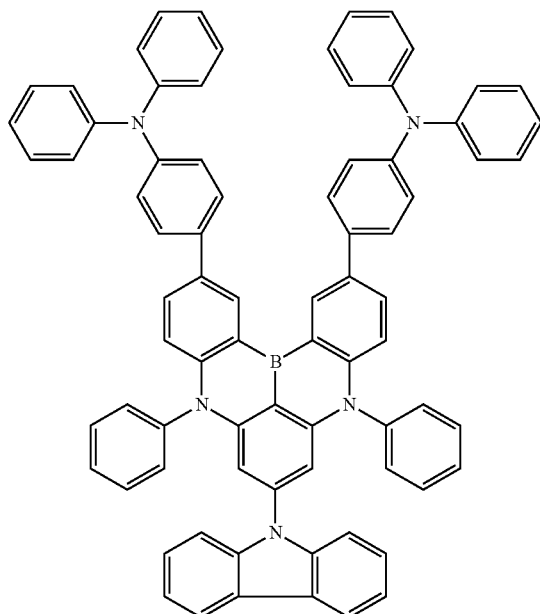
(32)
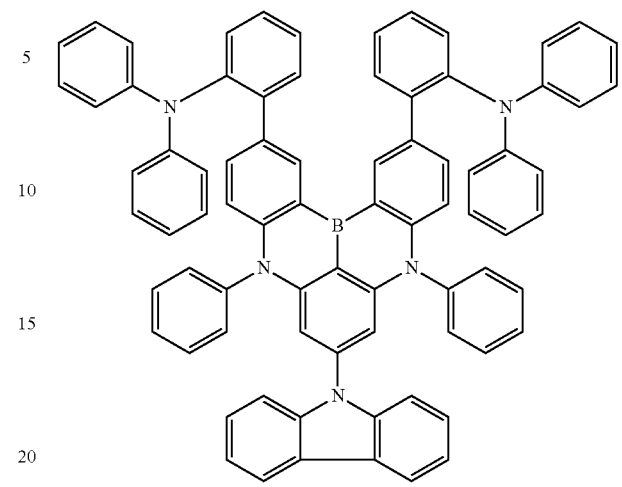
(31)
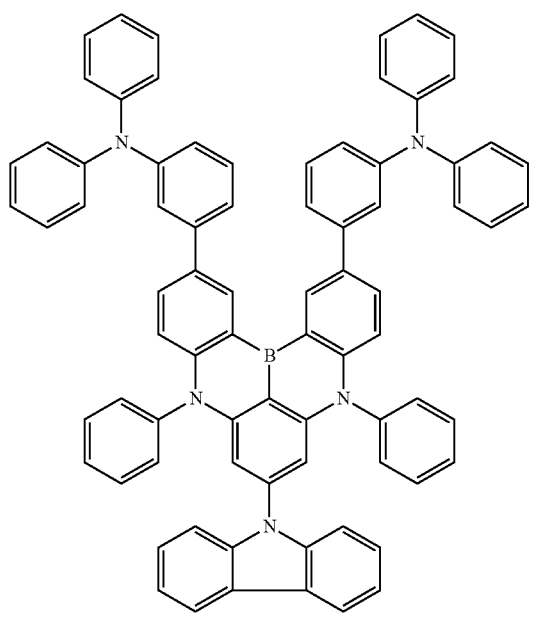
(33)
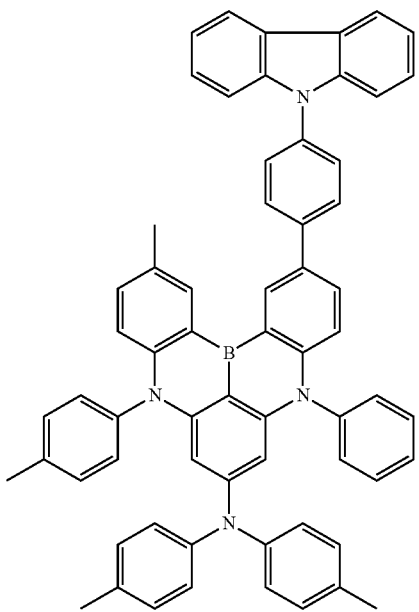

(34)
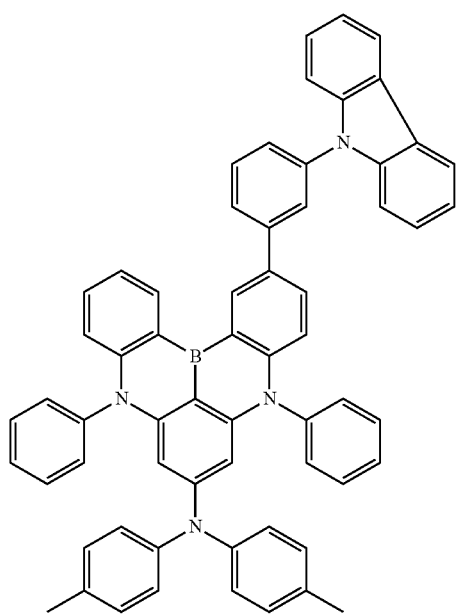
(36)
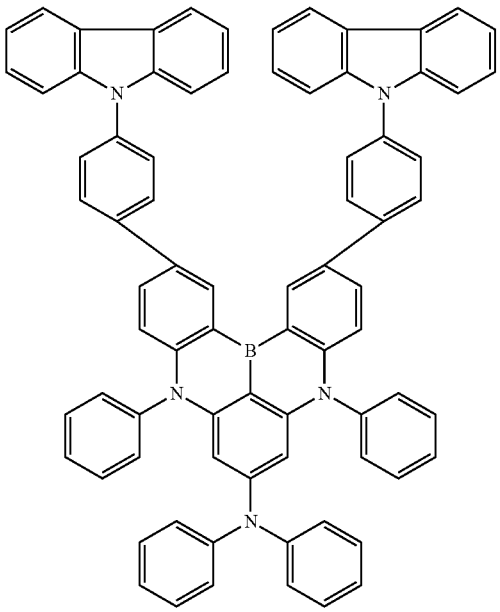
(35)
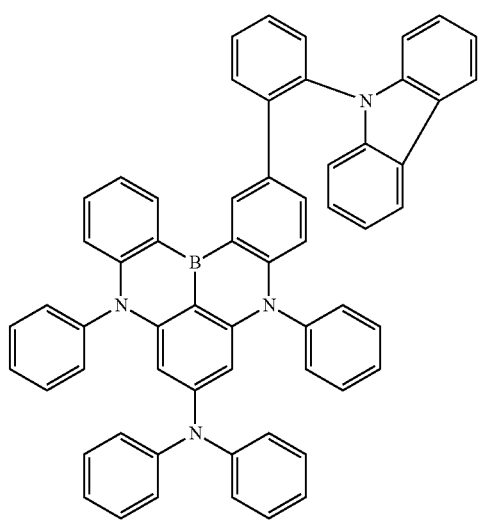
(37)
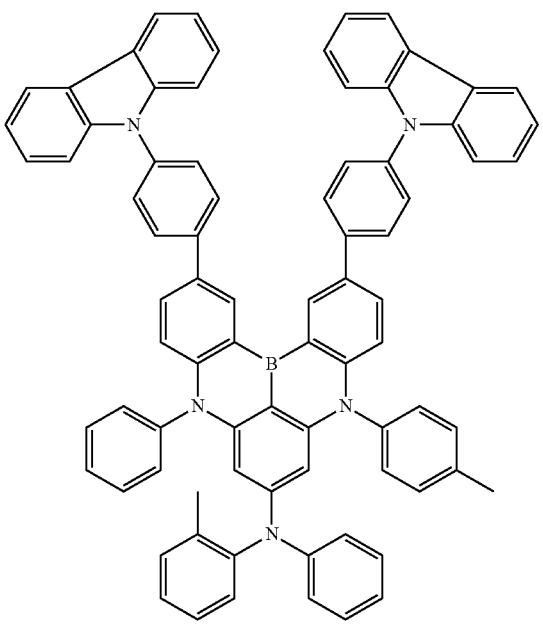

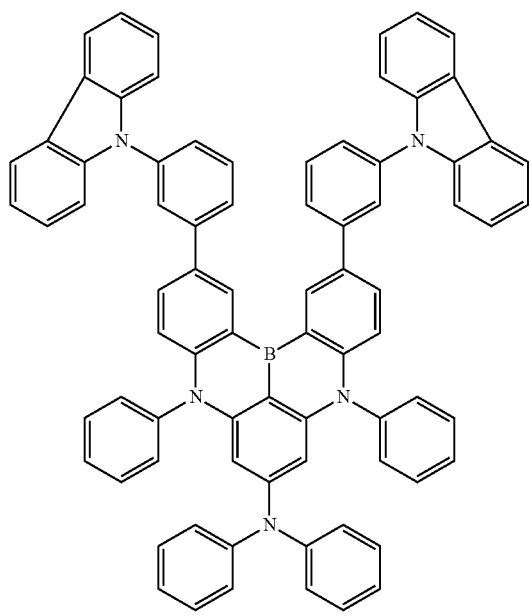
(38)
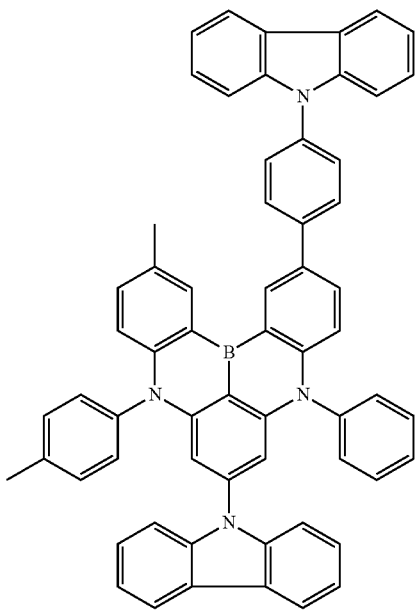
(40)
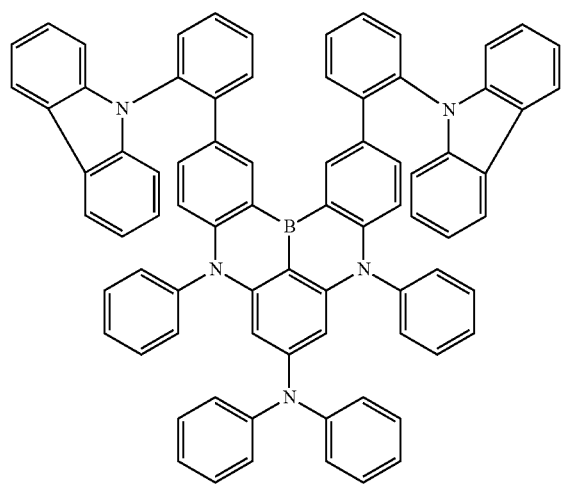
(39)
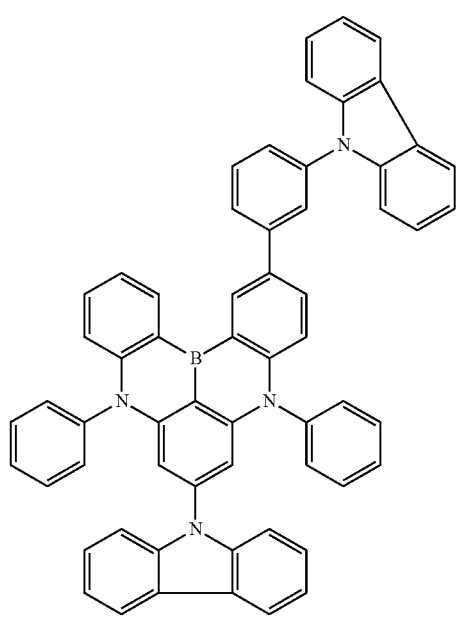
(41)

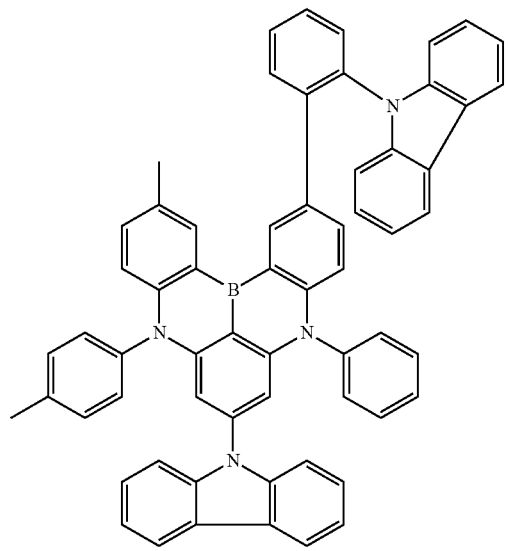
(42)
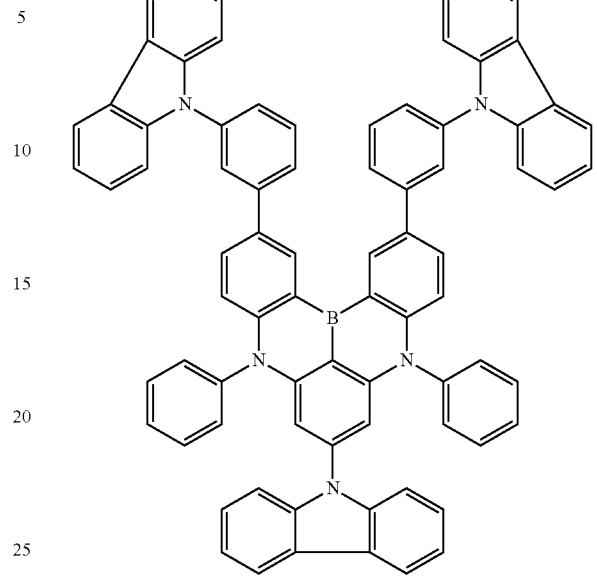
(44)
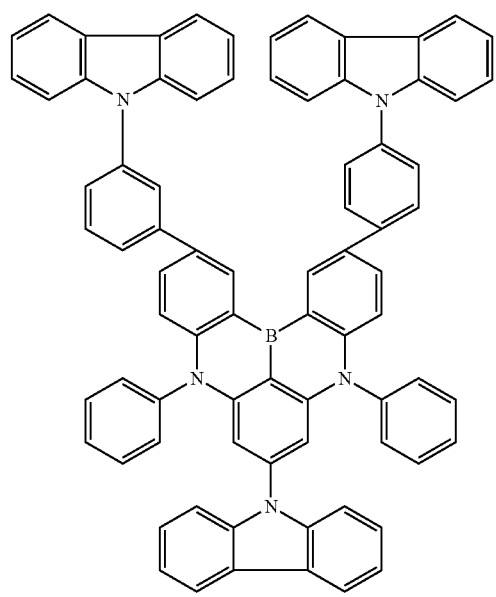
(43)
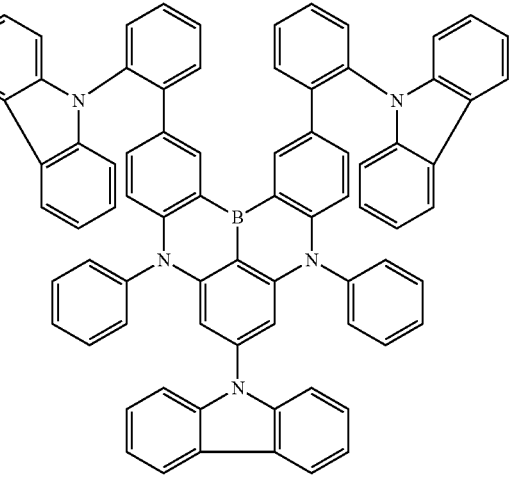
(45)

-continued (46)

(47)

13. A polycyclic compound represented by Formula 1:

[Formula 1]

wherein, in Formula 1,
Ar$_1$ and Ar$_2$ are each independently a substituted or an unsubstituted aryl group having 6 to 30 ring-forming carbon atoms, an aryl group having 6 to 30 ring-forming carbon atoms substituted with deuterium, a methyl group, or a tert-butyl group, or a substituted or unsubstituted heteroaryl group having 2 to 30 ring-forming carbon atoms, and Ar$_3$ and Ar$_4$ are each independently substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, R$_1$ to R$_4$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a and b are each independently an integer of 0 to 3, X$_1$ and X$_2$ are each independently a hydrogen atom, a deuterium atom, a cyano group, a carbonyl group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one among X$_1$ and X$_2$ is a cyano group, a carbonyl group, a substituted amine group, a substituted or unsubstituted heteroaryl group including N having 2 to 30 ring-forming carbon atoms, or an aryl group having 6 to 30 ring-forming carbon atoms having a cyano group, a carbonyl group, or an amine group as a substituent.

14. The polycyclic compound of claim 13, wherein at least one among X$_1$ and X$_2$ is represented by any one among 1-1 to 1-4:

1-1
*—CN 1-2

1-3

1-4 wherein, in 1-2 to 1-4,
R$_6$ and R$_9$ are each independently a substituted or unsubstituted aryl group having 6 to 30 ring-forming carbon atoms, or a substituted or unsubstituted heteroaryl group having 2 to 30 ring-forming carbon atoms, R$_7$ and R$_8$ are each independently a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, d is an integer of 0 to 4, and $X_3$ is represented by any one among 1-1 to 1-3.

15. The polycyclic compound of claim 13, wherein Formula 1 is represented by Formula 2-1 or Formula 2-2:

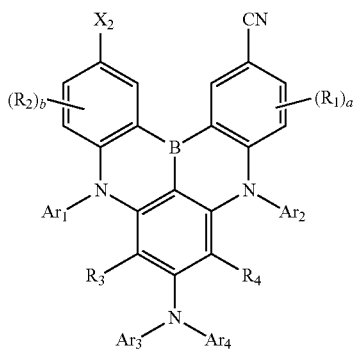

[Formula 2-1]

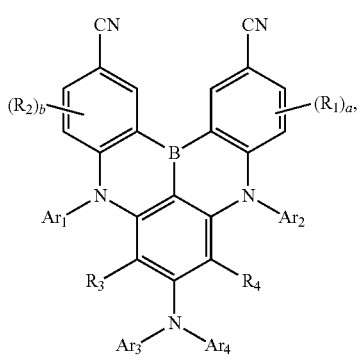

[Formula 2-2]

wherein, in Formula 2-1 and Formula 2-2, $X_2$, $R_1$ to $R_4$, $Ar_1$ to $Ar_4$, and a and b are each independently the same as defined in Formula 1.

16. The polycyclic compound of claim 13, wherein Formula 1 is represented by Formula 3-1 or Formula 3-2:

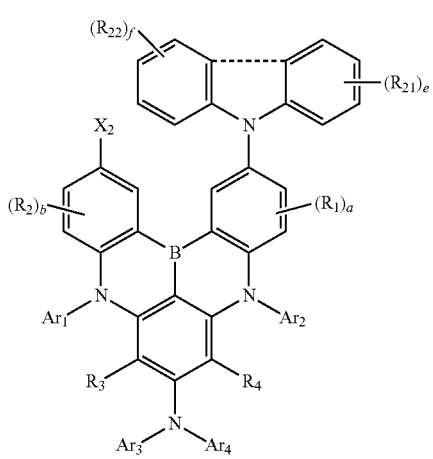

[Formula 3-1]

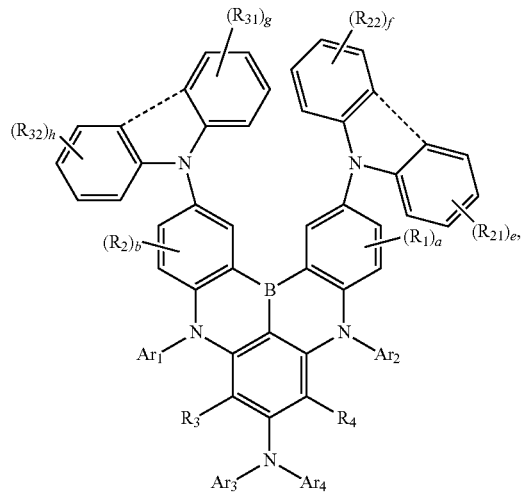

[Formula 3-2]

wherein, in Formula 3-1 and Formula 3-2, $R_{21}$, $R_{22}$, $R_{31}$, and $R_{32}$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, e to h are each independently an integer of 0 to 4, the dotted line is an optional bond, and $X_2$, $R_1$ to $R_4$, $Ar_1$ to $Ar_4$, and a and b are each independently the same as defined in Formula 1.

17. The polycyclic compound of claim 13, wherein Formula 1 is represented by Formula 4-1 or Formula 4-2:

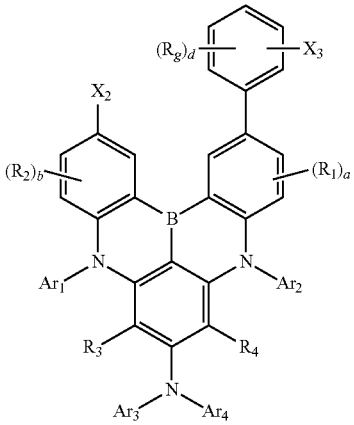

[Formula 4-1]

-continued

[Formula 4-2]

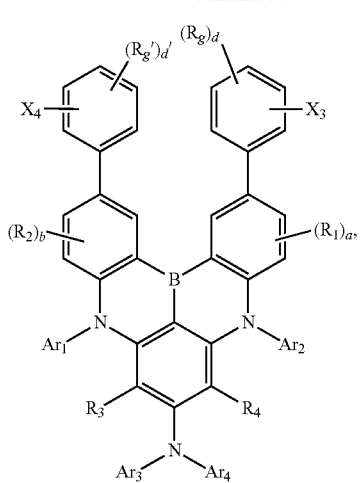

wherein, in Formula 4-1 and Formula 4-2, $X_3$ and $X_4$ are each independently a cyano group, a carbonyl group, a substituted amine group, or a substituted or unsubstituted heteroaryl group including N having 2 to 30 ring-forming carbon atoms, $R_9$ to $R_9'$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, d and d' are each independently an integer of 0 to 4, and $X_2$, $R_1$ to $R_4$, $Ar_1$ to $Ar_4$, and a and b are each independently the same as defined in Formula 1.

18. The polycyclic compound of claim 13, wherein Formula 1 is represented by Formula 6:

[Formula 6]

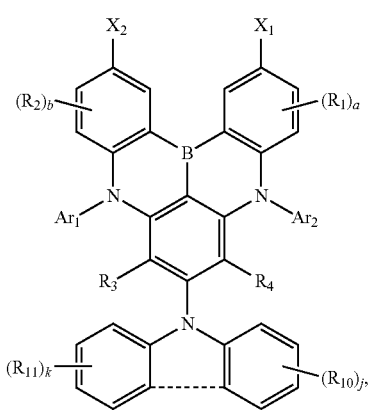

wherein, in Formula 6, $R_{10}$ to $R_{11}$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, j and k are each independently an integer of 0 to 4, the dotted line is an optional bond, and $R_1$ to $R_4$, $X_1$, $X_2$, $Ar_1$, $Ar_2$, and a and b are each independently the same as defined in Formula 1.

19. A polycyclic compound represented by Compound Group 1:

[Compound Group 1]

(1)

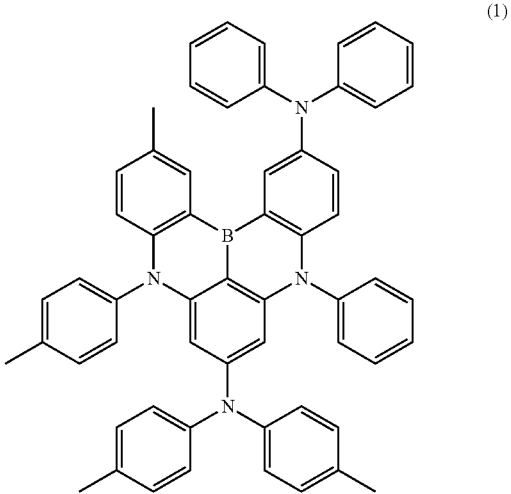

(2)

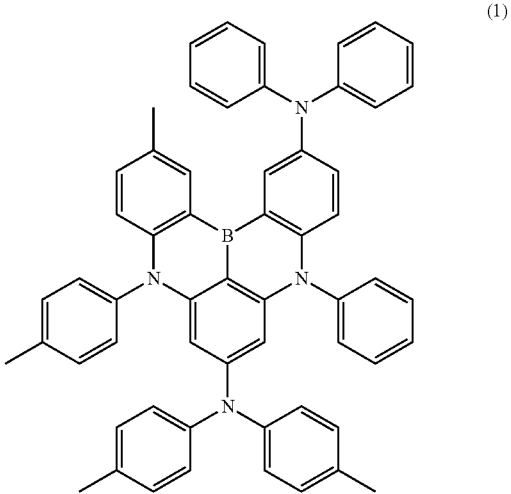

(3)

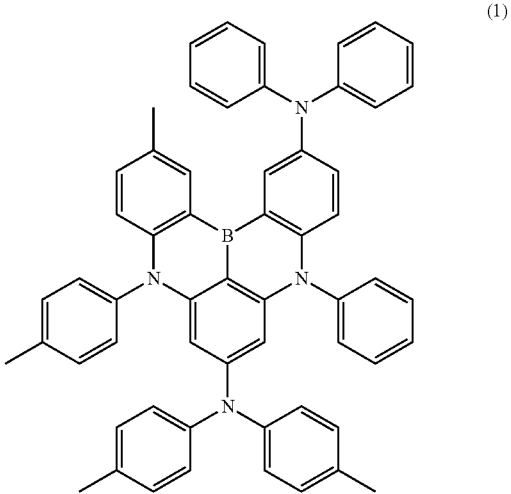

(4)
(5)
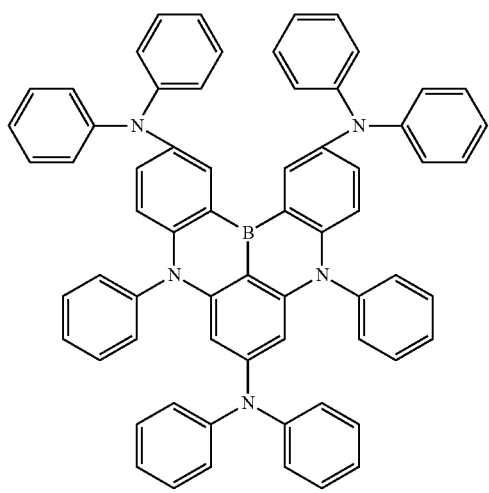
(6)
(7)
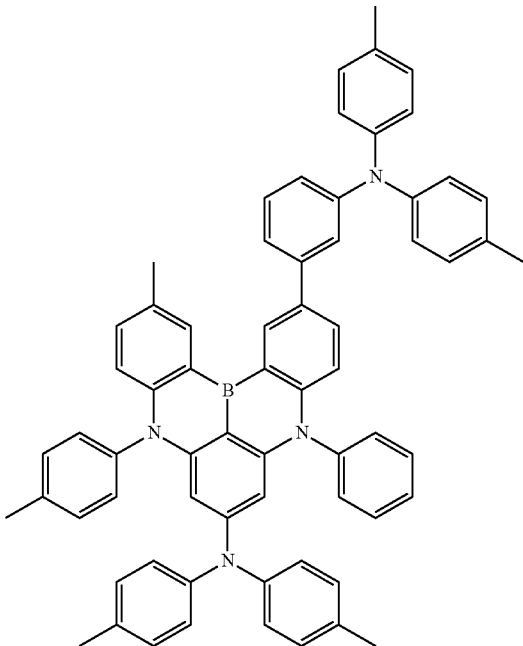
(8)
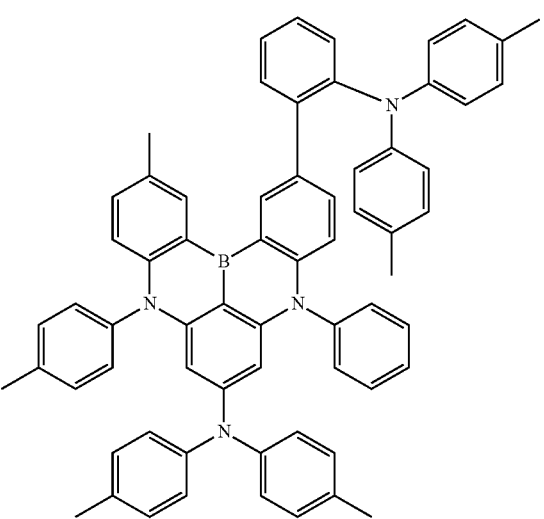

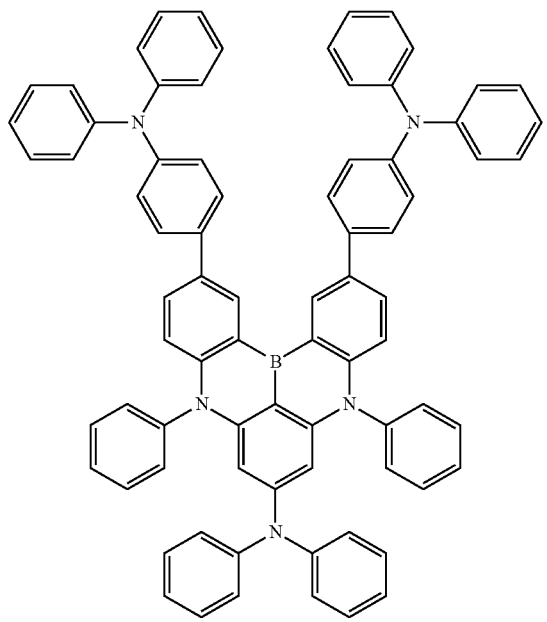
(9)
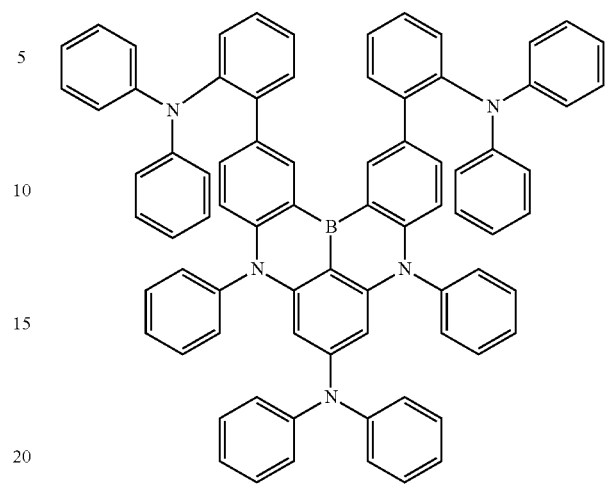
(11)
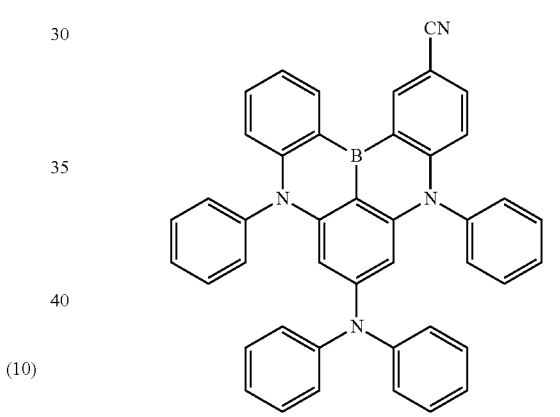
(12)
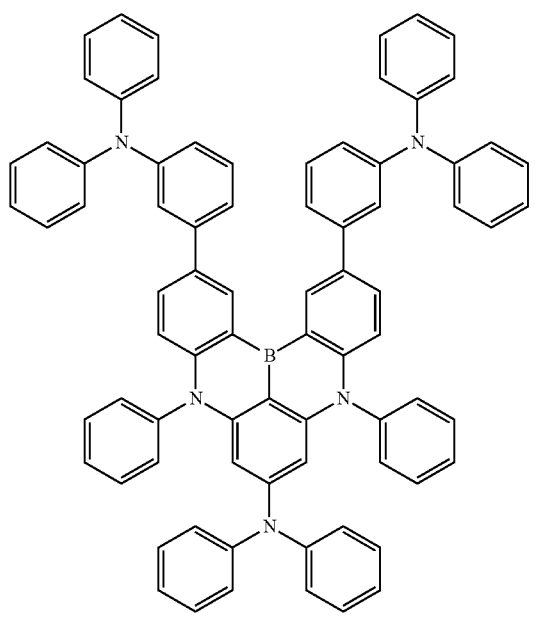
(10)
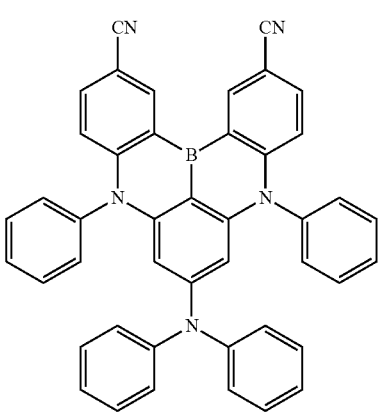
(13)

(14)
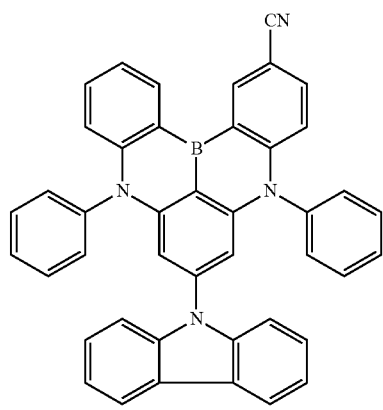
(15)
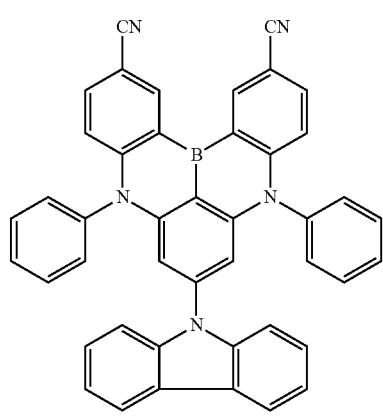
(16)
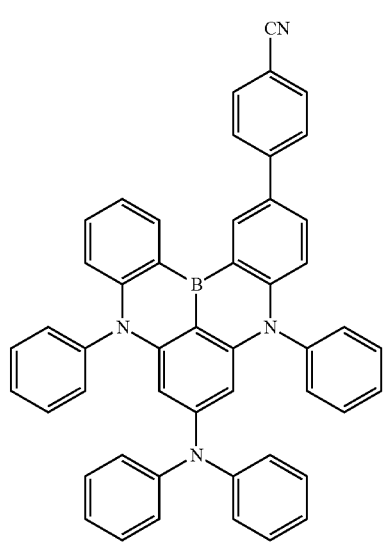
(17)
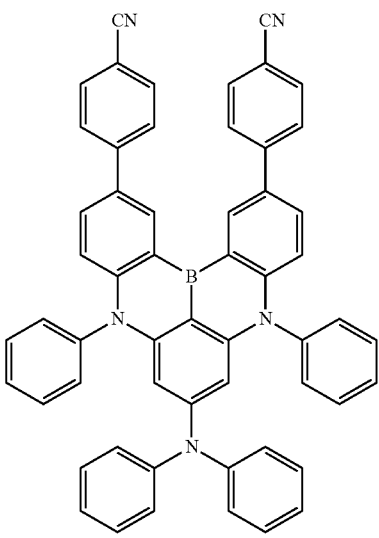
(18)
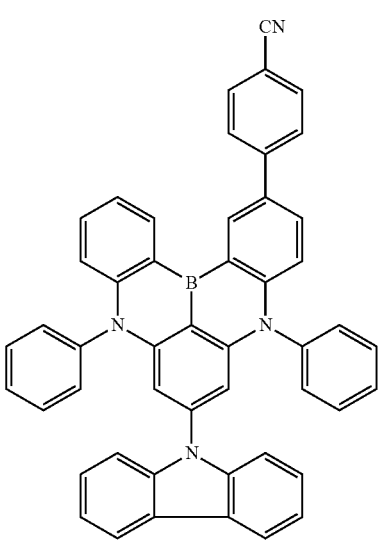
(19)
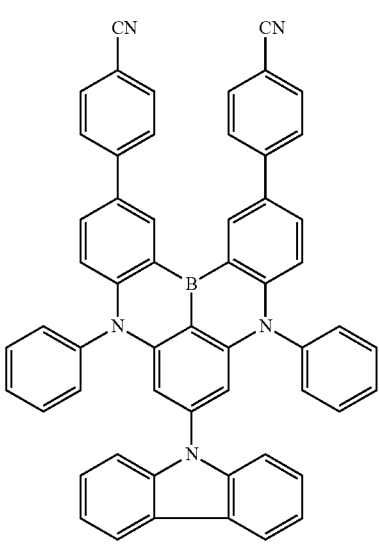

-continued
(20)
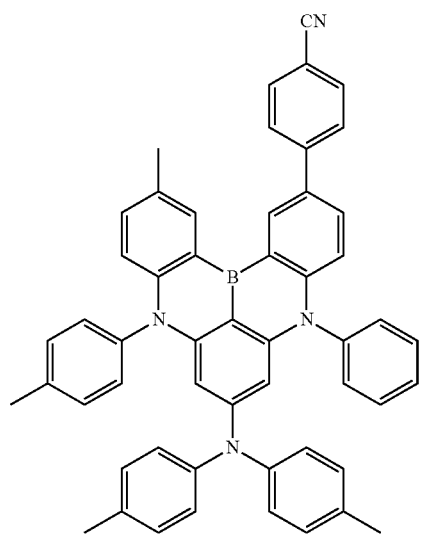
(21)
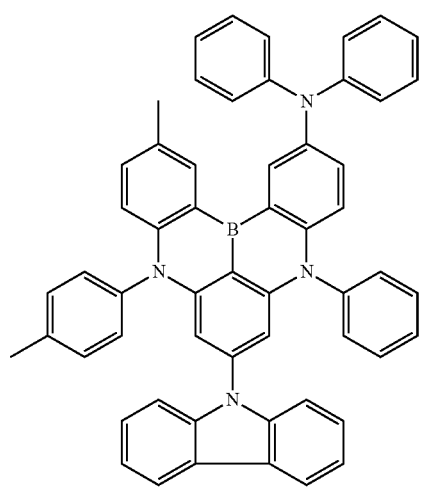
(22)
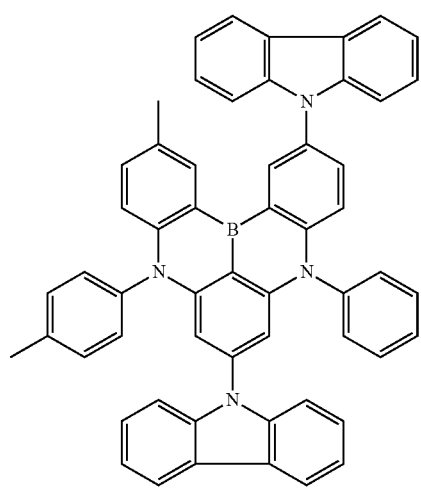
-continued
(23)
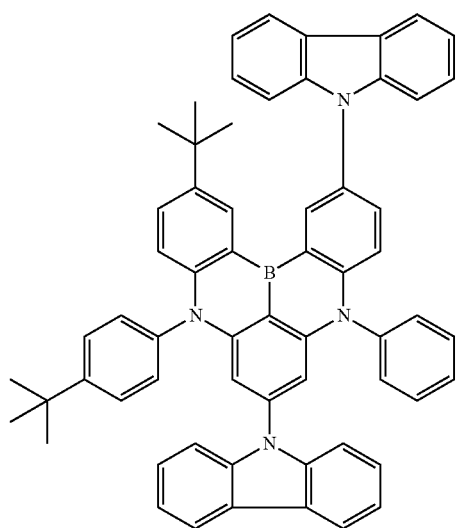
(24)
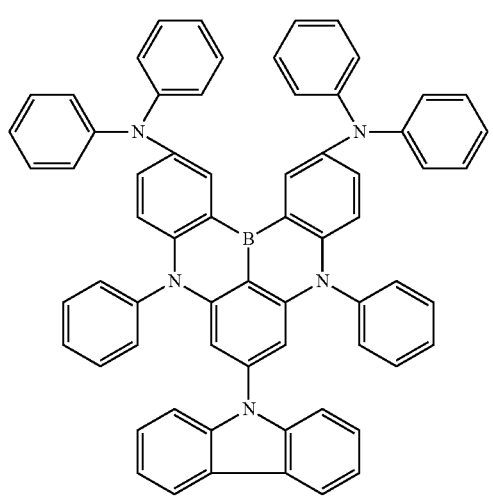
(25)
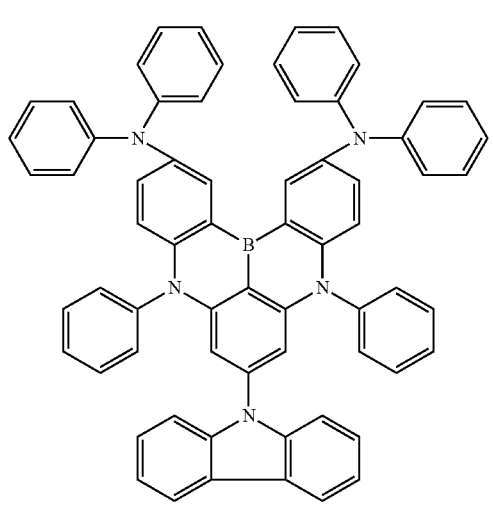

(26)
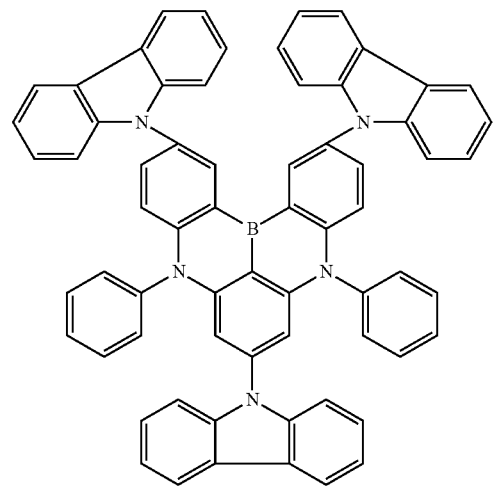
(28)
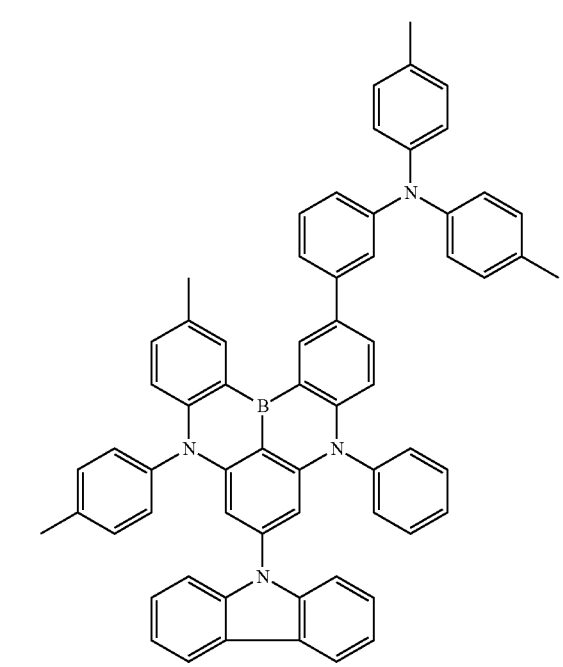
(27)
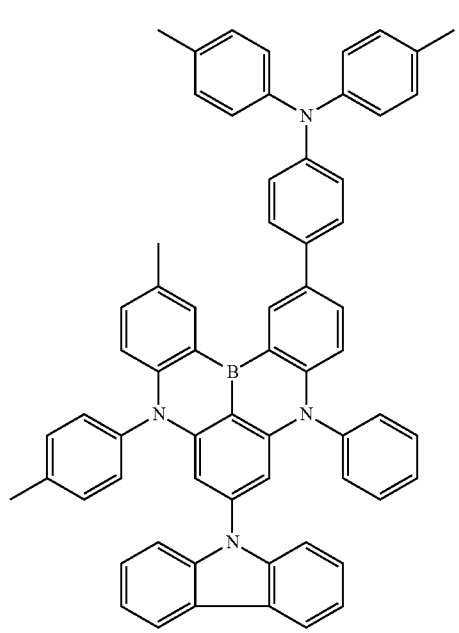
(29)
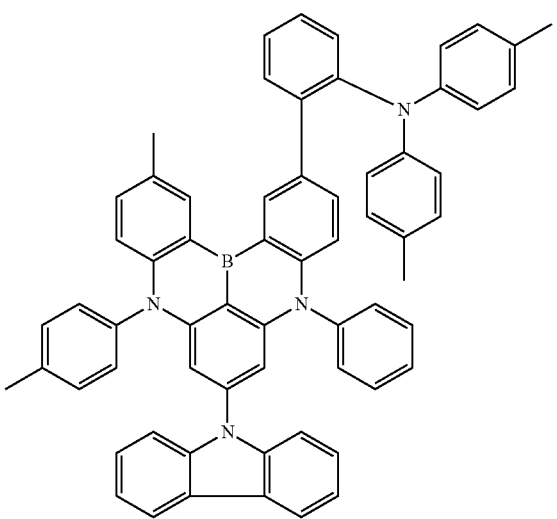

101
-continued
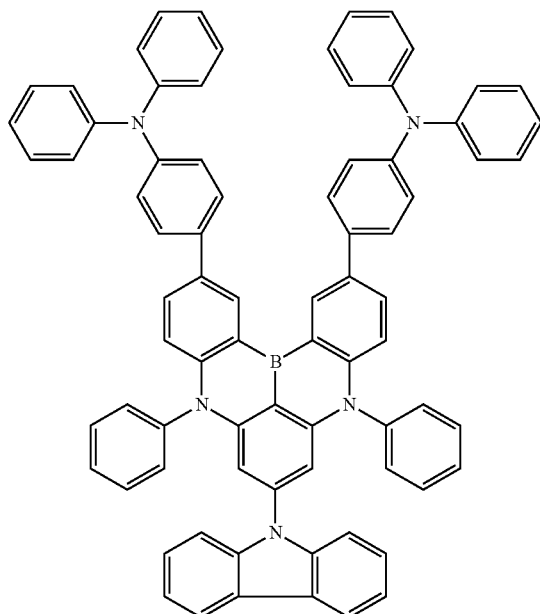
(30)
102
-continued
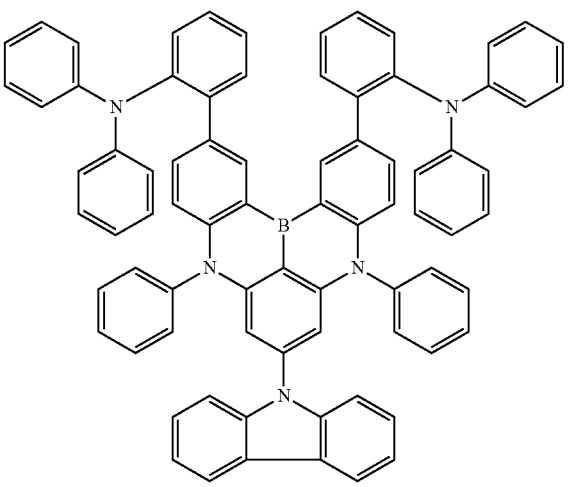
(32)
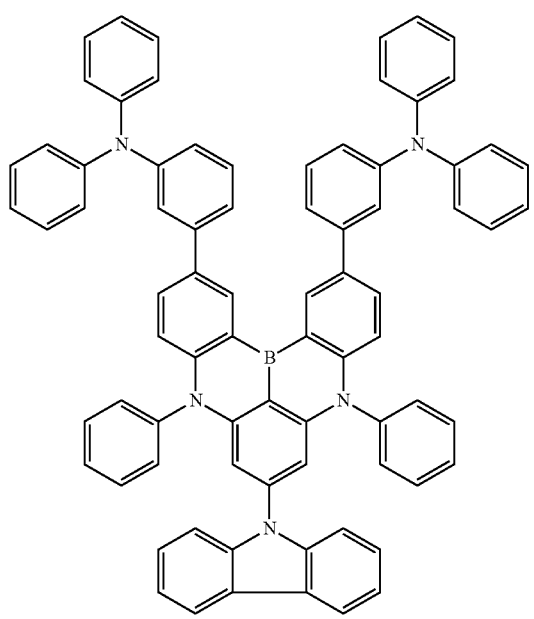
(31)
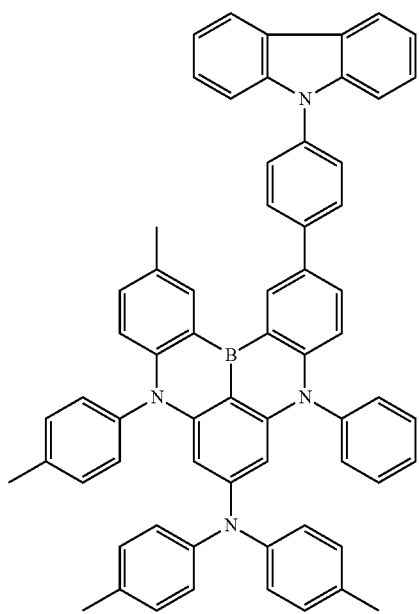
(33)

103
-continued
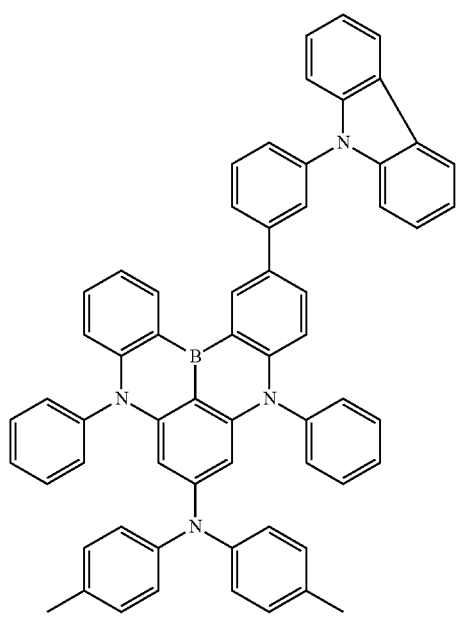
(34)
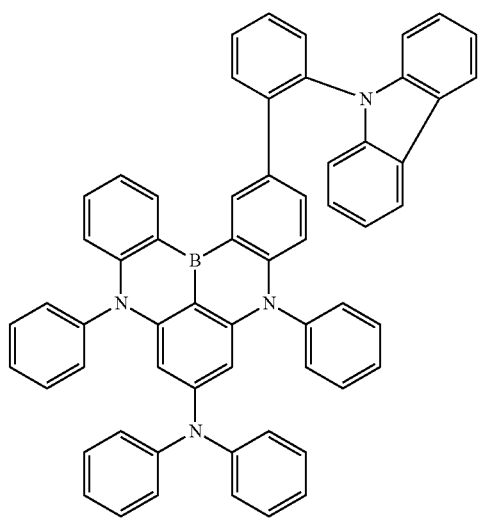
(35)
104
-continued
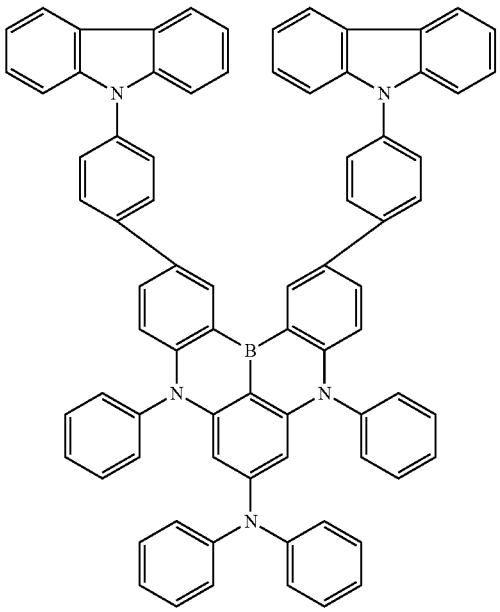
(36)
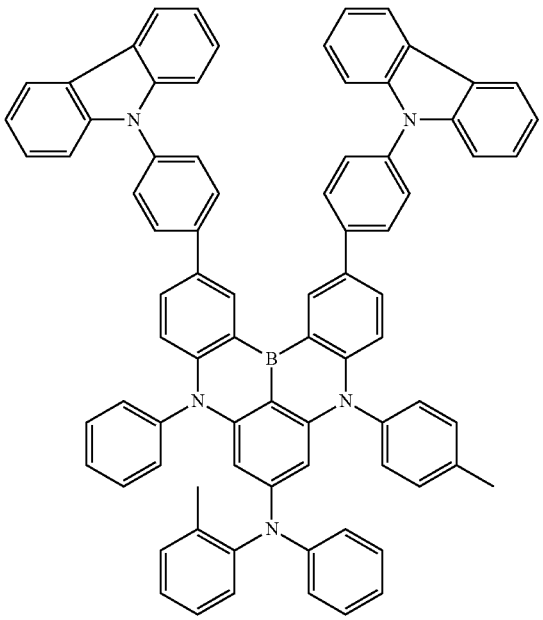
(37)

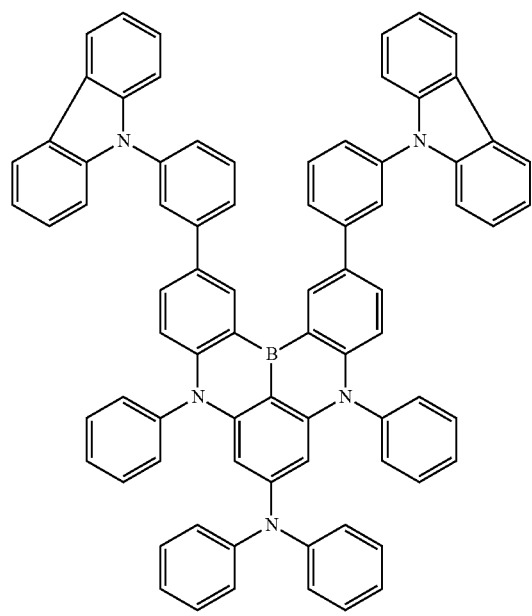
(38)
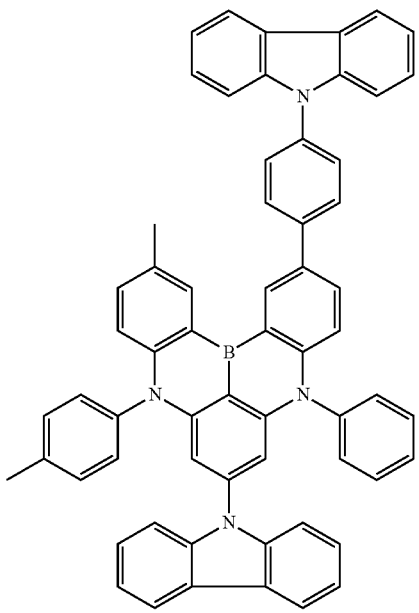
(40)
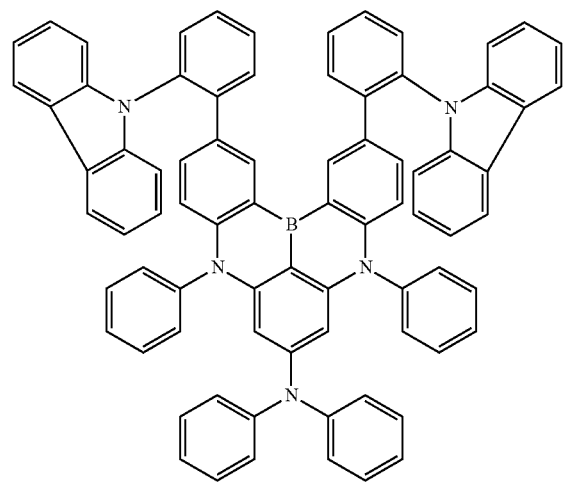
(39)
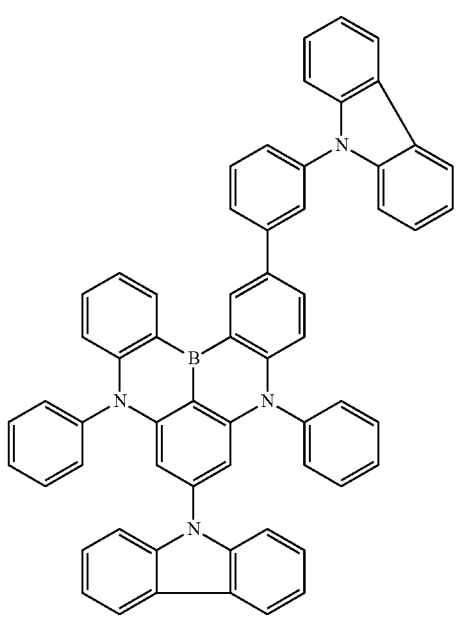
(41)

(42)
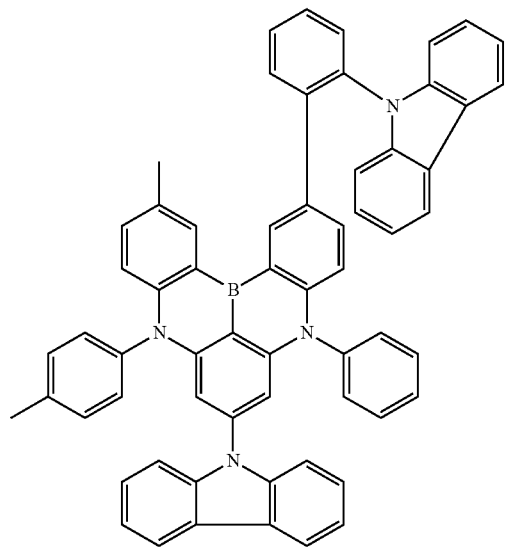
(43)
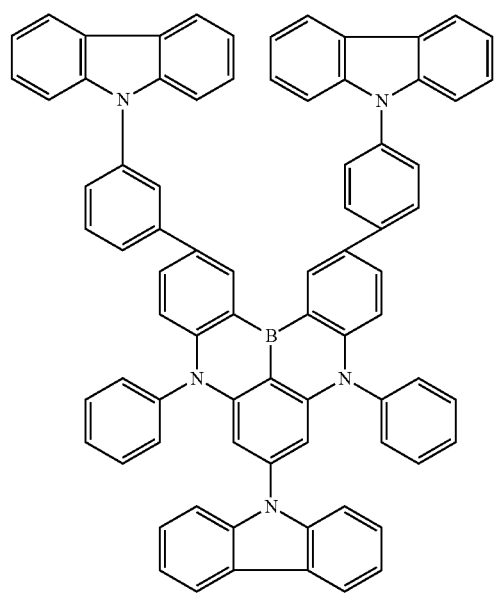
(44)
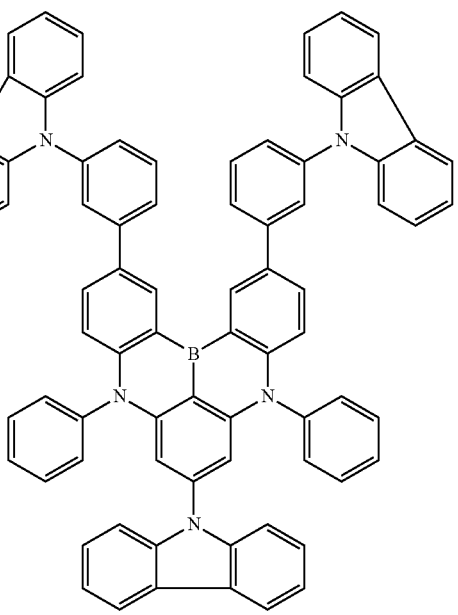
(45)
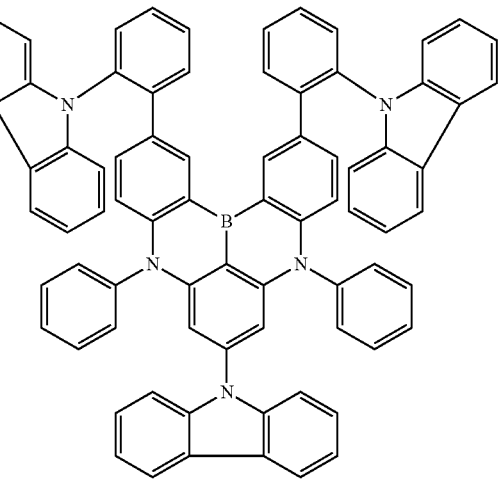

109
-continued
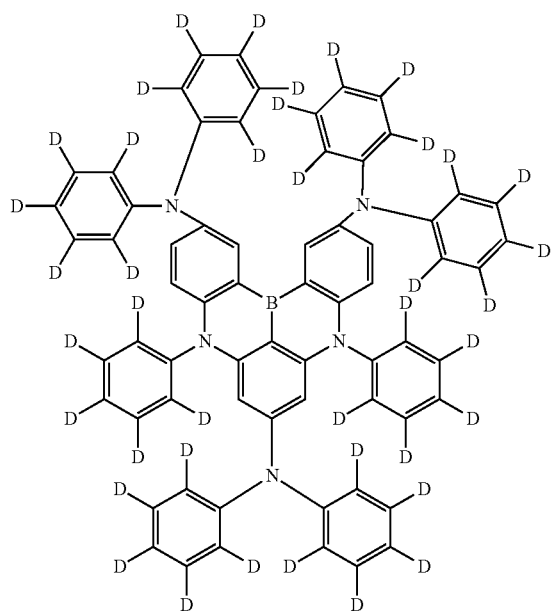
(46)
110
-continued
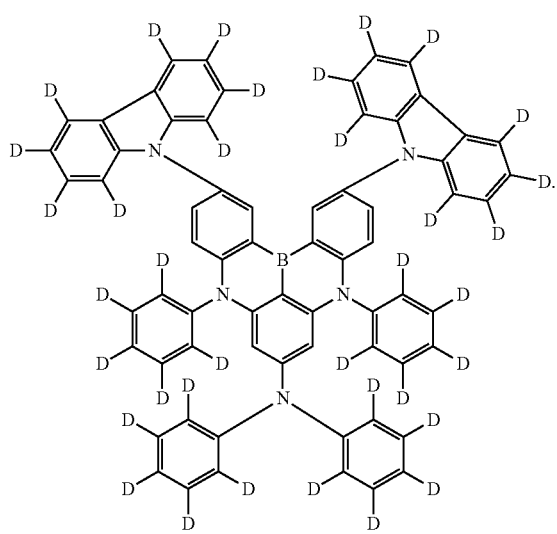
(47)
* * * * *